(12) United States Patent
Oyama et al.

(10) Patent No.: US 11,511,959 B2
(45) Date of Patent: Nov. 29, 2022

(54) TAPE EJECTION GUIDE STRUCTURE, COMPONENT SUPPLY DEVICE AND COMPONENT MOUNTING MACHINE

(71) Applicant: YAMAHA HATSUDOKI KABUSHIKI KAISHA, Iwata (JP)

(72) Inventors: Kazuyoshi Oyama, Shizuoka (JP); Tsutomu Yanagida, Shizuoka (JP); Ryouta Masuda, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 501 days.

(21) Appl. No.: 16/500,075

(22) PCT Filed: Apr. 10, 2017

(86) PCT No.: PCT/JP2017/014676
§ 371 (c)(1),
(2) Date: Oct. 1, 2019

(87) PCT Pub. No.: WO2018/189785
PCT Pub. Date: Oct. 18, 2018

(65) Prior Publication Data
US 2020/0377322 A1 Dec. 3, 2020

(51) Int. Cl.
*B65H 23/032* (2006.01)
*H05K 13/04* (2006.01)
*B65H 37/00* (2006.01)

(52) U.S. Cl.
CPC ....... *B65H 23/0322* (2013.01); *B65H 37/002* (2013.01); *H05K 13/0419* (2018.08); *B65H 2404/742* (2013.01); *B65H 2701/1942* (2013.01)

(58) Field of Classification Search
CPC ............. B65H 23/0322; B65H 37/002; B65H 2404/742; B65H 2701/1942; H05K 13/0419
See application file for complete search history.

(56) References Cited

U.S. PATENT DOCUMENTS 5,116,454 A * 5/1992 Kurihara ............ H05K 13/0419
156/701
5,570,812 A 11/1996 Ando et al.
(Continued)

FOREIGN PATENT DOCUMENTS

| CN | 1111052 A | 11/1995 |
| JP | 06-020971 B * | 2/1986 |

(Continued)

OTHER PUBLICATIONS

International Search Report issued in PCT/JP2017/014676; dated Jul. 11, 2017.

(Continued)

*Primary Examiner* — Carl J Arbes
(74) *Attorney, Agent, or Firm* — Studebaker & Brackett PC

(57) ABSTRACT

A tape ejection guide structure (8) is a structure which guides ejection of a component storing tape (100) ejected from a tape ejection port (23) of a component supply unit (1A), and includes a guide body (81), and a pair of restraining portions (83). The guide body (81) guides an upper surface portion (100A) of the component storing tape (100) which is ejected from the tape ejection port (23) in a tape ejection direction (H2). A pair of restraining portions (83) is connected to both end portions of the guide body (81) in a tape width direction (H3) respectively, and restrains the displacement in the tape width direction (H3) of the com- (Continued)

ponent storing tape (100) which is ejected in a state where the upper surface (100A) is guided by the guide body (81).

15 Claims, 27 Drawing Sheets

(56) References Cited

U.S. PATENT DOCUMENTS

| | | | |
|---|---|---|---|
| 5,725,140 A | 3/1998 | Weber et al. | |
| 7,464,741 B2 * | 12/2008 | Kawaguchi | H05K 13/0419 |
| | | | 156/701 |
| 7,713,376 B2 * | 5/2010 | Larsson | H05K 13/0419 |
| | | | 221/72 |
| 9,820,420 B2 * | 11/2017 | Ohyama | H05K 13/0417 |
| 10,285,313 B2 * | 5/2019 | Murase | H05K 13/021 |
| 10,772,247 B2 * | 9/2020 | Otsuki | B26D 1/305 |
| 2003/0017758 A1 | 1/2003 | Arase et al. | |
| 2003/0049109 A1 * | 3/2003 | Yman | H05K 13/0417 |
| | | | 414/403 |
| 2006/0254048 A1 | 11/2006 | Shimada | |
| 2010/0186901 A1 | 7/2010 | Ikeda et al. | |
| 2014/0047966 A1 | 2/2014 | Oowada et al. | |
| 2014/0151490 A1 | 6/2014 | Kobayashi et al. | |

FOREIGN PATENT DOCUMENTS

| | | | |
|---|---|---|---|
| JP | H09-148798 A | | 6/1997 |
| JP | 2001-244691 A | | 9/2001 |
| JP | 2003-008294 A | | 1/2003 |
| JP | 2004323028 A | * | 11/2004 |
| JP | 4500890 | * | 4/2010 |
| JP | 2013-150020 A | | 8/2013 |
| JP | 2014-038950 A | | 2/2014 |
| JP | 2014-093424 A | | 5/2014 |
| JP | 2014-112579 A | | 6/2014 |
| JP | 6001419 B2 | | 10/2016 |
| KR | 2002-0001089 A | | 1/2002 |

OTHER PUBLICATIONS

An Office Action issued by the China National Intellectual Property Administration dated Aug. 3, 2020, which corresponds to Chinese Patent Application No. 201780089055.6 and is related to U.S. Appl. No. 16/500,075 with English Summary.

* cited by examiner (1)

(2)

(1)

(2)

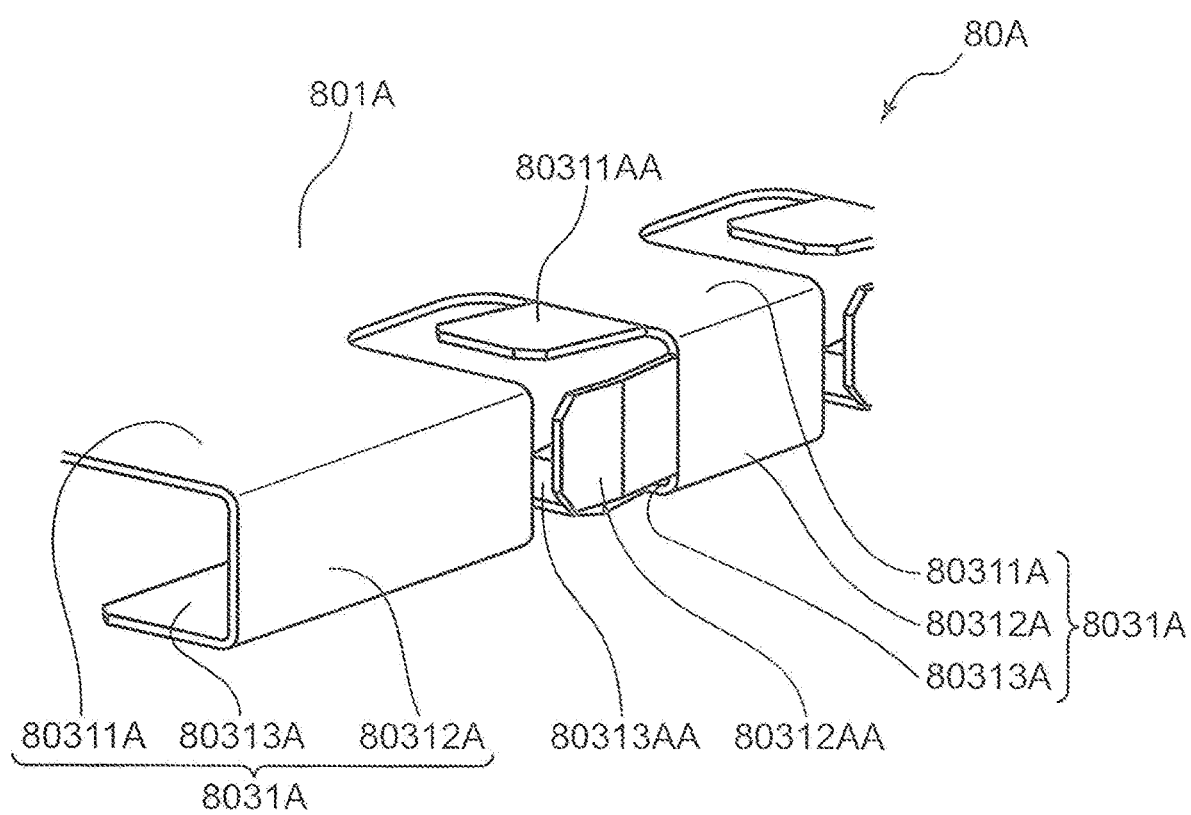

TAPE EJECTION GUIDE STRUCTURE, COMPONENT SUPPLY DEVICE AND COMPONENT MOUNTING MACHINE

CROSS-REFERENCE TO RELATED APPLICATION

This application is a National Stage of International Patent Application No. PCT/JP2017/014676, filed Apr. 10, 2017, the entire content of which is incorporated herein by reference.

BACKGROUND

Technical Field

The present disclosure relates to a tape ejection guide structure for guiding the ejection of a component storing tape ejected from a component supply unit, a component supply device including the tape ejection guide structure, and a component mounting machine.

Background Art

A component mounting machine for mounting electronic components (hereinafter simply referred to as "components") on a substrate such as a printed circuit board includes a component supply device for supplying the components. As the component supply device, there has been known a device using a component storing tape in which components are stored. The component mounting machine of this type is disclosed in Japanese Patent No. 6001419, for example.

The component mounting machine disclosed in Japanese Patent No. 6001419 includes a component supply unit, an ejection guide, and a distal end guide. The component supply unit supplies components stored in the component storing tape by feeding the component storing tape. The ejection guide guides the ejection of the component storing tape ejected from the component supply unit. The distal end guide is mounted on a tape ejection port of the component supply unit, and guides the component storing tape ejected from the tape ejection port to an upper opening of the ejection guide.

In the component mounting machine disclosed in Japanese Patent No. 6001419, when a rear end of the component storing tape where the supply of components is performed precedingly in the component supply unit (preceding component storing tape) is ejected from the tape ejection port, a feeding force for feeding the component storing tape is lost. In such a case, the preceding component storing tape guided in the ejection guide by way of the distal end guide stays in the ejection guide. Thereafter, a succeeding component storing tape fed from the component supply unit is guided into the ejection guide by way of the distal end guide. As a result, the preceding component storing tape staying in the ejection guide is pushed out by the succeeding component storing tape and is brought into a state which allows a free fall of the preceding component storing tape so that the preceding component storing tape is ejected in the ejection guide.

However, in the case where the preceding component storing tape staying in the ejection guide is pushed out by the succeeding component storing tape, when the posture of the preceding component storing tape is changed in the ejection guide due to an inclination or the like, there is a possibility that the component storing tape is not ejected with certainty.

SUMMARY

Accordingly, the present disclosure provides a tape ejection guide structure, a component supply device, and a component mounting machine which can eject with certainty a component storing tape ejected from a tape ejection port of a component supply unit.

According to an aspect of the present disclosure, there is provided a tape ejection guide structure of a component supply unit configured to supply components by feeding a component storing tape including: a carrier tape where a plurality of component storing portions in which components are stored are arranged at a predetermined interval; and a cover tape that is adhered to the carrier tape so as to cover the component storing portions, the feeding being performed in a state where the cover tape is disposed on an upper surface side, the tape ejection guide structure being configured to guide ejection of the component storing tape ejected from a tape ejection port of the component supply unit. The tape ejection guide structure includes: a guide body that guides an upper surface portion or a lower surface portion of the component storing tape ejected from the tape ejection port along a tape ejection direction; and a pair of restraining portions that is connected to both end portions of the guide body respectively in a tape width direction orthogonal to the tape ejection direction and restrains displacement in the tape width direction of the component storing tape that is ejected in a state where the upper surface portion or the lower surface portion of the component storing tape is guided by the guide body.

According to another aspect of the present disclosure, there is provided a component supply device configured to supply components using a component storing tape including: a carrier tape where a plurality of component storing portions in which the components are stored are arranged at a predetermined interval; and a cover tape that is adhered to the carrier tape so as to cover the component storing portions. The component supply device includes: a component supply unit including a tape feeding portion that feeds the component storing tape toward a tape ejection port and a component exposing portion that exposes the components in the component storing portions of the component storing tape fed by the tape feeding portion; and the tape ejection guide structure that guides ejection of the component storing tape ejected from the tape ejection port.

According to still another aspect of the present disclosure, there is provided a component mounting machine including: a component supply portion where a plurality of component supply devices for supplying components by feeding a component storing tape in a tape feeding direction are arranged side by side in a first direction intersecting the tape feeding direction and at least one particular component supply device is the above-mentioned component supply device; a head unit that takes out the components supplied by the plurality of component supply devices respectively; a cylindrical body formed in a cylindrical shape having an upper opening and a lower opening, the cylindrical body being configured to allow insertion of the tape ejection guide structure provided to the particular component supply device into the cylindrical body from the upper opening, the cylinder body being configured to receive the component storing tape ejected from another component supply device other than the particular component supply device from the upper opening and to guide ejection of the component storing tape; and a tape cutting device that is disposed so as to face the lower opening of the cylindrical body and is configured to cut the component storing tape ejected from the cylindrical body through the lower opening at a predetermined timing.

Other objects, technical features, and advantageous effects of the present disclosure will become more apparent with reference to the detailed description made hereinafter and the attached drawings.

BRIEF DESCRIPTION OF THE DRAWINGS

FIG. 22C is a perspective view showing a main part of the tape ejection guide structure according to the second embodiment in an enlarged manner;

DETAILED DESCRIPTION

Hereinafter, a tape ejection guide structure, a component supply device, and a component mounting machine according to an embodiment of the present disclosure are described with reference to the drawings. Hereinafter, the directional relationship is described using X, Y, and Z orthogonal coordinate axes. The lateral direction is assumed as the X axis direction, the longitudinal direction orthogonal to the X axis direction is assumed as the Y axis direction, and the vertical direction orthogonal to both the X axis direction and the Y axis direction is assumed as the Z axis direction. In the X axis direction, the leftward direction directed toward one side is referred to as "+X direction", and the rightward direction directed toward a side opposite to one side in the X axis direction is referred to as "−X direction". In the Y axis direction, the frontward direction directed toward one side is referred to as "+Y direction", and the rearward direction directed toward a side opposite to one side in the Y axis direction is referred to as "−Y direction". In the Z axis direction, the downward direction directed toward one side is referred to as "−Z direction", and the upward direction directed toward a side opposite to one side in the Z axis direction is referred to as "+Z direction".

[Configuration of Component Mounting Machine]

Figure 1:
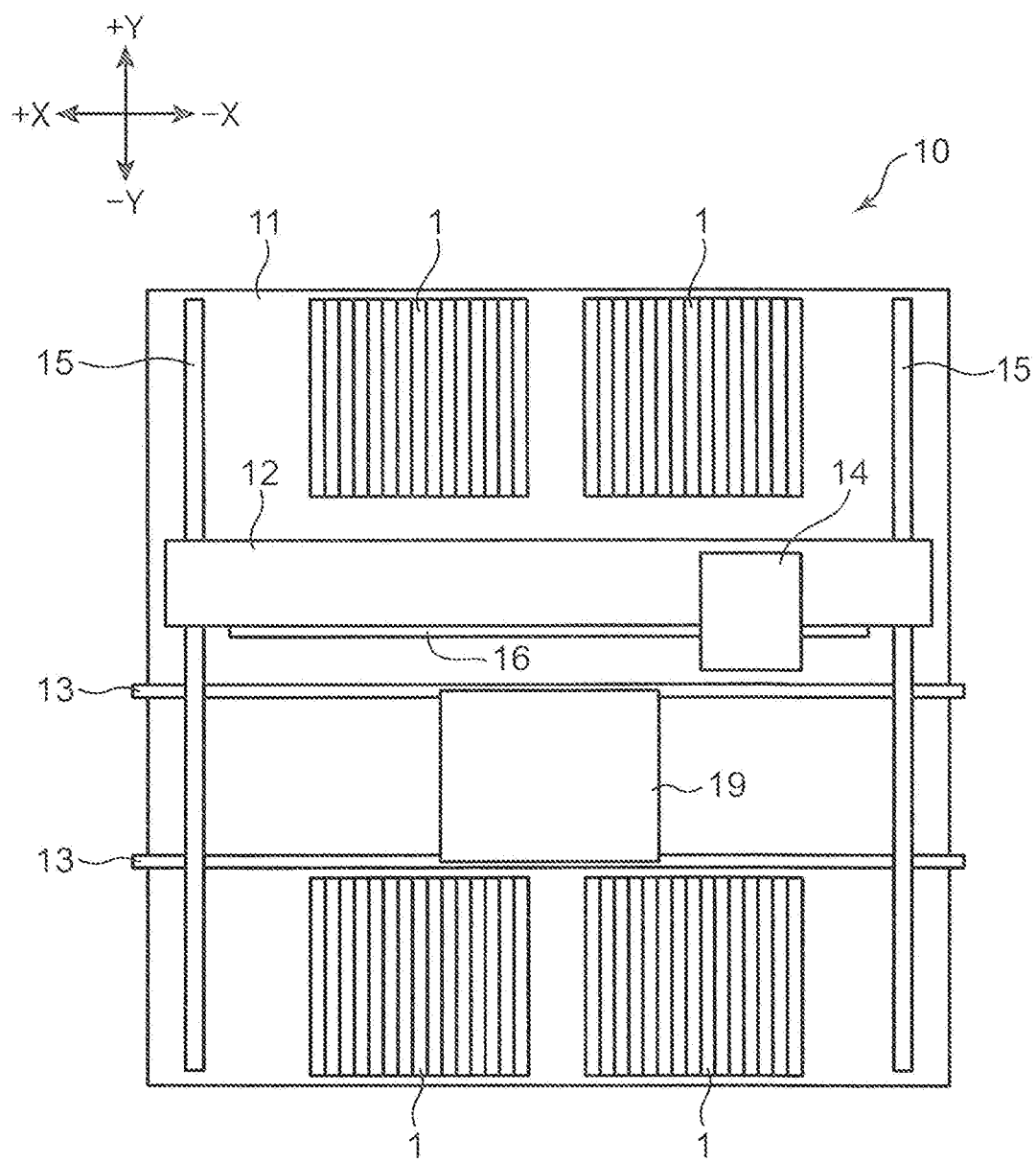
FIG. 1 is a plan view of a component mounting machine according to one embodiment of the present disclosure as viewed from above.
Figure 2:
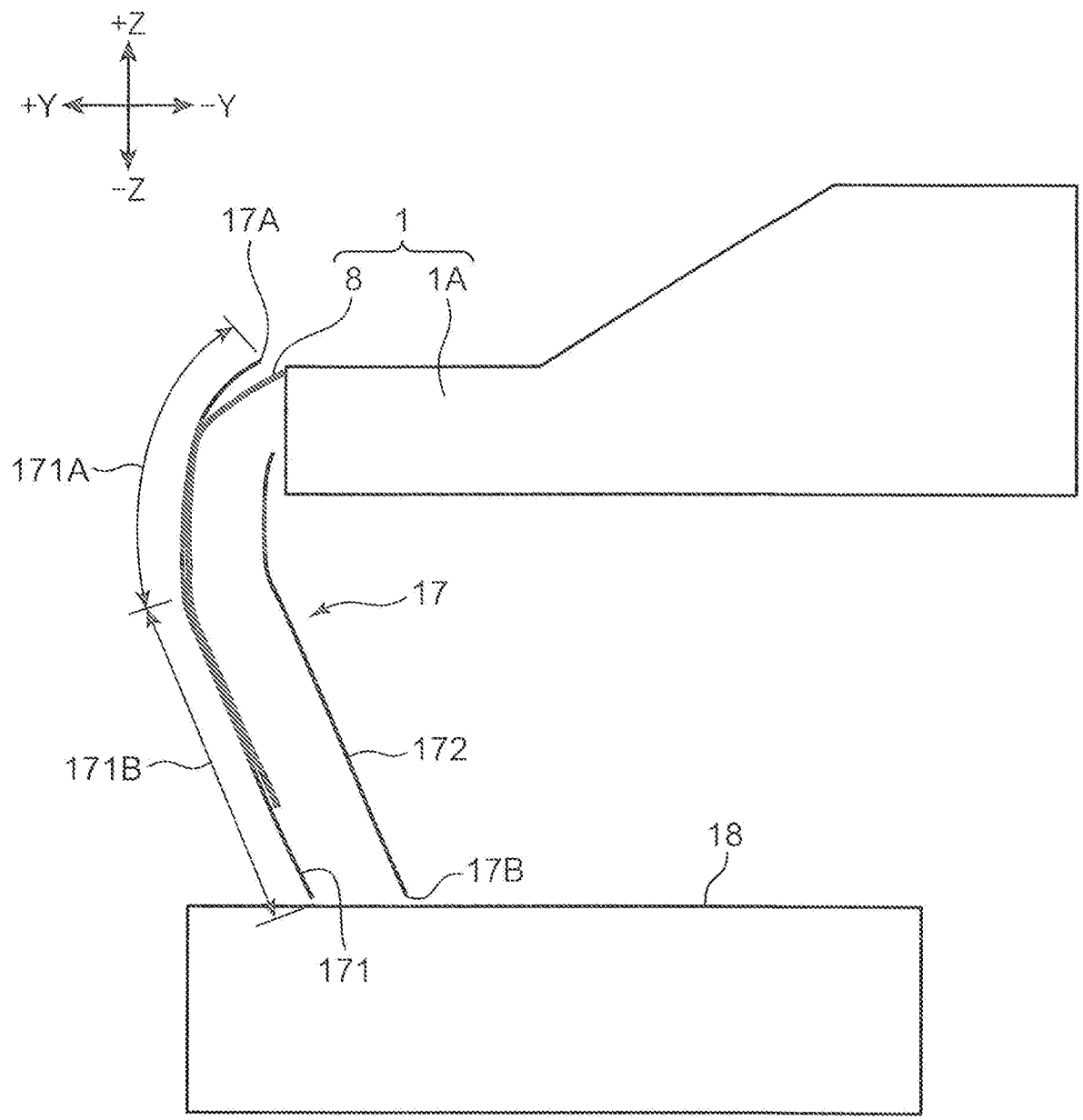
FIG. 2 is a view of a cylindrical body, a tape cutting device, and a component supply device which are provided to a component mounting machine as viewed in a side view.

FIG. 1 is a plan view of a component mounting machine 10 according to one embodiment of the present disclosure as viewed from above. FIG. 2 is a view of a cylindrical body 17, a tape cutting device 18, and a component supply device 1 which are provided to the component mounting machine 10 as viewed in a side view. The component mounting machine 10 is an apparatus for manufacturing a mounting substrate by mounting components on a substrate 19. The component mounting machine 10 includes: a component supply portion where a plurality of component supply devices are arranged side by side in the X axis direction (first direction); a body frame 11; a moving frame 12; a conveyer 13; a head unit 14; a first drive mechanism 15; a second drive mechanism 16; the cylindrical body 17; and the tape cutting device 18.

In the component mounting machine 10, the plurality of component supply devices for supplying components by feeding a component storing tape for storing components in the tape feeding direction (Y axis direction) are arranged side by side in the X axis direction in the component supply portion. With respect to the component supply devices disposed in the component supply portion, as shown in FIG. 2, at least one particular component supply device forms the component supply device 1 which includes a component supply unit 1A and a tape ejection guide structure 8. In the component supply portion, component supply devices other than the component supply device 1 including the tape ejection guide structure 8 may be also arranged. Other component supply devices are configured to supply components by feeding a component storing tape in the tape feeding direction (Y axis direction) in the same manner as the component supply device 1 except for a point that the other component supply devices do not include the tape ejection guide structure 8. The component supply device 1 including the tape ejection guide structure 8 is described in detail later.

The body frame 11 is a structure where respective constitutional parts forming the component mounting machine 10 are disposed, and is formed in an approximately rectangular shape as viewed in a plan view in the direction orthogonal to both the X axis direction and the Y axis direction. The conveyer 13 extends in the X axis direction, and is disposed on the body frame 11. The conveyer 13 conveys the substrate 19 in the X axis direction. The substrate 19 is conveyed on the conveyer 13 and is positioned at the predetermined operation position (the mounting position where a component is mounted on the substrate 19).

The moving frame 12 extends in the X axis direction, and is movably supported on the body frame 11 in the predetermined moving direction (Y axis direction). The head unit 14 is mounted on the moving frame 12. The head unit 14 is movably mounted on the moving frame 12 in the X axis direction. That is, the head unit 14 is movable in the Y axis direction along with the movement of the moving frame 12, and is movable in the X axis direction along the moving frame 12. The head unit 14 is movable between the component supply device 1 and the predetermined operation position of the substrate 19 which is conveyed by the conveyer 13. The head unit 14 takes out a component which is supplied to the component take-out position by the component supply device 1, and mounts the component taken out in this manner on the substrate 19.

The head unit 14 includes: a plurality of mounting heads each including a component suction nozzle on a distal end thereof; and a head drive mechanism which uses servo motors as drive sources for elevating/lowering (moving in the Z axis direction) the mounting heads with respect to the head unit 14 and for rotating the mounting heads about nozzle center axes respectively. The nozzle of each mounting head is communicable with any one of a negative pressure generation device, a positive pressure generation device, and an atmosphere by way of an electrically-operated switching valve. That is, the nozzle can hold a component by suction (can take out a component) by applying a negative pressure to the nozzle and, thereafter, the holding of the component by suction is released by applying a positive pressure to the nozzle.

The first drive mechanism 15 is disposed on end portions on the +X direction side and the −X direction side of the body frame 11. The first drive mechanism 15 is a mechanism for moving the moving frame 12 in the Y axis direction. The first drive mechanism 15 includes: drive motors; ball screw shafts which extend in the Y axis direction and are connected to the drive motors; and ball nuts which are disposed on the moving frame 12 and are threadedly engaged with the ball screw shafts, for example. The first drive mechanism 15 having such a configuration moves the moving frame 12 in the Y axis direction by advancing/retracting the ball nuts along the ball screw shafts by rotatably driving the ball screw shafts by the driver motors.

The second drive mechanism 16 is disposed on the moving frame 12. The second drive mechanism 16 is a mechanism which moves the head unit 14 in the X axis direction along the moving frame 12. In the same manner as the first drive mechanism 15, the second drive mechanism 16 includes: a drive motor; a ball screw shaft which extends in the X axis direction and is connected to the drive motor; and a ball nut which is disposed on the head unit 14 and is threadedly engaged with the ball screw shaft, for example. The second drive mechanism 16 having such a configuration moves the head unit 14 in the X axis direction by advancing and retracting the ball nut along the ball screw shaft by rotatably driving the ball screw shaft by the drive motor.

As shown in FIG. 2, the cylindrical body 17 is formed in a cylindrical shape having an upper opening 17A and a lower opening 17B. The cylindrical body 17 allows the insertion of the tape ejection guide structure 8 provided to the component supply device 1 from the upper opening 17A, and receives a component storing tape ejected from the component supply devices other than the component supply device 1 from the upper opening 17A and guides the ejection of the component storing tape. The cylindrical body 17 includes a first wall portion 171 and a second wall portion 172 which are wall portions for defining the upper opening 17A and the lower opening 17B. In the cylindrical body 17, the first wall portion 171 is a wall portion having a length capable of facing all component supply devices arranged in the X axis direction (first direction). The second wall portion 172 is a wall portion which is arranged so as to face the first wall portion 171 on an upstream side (−Y direction side) in the tape feeding direction. The cylindrical body 17 is formed in a box-like cylindrical shape having the upper opening 17A and the lower opening 17B. The cylindrical body 17 is formed of: the first wall portion 171 and the second wall portion 172; and a pair of side wall portions which connects end edges of the first wall portion 171 and end edges of the second wall portion 172 in the X axis direction to each other. Although the detailed configuration of the tape ejection guide structure 8 of the component supply device 1 is described later, the tape ejection guide structure 8 is brought into contact with the first wall portion 171 in the cylindrical body 17.

In the cylindrical body 17, the first wall portion 171 includes: a bent region portion 171A which is bent vertically downward from the upper opening 17A; and an extension region portion 171B which linearly extends vertically downward from a lower end of the bent region portion 171A toward the tape cutting device 18.

The tape cutting device 18 is disposed so as to face the lower opening 17B of the cylindrical body 17, and cuts a component storing tape ejected from the cylindrical body 17 by way of the lower opening 17B at a predetermined timing. The component storing tape ejected from the lower opening 17B of the cylindrical body 17 is cut into a strip shape by the tape cutting device 18, and is recovered by a recovery box provided to the tape cutting device 18.

[Configuration of Component Supply Device]

Figure 3:
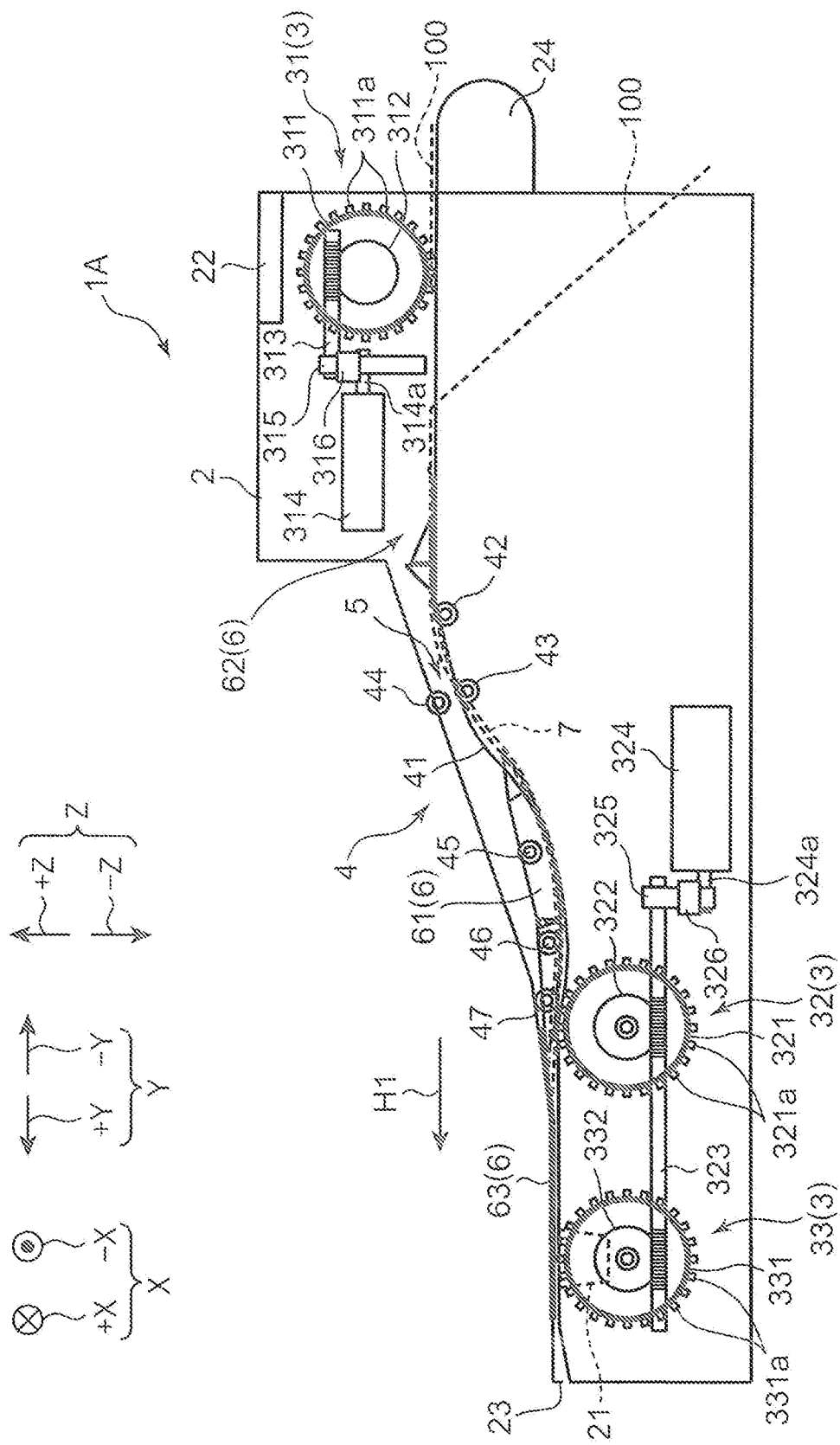
FIG. 3 is a view of a component supply unit of the component supply device as viewed in a side view.
Figure 4:
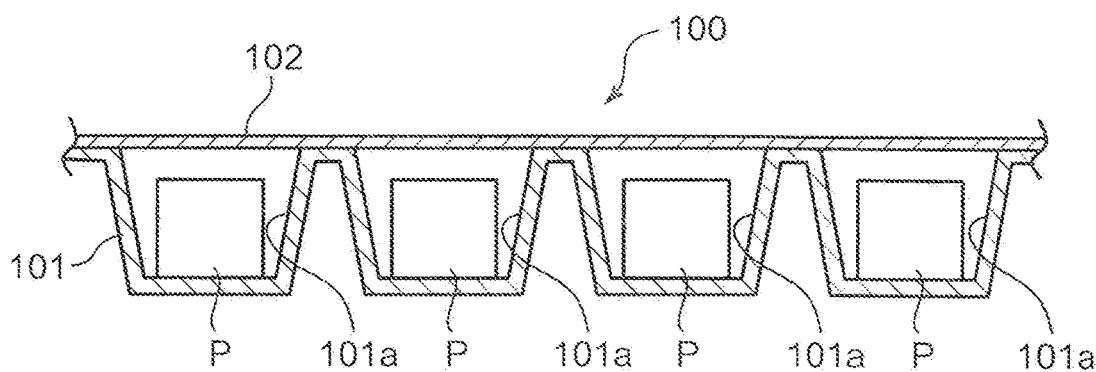
FIG. 4 is a view showing the configuration of a component storing tape used in the component supply unit.
Figure 4:
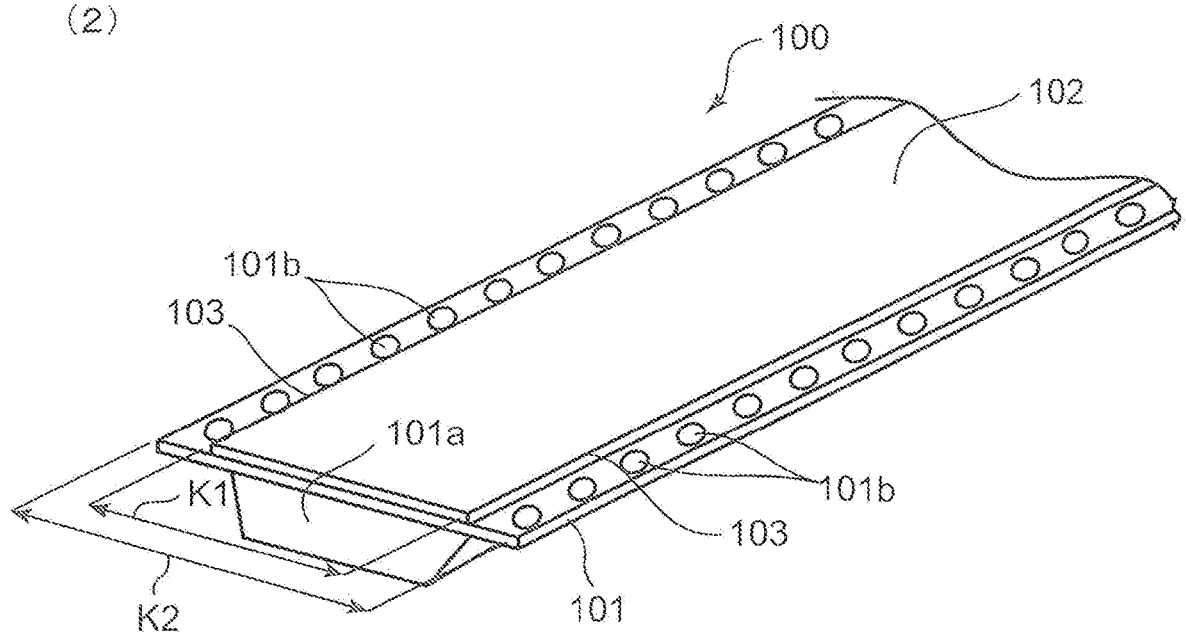

As shown in FIG. 2, the component supply device 1 includes the component supply unit 1A, and the tape ejection guide structure 8. First, the component supply unit 1A is described also with reference to FIG. 3 in addition to FIG. 2. FIG. 3 is a view of the component supply unit 1A of the component supply device 1 as viewed in a side view. The component supply unit 1A is a unit for supplying components stored in the component storing tape 100 to a component take-out position 21. A component which is supplied to the component take-out position 21 by the component supply unit 1A is taken out from the component storing tape 100 by the head unit 14 provided to the component mounting machine 10 and, thereafter, is mounted on the substrate 19. Prior to the description of the configuration of the component supply unit 1A, the component storing tape 100 is described with reference to FIG. 4. FIG. 4 is a view showing the configuration of the component storing tape 100 used in the component supply unit 1A. FIG. 4(1) is a cross-sectional view of the component storing tape 100 showing a state where the component storing tape 100 is cut along the tape feeding direction H1. FIG. 4(2) is a perspective view of the component storing tape 100.

The component storing tape 100 is formed of a carrier tape 101 and a cover tape 102. The carrier tape 101 is a tape where a plurality of component storing portions 101a in which components P are stored are arranged at a predetermined interval. Further, on both end portions of the carrier tape 101 in a width direction, hole portions 101b are arranged at a predetermined interval. The hole portions 101b engage with tooth portions of a first sprocket 311, a second sprocket 321, and a third sprocket 331 of the tape feeding portion 3 described later by fitting engagement, and enable feeding of the component storing tape 100 by the tape feeding portion 3. In the description, "The hole portions 101b of the component storing tape 100 engage with tooth portions of a first sprocket 311, a second sprocket 321, and a third sprocket 331 by fitting engagement" means a state where the tooth portions engage with the hole portions 101b by fitting engagement respectively thus enabling feeding of the component storing tape 100 in an interlocking manner with the rotation of the first sprocket 311, the second sprocket 321, and the third sprocket 331.

The cover tape 102 is a tape adhered to the carrier tape 101 so as to cover the component storing portions 101a. Both end portions of the cover tape 102 in a width direction are fused, so that the cover tape 102 is adhered to the carrier tape 101. With such a configuration, in the component storing tape 100, on both end portions of an upper surface of the carrier tape 101 in the width direction, fused portions 103 formed by fusing of the cover tape 102 are formed in a linear shape along inner sides of end edges of the cover tape 102 in the width direction. In the width direction of the carrier tape 101, the fused portions 103 are disposed inside the hole portions 101b.

In the component storing tape 100 having the above-mentioned configuration, a length K1 between the fused portions 103 respectively formed on both end portions of the carrier tape 101 in the width direction along the inner sides of the end edges of the cover tape 102 in the width direction is set substantially equal to a length of the cover tape 102 in the width direction. A length K2 of the component storing tape 100 in the width direction is set equal to a length of the carrier tape 101 in the width direction. The component storing tape 100 is, for example, a wide tape where the length K2 of the component storing tape 100 in the width direction is set equal to or more than 32 mm.

As shown in FIG. 3, the component supply unit 1A includes: a device body 2; the tape feeding portion 3; a tape traveling path forming portion 4; a component exposing portion 6; and a lid member 7. The device body 2 is a casing for housing respective parts which form the component supply unit 1A. An operation portion 22 is mounted on the device body 2. The operation portion 22 is a portion to which instructions for operating the component supply unit 1A are inputted by an operator.

Figure 5:
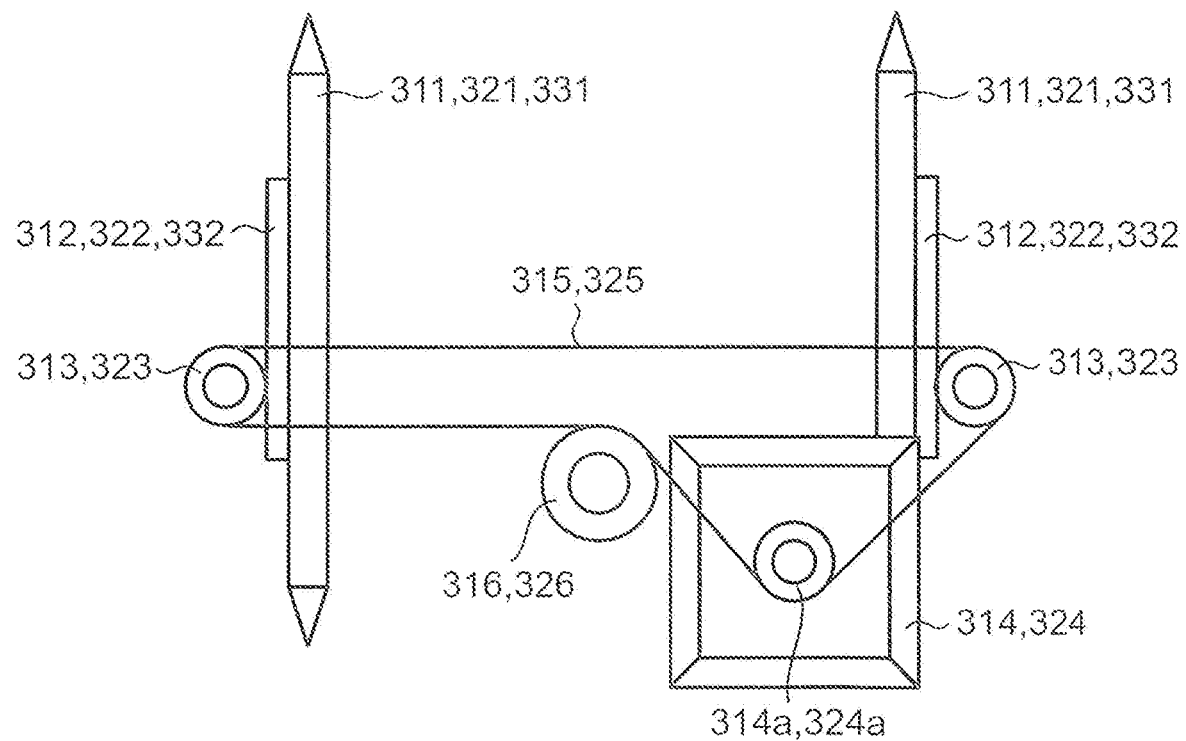
FIG. 5 is a view of a tape feeding portion provided to the component supply unit as viewed in a tape feeding direction.
Figure 6:
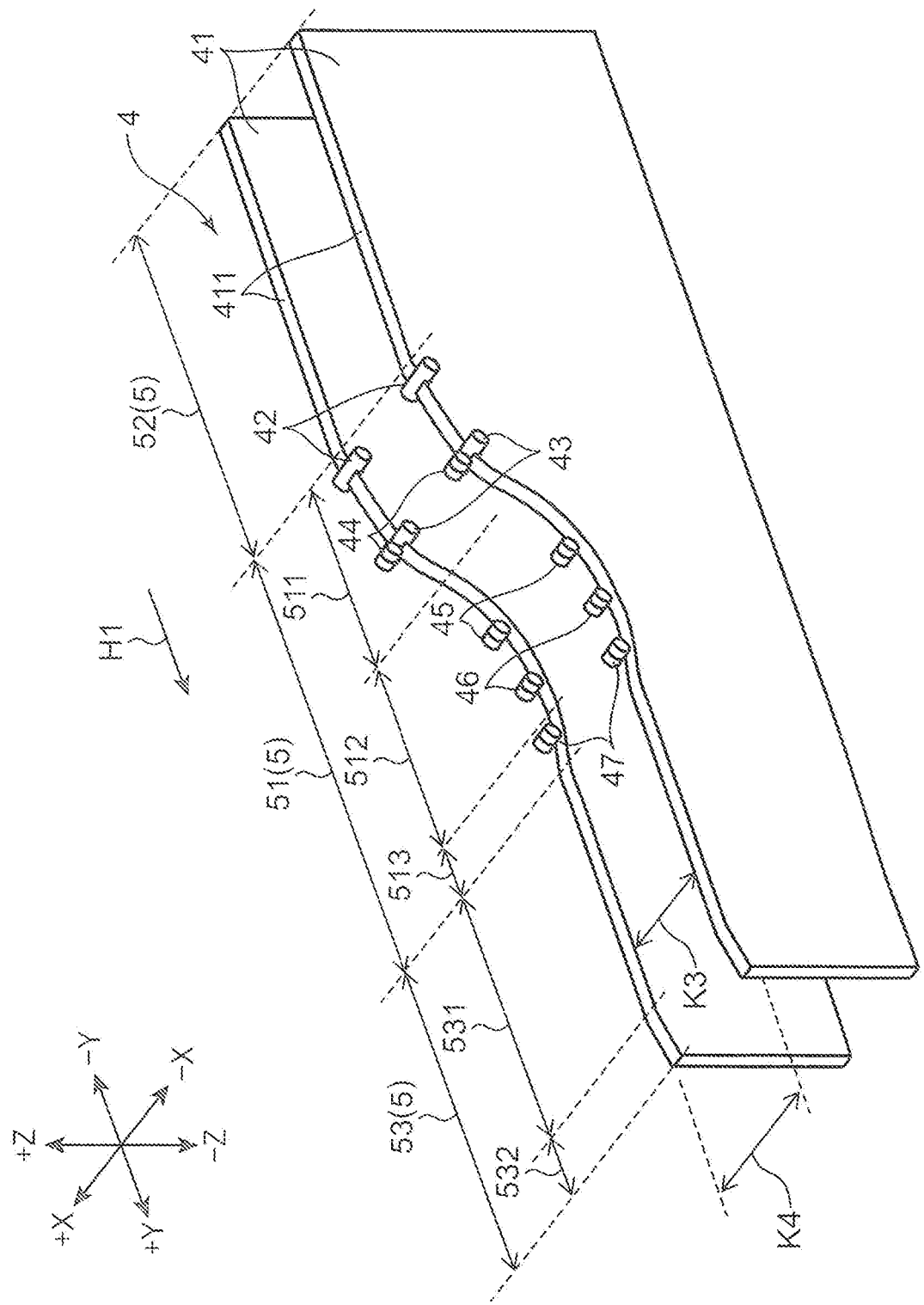
FIG. 6 is a perspective view showing the configuration of a tape traveling path forming portion provided to the component supply unit.
Figure 7:
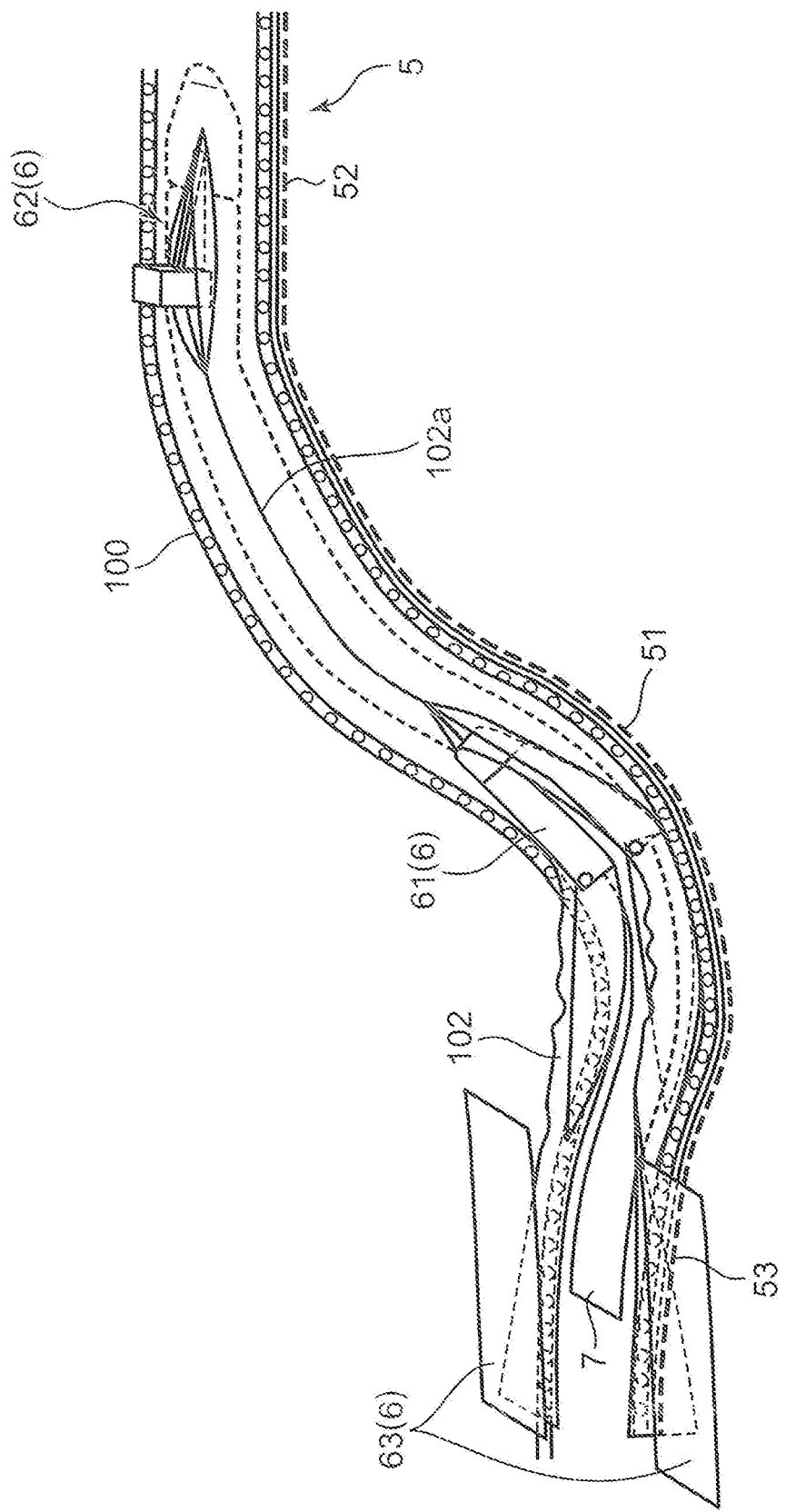
FIG. 7 is a perspective view showing the configuration of a component exposing portion provided to the component supply unit.

FIG. 5 is a view schematically showing the configuration of the tape feeding portion 3 provided to the component supply unit 1A as viewed in a tape feeding direction H1. FIG. 6 is a perspective view showing the configuration of the tape traveling path forming portion 4 provided to the component supply unit 1A. FIG. 7 is a perspective view showing the configuration of the component exposing portion 6 provided to the component supply unit 1A.

The tape feeding portion 3 feeds the component storing tape 100 toward the component take-out position 21 in the predetermined tape feeding direction H1 along the arrangement direction of the component storing portions 101a in a state where the cover tape 102 is disposed on an upper surface side. The tape feeding direction H1 when the tape feeding portion 3 feeds the component storing tape 100 toward the component take-out position 21 agrees with the +Y direction. The tape feeding portion 3 intermittently feeds the component storing tape 100 in the tape feeding direction H1 such that the component storing portions 101a reach the component take-out position 21 one by one at a predetermined time interval. The tape feeding portion 3 is configured to perform a loading operation where the component storing tape 100 is fed in the tape feeding direction H1 toward the component take-out position 21, and an unloading operation where the component storing tape 100 is fed in the −Y direction which is the direction opposite to the tape feeding direction H1.

The tape traveling path forming portion 4 forms a traveling path 5, which reaches the component take-out position 21, of the component storing tape 100 fed by the tape feeding portion 3. As shown in FIG. 3 and FIG. 6, the tape traveling path forming portion 4 includes a pair of guide walls 41, and a plurality of guide rollers, that is, first to sixth guide rollers 42, 43, 44, 45, 46, 47.

In the device body 2, the pair of guide walls 41 is a pair of wall portions which is disposed in a facing manner with a predetermined distance therebetween in the X axis direction and extends in the Y axis direction. With respect to the component storing tape 100 which is fed by the tape feeding portion 3, both end portions in the X axis direction of a −Z direction side surface (lower surface) of the component storing tape 100 are respectively guided by end surfaces 411 of the pair of guide walls 41 on a +Z direction side (hereinafter referred to as "guide surfaces 411"). That is, the traveling path 5 is formed along the guide surfaces 411 of the pair of guide walls 41. With respect to the pair of guide walls 41, a region portion where the pair of second sprockets 321 of a second tape feeding portion 32 described later in the tape feeding portion 3 is disposed, and a region portion where the pair of third sprockets 331 of the third tape feeding portion 33 is disposed are cut out.

A distance K3 between inner surfaces of the pair of guide walls 41 which faces each other is set substantially equal to the length K1 between the fused portions 103 of the component storing tape 100. A distance K4 between outer surfaces of the pair of guide walls 41 is set substantially equal to the length K2 of the component storing tape 100 in the width direction. The distance K4 is set to a length of the traveling path 5 in the width direction (X axis direction).

As shown in FIG. 6, the traveling path 5 which is formed along the guide surfaces 411 of the pair of guide walls 41 includes a first path portion 51, a second path portion 52, and a third path portion 53. The first path portion 51 of the traveling path 5 is a path formed of a slope portion which is inclined toward one side (−Z direction side) in the Z axis direction orthogonal to the width direction (X axis direction) of the traveling path 5 and the tape feeding direction H1 in a direction from an upstream side toward a downstream side in the tape feeding direction H1. The first path portion 51 includes: a first region 511 on a most upstream side in the tape feeding direction H1; a second region 512 which is connected to a downstream side of the first region 511 in the tape feeding direction H1; and a third region 513 which is connected to a downstream side of the second region 512 in the tape feeding direction H1. The first region 511 of the first path portion 51 is formed in a shape protruding in the +Z direction (upward direction) as viewed in the width direction (X axis direction) of the traveling path 5. The second region 512 of the first path portion 51 is formed in a shape protruding in the −Z direction (downward direction) as viewed in the width direction (X axis direction) of the traveling path 5.

The second path portion 52 of the traveling path 5 is a path which is connected to an upstream side of the first path portion 51 in the tape feeding direction H1. In the present embodiment, the second path portion 52 is formed so as to extend horizontally in a direction from an upstream side toward a downstream side of the tape feeding direction H1.

The third path portion 53 of the traveling path 5 is a path which is connected to a downstream side of the first path portion 51 in the tape feeding direction H1, and reaches the component take-out position 21. In the present embodiment, the third path portion 53 includes a horizontal region 531 and an inclined region 532. The horizontal region 531 is a region portion which is connected to the third region 513 of the first path portion 51, and extends horizontally along the tape feeding direction H1. A downstream end of the horizontal region 531 of the third path portion 53 in the tape feeding direction H1 agrees with the component take-out position 21 in the tape feeding direction H1. In this manner, by adopting the configuration where the component take-out position 21 is positioned at the horizontal region 531 which forms a horizontal region portion in the third path portion 53, accuracy in taking out a component P from the component storing tape 100 at the component take-out position 21 is enhanced. The inclined region 532 is a region portion which is connected to a downstream side of the horizontal region 531 in the tape feeding direction H1, and is inclined frontward and downward.

The first to sixth guide rollers 42, 43, 44, 45, 46, 47 which form the tape traveling path forming portion 4 are each formed of a pair of rollers which is disposed in a spaced apart manner in the X axis direction, and are formed in a rotatable manner about an axis thereof extending in the X axis direction. The first to sixth guide rollers 42, 43, 44, 45, 46, 47 form the first path portion 51 in the traveling path 5 together with the guide surfaces 411 of the pair of guide walls 41.

The first guide rollers 42 are disposed on an upstream end of the first region 511 of the first path portion 51 in the tape feeding direction H1. The first guide rollers 42 slightly protrude toward the +Z direction side (upward direction side) from the guide surfaces 411 of the pair of guide walls 41. The first guide rollers 42 guide both end portions in the X axis direction of the surface on a −Z direction side (lower surface) of the component storing tape 100 fed by the tape feeding portion 3.

The second guide rollers 43 are disposed on a downstream side of the first guide rollers 42 in the tape feeding direction H1 in the first region 511 of the first path portion 51. The second guide rollers 43 slightly protrude toward the +Z direction side (upward direction side) from the guide surfaces 411 of the pair of guide walls 41. The second guide rollers 43 guide both end portions in the X axis direction of the surface (lower surface) on the −Z direction side of the component storing tape 100 fed by the tape feeding portion 3.

The third guide rollers 44 are disposed so as to face the second guide rollers 43 in the first region 511 of the first path portion 51. The third guide rollers 44 guide both end portions in the X axis direction of the surface on a +Z direction side (upper surface) of the component storing tape 100 fed by the tape feeding portion 3.

The fourth guide rollers 45 are disposed so as to face the guide surfaces 411 of the pair of guide walls 41 in the second region 512 of the first path portion 51. The fourth guide rollers 45 guide both end portions in the X axis direction of the surface on a +Z direction side (upper surface) of the component storing tape 100 fed by the tape feeding portion 3.

The fifth guide rollers 46 are disposed on the downstream side of the fourth guide rollers 45 in the tape feeding direction H1 in the second region 512 of the first path portion 51 so as to face the guide surfaces 411 of the pair of guide walls 41. The fifth guide rollers 46 guide both end portions in the X axis direction of the surface on the +Z direction side (upper surface) of the component storing tape 100 fed by the tape feeding portion 3.

The sixth guide rollers 47 are disposed so as to face the guide surfaces 411 of the pair of guide walls 41 in the third region 513 of the first path portion 51. The sixth guide rollers 47 guide both end portions in the X axis direction of the surface on the +Z direction side (upper surface) of the component storing tape 100 fed by the tape feeding portion 3.

As described above, the first to sixth guide rollers 42, 43, 44, 45, 46, 47 are configured to be rotatable about respective axes thereof extending in the X axis direction. Accordingly, a friction force generated at the time of guiding the component storing tape 100 fed by the tape feeding portion 3 can be made small. As a result, it is possible to reduce a traveling resistance which is generated when the component storing tape 100 travels on the first path portion 51 formed by the first to sixth guide rollers 42, 43, 44, 45, 46, 47, and the guide surfaces 411 of the pair of guide walls 41.

Although the description has been made with respect to the tape traveling path forming portion 4 formed of the first to sixth guide rollers 42, 43, 44, 45, 46, 47 and the pair of guide walls 41, the tape traveling path forming portion 4 is not limited to such a configuration. For example, the tape traveling path forming portion 4 may be configured such that plural pairs of rollers where each pair of rollers faces each other in the Z axis direction are arranged on the tape traveling path forming portion 4.

With reference to FIG. 3 and FIG. 5, the configuration of the tape feeding portion 3 is described specifically. The tape feeding portion 3 includes a first tape feeding portion 31, a second tape feeding portion 32, and a third tape feeding portion 33.

The first tape feeding portion 31 is disposed on an upstream end of the second path portion 52 of the traveling path 5 in the tape feeding direction H1. The first tape feeding portion 31 feeds the component storing tape 100 in a state where a distal end of the component storing tape 100 is set as a free end, so that the component storing tape 100 is made to travel on the second path portion 52 and the first path portion 51. The first tape feeding portion 31 includes: a pair of first sprockets 311; a pair of first worm wheels 312; a pair of first worms 313; a first servo motor 314; a first belt 315; and a first tension roller 316.

Each of the pair of first sprockets 311 is formed of a disc-like sprocket rotatably supported on the device body 2 about an axis of the first sprocket 311 extending in the X axis direction (tape width direction). The pair of first sprockets 311 each includes a plurality of tooth portions 311a which are arranged at a predetermined interval in a circumferential direction. The tooth portions 311a of the pair of first sprockets 311 are respectively engageable with the hole portions 101b formed on both end portions of the carrier tape 101 of the component storing tape 100 in the width direction by fitting engagement. Further, a one-way clutch which transmits a rotational force only in one direction is incorporated in the pair of first sprockets 311.

Each of the pair of first worm wheels 312 is a worm gear disposed coaxially with each of the pair of first sprockets 311. Each of the pair of first worms 313 is a screw-shaped gear which is meshed with each of the pair of first worm wheels 312.

The first servo motor 314 is a drive source which generates a drive force for rotating the pair of first sprockets 311. The first servo motor 314 has a motor output shaft 314a for outputting a drive force. The first belt 315 is an endless belt, is extended between the motor output shaft 314a and the pair of first worms 313, and travels in a circulating manner when the first servo motor 314 is rotatably driven. The first tension roller 316 is a roller which is brought into contact with an outer peripheral surface of the first belt 315 for applying a tension to the first belt 315.

In the first tape feeding portion 31 having the above-mentioned configuration, a rotary drive force of the first servo motor 314 is transmitted to the pair of first worm wheels 312 by way of the first belt 315 and the pair of first worms 313, and the pair of first worm wheels 312 rotates. When the pair of first worm wheels 312 rotates, the pair of first sprockets 311 rotates in an interlocking manner with the rotation of the pair of first worm wheels 312. When the pair of first sprockets 311 rotates, the component storing tape 100 which includes the carrier tape 101 having the hole portions 101b with which the tooth portions 311a of the first sprockets 311 engage by fitting engagement is fed.

The second tape feeding portion 32 is disposed on a downstream side of the first tape feeding portion 31 in the tape feeding direction H1. The second tape feeding portion 32 is disposed on a downstream end of the first path portion 51 of the traveling path 5 in the tape feeding direction H1. In other words, the second tape feeding portion 32 is disposed on an upstream end of the third path portion 53 in the tape feeding direction H1. The second tape feeding portion 32 receives the component storing tape 100 which is fed by the first tape feeding portion 31 and travels on the first path portion 51, and feeds the component storing tape 100 toward the component take-out position 21. With such an operation, the second tape feeding portion 32 allows the component storing tape 100 to travel on the third path portion 53.

In the same manner as the first tape feeding portion 31, the second tape feeding portion 32 includes: a pair of second sprockets 321; a pair of second worm wheels 322; a pair of second worms 323; a second servo motor 324; a second belt 325; and a second tension roller 326.

Each of the pair of second sprockets 321 is formed of a disc-like sprocket rotatably supported on the device body 2 about an axis of the second sprocket 321 extending in the X axis direction (tape width direction). The pair of second sprockets 321 each includes a plurality of tooth portions 321a which are arranged at a predetermined interval in a circumferential direction. In the pair of second sprockets 321, the tooth portions 321a positioned on the other side (+Z direction side) in the Z axis direction are exposed from the guide surfaces 411 of the pair of guide walls 41. The tooth portions 321a of the pair of second sprockets 321 are respectively engageable with the hole portions 101b formed in both end portions of the carrier tape 101 of the component storing tape 100 in the width direction by fitting engagement.

Each of the pair of second worm wheels 322 is a worm gear disposed coaxially with each of the pair of second sprockets 321. The pair of second worms 323 is respectively formed of screw-shaped gears which are respectively meshed with the pair of second worm wheels 322.

The second servo motor 324 is a drive source which generates a drive force for rotating the pair of second sprockets 321. The second servo motor 324 has a motor output shaft 324a for outputting a drive force. The second belt 325 is an endless belt, is extended between the motor output shaft 324a and the pair of second worms 323, and travels in a circulating manner when the second servo motor 324 is rotatably driven. The second tension roller 326 is a roller which is brought into contact with an outer peripheral surface of the second belt 325 for applying a tension to the second belt 325.

In the second tape feeding portion 32 having the above-mentioned configuration, a rotary drive force of the second servo motor 324 is transmitted to the pair of second worm wheels 322 by way of the second belt 325 and the pair of second worms 323. Accordingly, the pair of second worm wheels 322 is rotated. When the pair of second worm wheels 322 rotates, the pair of second sprockets 321 rotates in an interlocking manner with the rotation of the pair of second worm wheels 322. When the pair of second sprockets 321 rotates, the component storing tape 100 which includes the carrier tape 101 having the hole portions 101b with which the tooth portions 321a of the second sprocket 321 are engaged by fitting engagement is fed.

When a distal end portion of the component storing tape 100 which is fed by the first tape feeding portion 31 reaches the pair of second sprockets 321, and the hole portions 101b of the carrier tape 101 on the distal end portion of the component storing tape 100 are engaged with the tooth portions 321a of the pair of second sprockets 321 by fitting engagement, the first servo motor 314 stops. As described above, when the first servo motor 314 stops, the rotation of the rotary shafts of the first sprockets 311 stops. However, due to the one-way clutch interposed between the rotary shafts and the first sprockets 311 respectively, even when the rotary shafts do not rotate, the first sprockets 311 can rotate in an interlocking manner with the movement of the component storing tape 100 fed by the rotation of the pair of second sprockets 321.

The third tape feeding portion 33 is disposed on a downstream end of the horizontal region 531 of the third path portion 53 of the traveling path 5 in the tape feeding direction H1. That is, the third tape feeding portion 33 is disposed in the vicinity of the component take-out position 21 on a downstream side of the second tape feeding portion 32 in the tape feeding direction H1. The third tape feeding portion 33 feeds the component storing tape 100 in an interlocking manner with the second tape feeding portion 32. The third tape feeding portion 33 receives the component storing tape 100 which is fed by the second tape feeding portion 32 and travels on the third path portion 53, and feeds the component storing tape 100 such that the component storing tape 100 passes the component take-out position 21. By adopting the configuration where the third tape feeding portion 33 is disposed in the vicinity of the component take-out position 21 and the component storing tape 100 is received by the third tape feeding portion 33, the component storing tape 100 can be fed in a state where the component storing tape 100 is positioned with high accuracy with respect to the component take-out position 21.

The third tape feeding portion 33 includes a pair of third sprockets 331, and a pair of third worm wheels 332. The above-mentioned "the third tape feeding portion 33 is disposed in the vicinity of the component take-out position 21" means that the third tape feeding portion 33 is disposed such that the component take-out position 21 is positioned within a range of the pair of third sprockets 331 in the tape feeding direction H1 as viewed in width direction (X axis direction) of the traveling path 5. As viewed in the width direction (X axis direction) of the traveling path 5, the component take-out position 21 may be positioned just above apex portions (uppermost end portions) of the pair of third sprockets 331 or may be disposed at the position displaced in the Y axis direction from the position just above the apex portions of the pair of third sprockets 331. In the case where the component take-out position 21 is disposed at the position displaced in the Y axis direction from the position just above the apex portions of the pair of third sprockets 331, it is preferable that the component take-out position 21 be disposed at the position displaced toward an upstream side in the tape feeding direction H compared to the position displaced toward a downstream side. This is because that, with respect to the component storing tape 100 which is fed by the pair of third sprockets 331 of the third tape feeding portion 33, a region portion of the component storing tape 100 which passes the component take-out position 21 is brought into a tensile state and hence, the deformation of the region portion becomes small so that it is possible to acquire a state where the component storing tape 100 is brought into a state where the component storing tape 100 is positioned with respect to the component take-out position 21 with high accuracy.

Each of the pair of third sprockets 331 is formed of a disc-like sprocket rotatably supported on the device body 2 about an axis of the third sprocket 331 extending in the X axis direction (tape width direction). The pair of third sprockets 331 includes a plurality of tooth portions 331a which are arranged at a predetermined interval in a circumferential direction. In the pair of third sprockets 331, tooth portions 331a positioned on the other side (+Z direction side) in the Z axis direction are exposed from the guide surfaces 411 of the pair of guide walls 41. The tooth portions 331a of the pair of third sprockets 331 are respectively engageable with the hole portions 101b formed in both end portions of the carrier tape 101 of the component storing tape 100 in the width direction by fitting engagement.

Each of the pair of third worm wheels 332 is a worm gear disposed coaxially with each of the pair of third sprockets 331. Each of the pair of third worm wheels 332 meshes with each of the pair of second worms 323.

In the third tape feeding portion 33 having the above-mentioned configuration, in the same manner as the second tape feeding portion 32, a rotary drive force of the second servo motor 324 is transmitted to the pair of third worm wheels 332 by way of the second belt 325 and the pair of second worms 323. Accordingly, the pair of third worm wheels 332 is rotated. When the pair of third worm wheels 332 rotates, the pair of third sprockets 331 rotates in an interlocking manner with the rotation of the pair of third worm wheels 332. When the pair of third sprockets 331 rotates, the component storing tape 100 which includes the carrier tape 101 having the hole portions 101b which engage with the tooth portions 331a of the third sprockets 331 by fitting engagement is fed.

Next, the configuration of the component exposing portion 6 provided to the component supply unit 1A is described with reference to FIG. 7. The component exposing portion 6 is disposed on the traveling path 5 formed by the tape traveling path forming portion 4. The component exposing portion 6 exposes a component P in the component storing portion 101a of the component storing tape 100 which is fed by the tape feeding portion 3 and travels on the traveling path 5. The component exposing portion 6 includes a cover tape raising portion 61, a cover tape pre-processing portion 62, and a cover tape post-processing portion 63.

Figure 8:
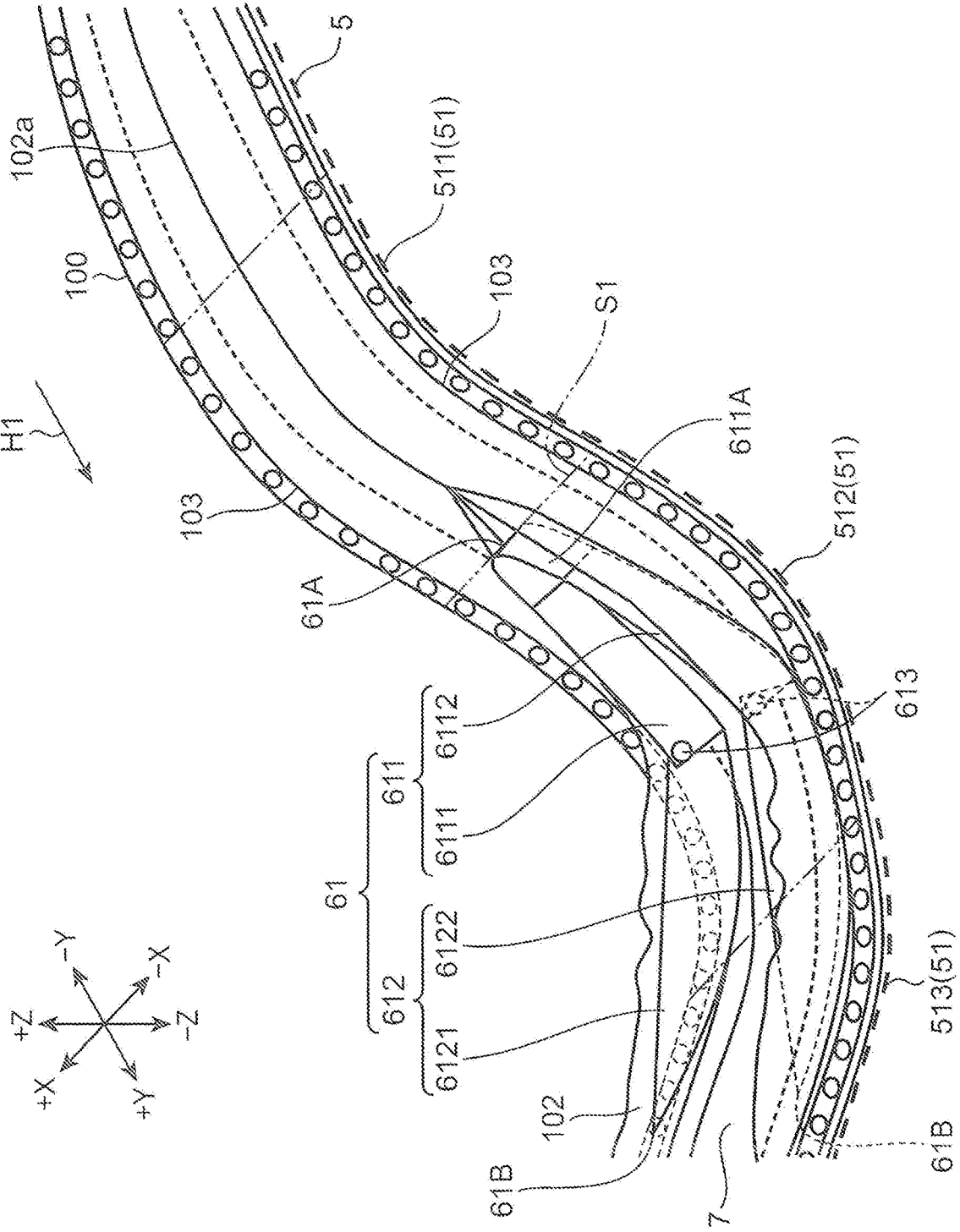
FIG. 8 is a perspective view showing the configuration of a cover tape raising portion in the component exposing portion.

FIG. 8 is a perspective view showing the configuration of the cover tape raising portion 61 in the component exposing portion 6. The cover tape raising portion 61 is disposed at the first path portion 51 on the traveling path 5. The cover tape raising portion 61 is brought into contact with the cover tape 102 of the component storing tape 100 which travels on the first path portion 51 of the traveling path 5 thus performing raising processing where the cover tape 102 is raised toward the +Z direction side (upward direction side) with respect to the carrier tape 101. Due to the raising processing of the cover tape 102 performed by the cover tape raising portion 61, a component P is exposed in the component storing portion 101a of the component storing tape 100.

In the present embodiment, the cover tape raising portion 61 is brought into contact with a cut portion 102a of the cover tape 102 which is cut by a cover tape cutting portion 622 included in the cover tape pre-processing portion 62 described later thus performing processing of raising the cut cover tape 102. The cover tape cutting portion 622 of the cover tape pre-processing portion 62 cuts the cover tape 102 at a predetermined position (for example, center position) between both end portions in the width direction. A cut portion 102a of the cover tape 102 cut by the cover tape cutting portion 622 extends linearly along the traveling path 5.

The cover tape raising portion 61 includes a raised region expansion portion 611, and a raised region holding portion 612.

The raised region expansion portion 611 is an upstream-side region portion of the cover tape raising portion 61 in the tape feeding direction H1. A distal end of an upstream-side end portion 611A of the raised region expansion portion 611 in the tape feeding direction H1 forms a most upstream end 61A of the cover tape raising portion 61 and also forms a contact start point with respect to the cover tape 102. The raised region expansion portion 611 expands raised regions of the cover tape 102 toward a +Z direction side (upward direction side) with respect to the carrier tape 101 within a range from raising start points to the fused portions 103. The raising start points of the cover tape 102 are contact start points of the cover tape 102 which are in contact with the most upstream end 61A of the cover tape raising portion 61. In the present embodiment, the raising start points of the cover tape 102 are positioned on the cut portion 102a of the cover tape 102 which is cut by the cover tape cutting portion 622. The upstream-side end portion 611A of the raised region expansion portion 611 in the tape feeding direction H1 is fixed to the lid member 7 described later.

The raised region expansion portion 611 includes a first region expansion member 6111 and a second region expansion member 6112. The first region expansion member 6111 and the second region expansion member 6112 are each formed of a plate-like member having a predetermined length in the tape feeding direction H1, and upstream ends of the first region expansion member 6111 and the second region expansion member 6112 in the tape feeding direction H1 are connected to each other. A connection portion between the first region expansion member 6111 and the second region expansion member 6112 forms the upstream-side end portion 611A of the raised region expansion portion 611 in the tape feeding direction H1.

The first region expansion member 6111 extends from the upstream end thereof which is a connection portion with the second region expansion member 6112 toward a downstream end thereof in the tape feeding direction H1 so as to approach an end portion on one side (+X direction side) in the width direction (X axis direction) of the traveling path 5. The upstream end of the first region expansion member 6111 in the tape feeding direction H is brought into contact with the cut portion 102a of the cut cover tape 102. With respect to the downstream end of the first region expansion member 6111 in the tape feeding direction H1, an end edge of the downstream end on a −Z direction side is brought into contact with a boundary portion between the cover tape 102 and the fused portion 103 on one side (+X direction side) in the width direction of the cover tape 102.

The second region expansion member 6112 extends from the upstream end thereof which is a connection portion with the first region expansion member 6111 toward a downstream end thereof in the tape feeding direction H1 so as to approach an end portion on the other side (−X direction side) in the width direction (X axis direction) of the traveling path 5. The upstream end of the second region expansion member 6112 in the tape feeding direction H1 is brought into contact with the cut portion 102a of the cut cover tape 102. With respect to the downstream end of the second region expansion member 6112 in the tape feeding direction H1, an end edge of the downstream end on a −Z direction side is brought into contact with a boundary portion between the cover tape 102 and the fused portion 103 on the other side (−X direction side) in the width direction of the cover tape 102.

The raised region holding portion 612 is connected to a downstream end of the raised region expansion portion 611 in the tape feeding direction H1 by way of connecting members 613. The raised region holding portion 612 is connected to the raised region expansion portion 611 such that the raised region holding portion 612 is swingable with respect to the raised region expansion portion 611 about the connecting member 613. A distal end of a downstream-side end portion of the raised region holding portion 612 in the tape feeding direction H1 forms a most downstream end 61B of the cover tape raising portion 61 and also forms a contact finish point with respect to the cover tape 102. The raised region holding portion 612 holds the raised regions of the cover tape 102 which are expanded by the raised region expansion portion 611 within a range which reaches the fused portions 103 while maintaining a raised state. The cover tape raising portion 61 having the configuration where the raised region holding portion 612 is swingably connected to the raised region expansion portion 611 about the connecting members 613 is swingable corresponding to a change in the traveling behavior of the component storing tape 100 on the first path portion 51. Accordingly, it is possible to prevent lowering of stability of raising processing of the cover tape 102 by the cover tape raising portion 61.

The raised region holding portion 612 includes a first region holding member 6121 and a second region holding member 6122. The first region holding member 6121 and the second region holding member 6122 are each formed of a plate-like member having a predetermined length in the tape feeding direction H1.

The first region holding member 6121 extends from an upstream end toward a downstream end thereof in the tape feeding direction H1 along the first path portion 51 of the traveling path 5. The upstream end of the first region holding member 6121 in the tape feeding direction H1 is connected to a downstream end of the first region expansion member 6111 by way of the connecting member 613. The first region holding member 6121 is swingably supported on the device body 2 such that the first region holding member 6121 is swingable about the connecting member 613 with respect to the first region expansion member 6111. The downstream end of the first region holding member 6121 in the tape feeding direction H1 forms the most downstream end 61B of the cover tape raising portion 61. An end edge of the first region holding member 6121 on a −Z direction side is brought into contact with a boundary portion between the cover tape 102 and the fused portion 103 on one side (+X direction side) in the width direction of the cover tape 102.

The second region holding member 6122 extends from an upstream end toward a downstream end thereof in the tape feeding direction H1 along the first path portion 51 of the traveling path 5. The upstream end of the second region holding member 6122 in the tape feeding direction H1 is connected to a downstream end of the second region expansion member 6112 by way of the connecting member 613. The second region holding member 6122 is supported on the device body 2 such that the second region holding member 6122 is swingable about the connecting member 613 with respect to the second region expansion member 6112. The downstream end of the second region holding member 6122 in the tape feeding direction H1 forms the most downstream end 61B of the cover tape raising portion 61. An end edge of the second region holding member 6122 on a −Z direction side is brought into contact with a boundary portion between the cover tape 102 and the fused portion 103 on the other side (−X direction side) in the width direction of the cover tape 102.

As shown in FIG. 8, the first path portion 51 where the cover tape raising portion 61 is disposed includes: as described above, the first region 511 on a most upstream side in the tape feeding direction H1; the second region 512 which is connected to a downstream side of the first region 511 in the tape feeding direction H1; and the third region 513 which is connected to a downstream side of the second region 512 in the tape feeding direction H1.

As viewed in the width direction (X axis direction) of the traveling path 5, the first path portion 51 is configured such that the first region 511 and the second region 512 differ from each other in the bending direction with respect to the Z axis direction (vertical direction) and hence, a sign of curvature changes between the first region 511 and the second region 512. When the component storing tape 100 travels along such a first path portion 51, a force which intends to deflect the component storing tape 100 in the Z axis direction (vertical direction) acts on the component storing tape 100 in opposite directions between when the component storing tape 100 passes the first region 511 and when the component storing tape 100 passes the second region 512. Accordingly, for example, assuming the case where the cover tape raising portion 61 is disposed in an extending manner over both the first region 511 and the second region 512 in the first path portion 51, there is a possibility that the stability of raising processing of the cover tape 102 by the cover tape raising portion 61 is lowered.

In view of the above, as shown in FIG. 8, the cover tape raising portion 61 is disposed such that the most upstream end 61A which becomes a contact start point with respect to the cover tape 102 in the tape feeding direction H1 is positioned above a boundary S1 between the first region 511 and the second region 512 in the first path portion 51 or in the vicinity of the boundary S1. With such a configuration, the most upstream end 61A is positioned above the boundary S1 between the first region 511 and the second region 512 or in the vicinity of the boundary S1. Accordingly, the cover tape raising portion 61 is not disposed in an extending manner over both the first region 511 and the second region 512, and is disposed in the second region 512. Accordingly, it is possible to prevent lowering of stability of raising processing of the cover tape 102 by the cover tape raising portion 61.

When the component storing tape 100 travels in the first region 511 and the second region 512 of the first path portion 51, the component storing tape 100 travels in a deflected state. In such traveling, with respect to the component storing tape 100 which travels on the first path portion 51, the deflection direction of the component storing tape 100 at the time of traveling changes between when the component storing tape 100 is fed by the first tape feeding portion 31 disposed on an upstream side of the first path portion 51 and when the component storing tape 100 is fed by the second tape feeding portion 32 disposed on a downstream side of the first path portion 51 using an inflection point between the first region 511 and the second region 512 as a boundary. Accordingly, a traveling behavior of the component storing tape 100 on the first path portion 51 changes. Specifically, the component storing tape 100 fed by the first tape feeding portion 31 is deflected toward a +Z direction side (upward direction side) in the first region 511, and is deflected toward a −Z direction side (downward direction side) in the second region 512. Further, the component storing tape 100 fed by the second tape feeding portion 32 is deflected toward a −Z direction side (downward direction side) in the first region 511, and is deflected toward a +Z direction side (upward direction side) in the second region 512.

In the cover tape raising portion 61 of the present embodiment, as described above, only the upstream-side end portion 611A of the raised region expansion portion 611 is fixed to the lid member 7 described later, and the raised region holding portion 612 is swingably connected to the raised region expansion portion 611 about the connecting member 613. With such a configuration, the cover tape raising portion 61 is swingable corresponding to a change in the traveling behavior of the component storing tape 100 on the first path portion 51. Accordingly, it is possible to prevent lowering of stability of raising processing of the cover tape 102 by the cover tape raising portion 61.

As shown in FIG. 8, in the first path portion 51, the third region 513 which is connected to a downstream side of the second region 512 where the cover tape raising portion 61 is disposed in the tape feeding direction H1 is formed in a convex shape protruding in the +Z direction (upward direction) as viewed in the width direction (X axis direction) of the traveling path 5.

On a most downstream end in the tape feeding direction H1 of the third region 513 which corresponds to a most downstream end of the first path portion 51 of the traveling path 5 in the tape feeding direction H1, as described above, the second tape feeding portion 32 which includes the pair of second sprockets 321 is disposed. The third region 513 is formed in a shape protruding in the +Z direction (upward direction) for acquiring the favorable fitting engagement property when the tooth portions 321a of the pair of second sprockets 321 engage with the hole portions 101b of the carrier tape 101 by fitting engagement at the distal end portion of the component storing tape 100 which is fed by the first tape feeding portion 31 and travels in the third region 513. Further, the component storing tape 100 received by the second tape feeding portion 32 can be fed with certainty by the second tape feeding portion 32 toward the third tape feeding portion 33 disposed in the vicinity of the component take-out position 21 in the third path portion 53 on a downstream side of the first path portion 51 in the tape feeding direction H1.

The height position of the most downstream end of the third region 513 in the tape feeding direction H1 is set in view of the fitting engagement property of the tooth portions 321a of the pair of second sprockets 321 with the hole portions 101b of the carrier tape 101 and a buckling deformation prevention effect of the carrier tape 101 at the time of performing raising processing of the cover tape 102. The height position of the most downstream end of the third region 513 is set so as to prevent such a position from becoming equal to the height position of the most upstream end of the first region 511 which corresponds to the most upstream end of the first path portion 51 in the tape feeding direction H1.

Next, with reference to FIG. 3 and FIG. 7, the cover tape pre-processing portion 62 and the cover tape post-processing portion 63 of the component exposing portion 6 are described.

The cover tape pre-processing portion 62 is disposed in the second path portion 52 which is connected to the upstream side of the first path portion 51 in the tape feeding direction H1 in the traveling path 5, in a spaced-apart manner from the cover tape raising portion 61. The cover tape pre-processing portion 62 applies pre-processing of cutting the cover tape 102 to the component storing tape 100 which is fed by the first tape feeding portion 31 and travels on the second path portion 52 in a state where a distal end of the component storing tape 100 is set as a free end, prior to raising processing of the cover tape 102 by the cover tape raising portion 61. With such a configuration, the cover tape raising portion 61 is smoothly brought into contact with the cover tape 102 of the component storing tape 100, and raising processing of the cover tape 102 by the cover tape raising portion 61 can be smoothly performed.

After the raising processing of the cover tape 102 is performed by the cover tape raising portion 61, the component storing tape 100 is fed by the second tape feeding portion 32 to the third path portion 53 on a downstream side of the first path portion 51 in the traveling path 5. The cover tape post-processing portion 63 is disposed in the third path portion 53. The cover tape post-processing portion 63 performs post-processing of developing the cover tape 102 by pressing after the raising processing is performed by the cover tape raising portion 61, in the width direction of the component storing tape 100. With such processing, the degree of exposure of components P in the component storing portions 101a of the component storing tape 100 is increased. Accordingly, the take-out property of the components P at the component take-out position 21 can be enhanced.

Figure 9:
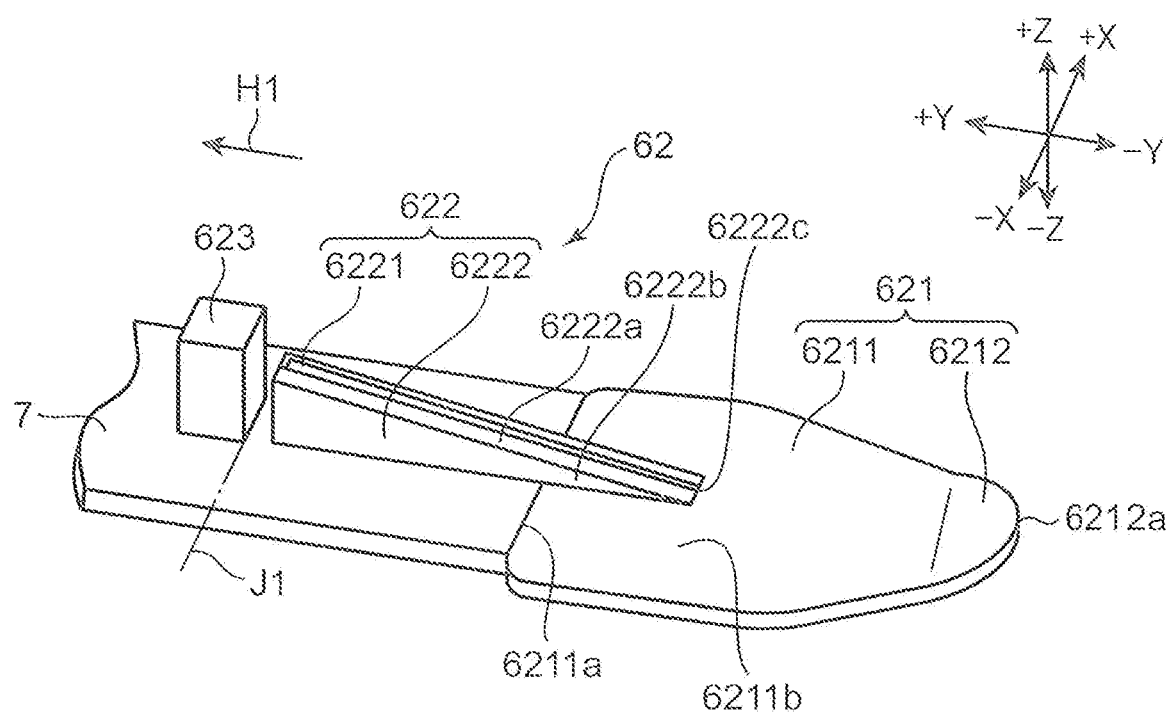
FIG. 9 is a perspective view showing the configuration of a cover tape pre-processing portion in the component exposing portion.

The detailed configuration of the cover tape pre-processing portion 62 of the component exposing portion 6 is described with reference to FIG. 9. FIG. 9 is a perspective view showing the configuration of the cover tape pre-processing portion 62 in the component exposing portion 6. The cover tape pre-processing portion 62 includes an insertion member 621, a cover tape cutting portion 622, and a support portion 623.

The insertion member 621 is a member which is inserted between the cover tape 102 and the carrier tape 101 of the component storing tape 100 which is fed by the first tape feeding portion 31 in a state where a distal end of the component storing tape 100 is set as a free end, and travels on the second path portion 52. The insertion member 621 is formed in a flat plate shape. The insertion member 621 includes: a base portion 6211; and a distal end portion 6212 which is connected to an upstream end of the base portion 6211 in the tape feeding direction H1. The lid member 7 described later is connected to a downstream end 6211a of the base portion 6211 of the insertion member 621 in the tape feeding direction H1.

In the insertion member 621, the distal end portion 6212 is inclined frontward and upward with respect to the base portion 6211 such that the distal end portion 6212 is inclined toward a +Z direction side (upward direction side) in a direction from the connection portion between the distal end portion 6212 and the base portion 6211 toward an upstream end 6212a in the tape feeding direction H1. In other words, in a state where the insertion member 621 is inserted between the cover tape 102 and the carrier tape 101, the base portion 6211 is disposed substantially parallel to the cover tape 102, and the distal end portion 6212 is inclined toward a cover tape 102 side in a spaced-apart manner from the carrier tape 101.

By forming the distal end portion 6212 of the insertion member 621 in the above-mentioned inclined structure, when the component storing tape 100 is fed by the first tape feeding portion 31 in a state where the insertion member 621 is inserted between the cover tape 102 and the carrier tape 101, it is possible to prevent the distal end portion 6212 from being brought into contact with a storing portion connection region portion positioned between the component storing portions 101a of the carrier tape 101 disposed adjacently to each other. Accordingly, the favorable traveling property of the component storing tape 100 can be maintained thus efficiently supplying the components P toward the component take-out position 21.

The insertion member 621 is supported by the support portion 623. In the present embodiment, the support portion 623 is disposed on an upper surface of the lid member 7 described later which is connected to the downstream end 6211a of the base portion 6211 of the insertion member 621 in the tape feeding direction H1, and is fixed to the device body 2. With such a configuration, the support portion 623 supports the insertion member 621 by way of the lid member 7.

The cover tape cutting portion 622 cuts the cover tape 102 of the component storing tape 100 which is fed by the first tape feeding portion 31 in a state where a distal end of the component storing tape 100 is set as a free end and travels on the second path portion 52. The cover tape cutting portion 622 cuts the cover tape 102 at a predetermined position (for example, a center position) between both end portions in the width direction. A cut portion 102a of the cover tape 102 formed by cutting the cover tape cutting portion 622 extends linearly along the traveling path 5.

The cover tape cutting portion 622 includes a blade portion 6221 for cutting the cover tape 102, and a holding portion 6222. The holding portion 6222 has a holding surface 6222a for holding the blade portion 6221 such that a cutting edge is exposed.

The cover tape cutting portion 622 is supported on the support portion 623 by way of the lid member 7 such that at least a surface of the holding portion 6222 on a side opposite to the holding surface 6222a in an upstream-side region portion 6222b in the tape feeding direction H1 is brought into contact with a surface 6211b of the base portion 6211 of the insertion member 621 on a +Z direction side (upward direction side). In the cover tape cutting portion 622, the blade portion 6221 which is held by the holding surface 6222a of the holding portion 6222 faces toward a +Z direction side (upward direction side). In the above-mentioned configuration, when the component storing tape 100 which travels on the second path portion 52 of the traveling path 5 passes the cover tape cutting portion 622, the insertion member 621 is interposed between the upstream end 6222c of the cover tape cutting portion 622 and the carrier tape 101. Accordingly, it is possible to prevent the upstream end 6222c of the cover tape cutting portion 622 from being brought into contact with a component P stored in the component storing portion 101a of the carrier tape 101. Accordingly, it is possible to prevent the component P from being damaged by a contact between the component P and the cover tape cutting portion 622.

In the holding portion 6222 of the cover tape cutting portion 622, it is desirable that the holding surface 6222a be formed of an inclined surface which is inclined frontward and downward from a downstream side toward an upstream side in the tape feeding direction H1. With such a configuration, when the component storing tape 100 travels on the second path portion 52 of the traveling path 5 and passes the cover tape cutting portion 622, the component storing tape 100 is guided along the holding surface 6222a of the holding portion 6222 formed of an inclined surface. As a result, a traveling resistance when the component storing tape 100 passes the cover tape cutting portion 622 can be reduced.

The configuration may be adopted where the insertion member 621 is supported on the support portion 623 by way of the lid member 7 such that the insertion member 621 is swingable about a predetermined axis J1 extending in the width direction (X axis direction) of the second path portion 52 of the traveling path 5. In the cover tape cutting portion 622, at least the upstream-side region portion 6222b of the holding portion 6222 in the tape feeding direction H1 is brought into contact with the surface 6211b on the +Z direction side (upward direction side) of the base portion 6211 of the insertion member 621 such that the cover tape cutting portion 622 is swingable in an interlocking manner with swinging of the insertion member 621. With such a configuration, for example, in the case where the component storing tape 100 travels on the traveling path 5 in a deflected state, the insertion member 621 inserted between the cover tape 102 and the carrier tape 101 and the cover tape cutting portion 622 are swingable corresponding to the deflection of the component storing tape 100. Accordingly, it is possible to prevent in a stable manner the distal end portion 6212 of the insertion member 621 from being brought into contact with the storing portion connection region portion of the carrier tape 101.

Next, the lid member 7 provided to the component supply device 1 is described with reference to FIG. 3 and FIG. 7. The lid member 7 is a member which covers at least some of the respective openings of the component storing portions 101a of the component storing tape 100 after exposure processing is performed for exposing the components P in the component storing portions 101a by the component exposing portion 6. The component supply unit 1A includes the lid member 7. Accordingly, when the component storing tape 100 after the exposure processing is performed is fed by the tape feeding portion 3, popping out of the components P from the component storing portions 101a can be restricted by the lid member 7. Accordingly, the supply of components to the component take-out position 21 by the component supply unit 1A can be performed in a stable manner.

In the present embodiment, the lid member 7 extends along the traveling path 5 from the downstream end 6211a of the base portion 6211 of the insertion member 621 in the tape feeding direction H1 to the component take-out position 21. The lid member 7 which is connected to the downstream end 6211a of the base portion 6211 of the insertion member 621 covers the component storing portions 101a along the traveling path 5 in a state where the lid member 7 is inserted between the cover tape 102 and the carrier tape 101 of the component storing tape 100 fed by the tape feeding portion 3. Accordingly, the lid member 7 has a function of guiding traveling of the component storing tape 100 fed by the tape feeding portion 3 in a state where the lid member 7 is inserted between the cover tape 102 and the carrier tape 101.

As described previously, when the component storing tape 100 travels in the first region 511 and the second region 512 of the first path portion 51, the component storing tape 100 travels in a deflected state. Accordingly, with respect to the component storing tape 100 which travels in the first region 511 and the second region 512 of the first path portion 51, there exists a possibility that a frictional force generated by contact between the lid member 7 which covers the component storing portions 101a and the carrier tape 101 is increased.

Accordingly, it is desirable that the lid member 7 be formed of a member having flexibility. With such a configuration, when the component storing tape 100 travels along the first region 511 and the second region 512 of the first path portion 51 in a deflected state, the lid member 7 is deflected corresponding to the deflection of the component storing tape 100. Accordingly, in the component storing tape 100 which travels in the first region 511 and the second region 512 of the first path portion 51, it is possible to suppress the increase in a frictional force caused by contact between the lid member 7 which covers the component storing portions 101a and the carrier tape 101. As a result, a traveling resistance when the component storing tape 100 travels on the traveling path 5 can be reduced. Further, it is desirable that the lid member 7 be made of metal so as not to generate static electricity. The lid member 7 may be configured such that a layer having conductivity is formed on a surface of a base material made of plastic or the like.

On the component supply unit 1A having the above-mentioned configuration, a plurality of reels (not shown in the drawing) around each of which the component storing tape 100 is wound can be mounted. A component supply operation of the component supply unit 1A is described as follows with reference to FIG. 3. First, as a preparatory operation, in the component supply unit 1A, an operator mounts a reel around which the component storing tape 100 where the supply of components is performed precedingly in the component supply unit 1A (a preceding component storing tape) is wound on the component supply unit 1A. Then, the operator brings the distal end portion of the preceding component storing tape 100 into a state where the distal end portion of the preceding component storing tape 100 engages with the first sprockets 311 by fitting engagement. In this case, the preceding component storing tape 100 is supported on the tape support member 24. Then, when the operator inputs an instruction of rotating the first sprockets 311 by operating the operation portion 22, the preceding component storing tape 100 is fed, and the distal end portion of the component storing tape 100 is made to engage with the second sprockets 321 by fitting engagement.

In a state where the above-mentioned preparatory operation is finished, a component supply operation of the component supply unit 1A is started. In the component supply unit 1A, the second sprockets 321 are rotated and hence, the preceding component storing tape 100 is fed. At this stage of the operation, the first sprockets 311 are configured to perform an idling, and the second sprockets 321 are rotated so as to feed the preceding component storing tape 100.

Next, in a state where the preceding component storing tape 100 is fed by the second sprockets 321, the operator removes the tape support member 24 from the device body 2. When the tape support member 24 is removed, as shown in FIG. 3, the preceding component storing tape 100 is displaced downward in a vertical direction (toward the −Z direction side) due to its own weight. With such an operation, fitting engagement between the preceding component storing tape 100 and the first sprockets 311 is released. At this point of time, the preceding component storing tape 100 engages with the second sprockets 321 by fitting engagement and hence, even when the fitting engagement of the preceding component storing tape 100 with the first sprockets 311 is released, the preceding component storing tape 100 is continuously fed by the second sprockets 321.

Next, in a state where the preceding component storing tape 100 is fed by the second sprockets 321, the operator mounts the tape support member 24 on the device body 2, and mounts a reel around which a succeeding component storing tape 100 is wound on the component supply unit 1A. Then, the operator brings the distal end portion of the succeeding component storing tape 100 into a state where the distal end portion of the succeeding component storing tape 100 engages with the first sprockets 311 by fitting engagement. In this case, the succeeding component storing tape 100 is supported on the tape support member 24. In this manner, in a state where running out of the components does not occur in the preceding component storing tape 100, the operator can mount the reel around which the succeeding component storing tape 100 is wound on the component supply unit 1A.

Then, when the whole preceding component storing tape 100 is reeled out from the reel, feeding of the succeeding component storing tape 100 is automatically started.

Figure 10:
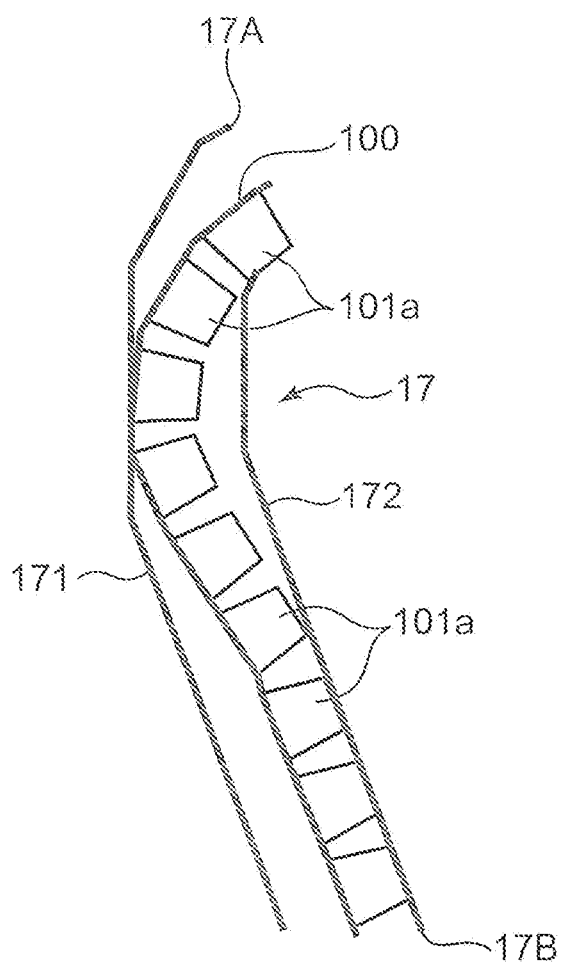
FIG. 10 is a view for describing a state where the component storing tape ejected from a tape ejection port of the component supply unit stays in a cylindrical body.

FIG. 10 is a view for describing a state where the component storing tape 100 ejected from the tape ejection port 23 of the component supply unit 1A stays in the cylindrical body 17. FIG. 10 shows a state where the component storing tape 100 ejected from the tape ejection port 23 is directly ejected into the cylindrical body 17 in the case where the component supply device 1 does not include a tape ejection guide structure 8.

In the component supply unit 1A, when the tooth portions 331a of the third sprockets 331 are disengaged from the hole portions 101b formed in a rear end of the preceding component storing tape 100, a feeding force for feeding the preceding component storing tape 100 is lost. In this case, the preceding component storing tape 100 is in a state where the whole component storing tape 100 is not ejected from the tape ejection port 23, and the rear end of the preceding component storing tape 100 remains at the position upstream of the tape ejection port 23. Then, when the succeeding component storing tape 100 is fed by the component supply unit 1A, the preceding component storing tape 100 which stays in a state where the rear end of the preceding component storing tape 100 remains at the position upstream of the tape ejection port 23 is pushed by the succeeding component storing tape 100 and is ejected from the tape ejection port 23. In the case where the component supply device 1 does not include the tape ejection guide structure 8, the preceding component storing tape 100 which is ejected from the tape ejection port 23 and is guided into the cylindrical body 17 is pushed out by the succeeding component storing tape 100 in the cylindrical body 17. At this stage of the operation, the preceding component storing tape 100 changes its posture in the cylindrical body 17 due to the inclination or the like of the preceding component storing tape 100. Further, there may be also the case where, in the cylindrical body 17, the preceding component storing tape 100 is not pushed out by the succeeding component storing tape 100 and stays in the cylindrical body 17. In this manner, when the preceding component storing tape 100 changes its posture in the cylindrical body 17 due to the inclination of the preceding component storing tape 100 or is not pushed out and stays in the cylindrical body 17, there is a possibility that the component storing tape 100 is not ejected with certainty.

Particularly, when the wide component storing tape 100 is used where a depth of the component storing portion 101a is large and the length K2 in the tape width direction is 32 mm or more for storing a large-sized component P, in a state where the component storing tape 100 is curled due to curling tendency or the like brought about by the reel, the component storing tape 100 is made to bridge between the first wall portion 171 and the second wall portion 172 in the cylindrical body 17. Accordingly, it is difficult to expect that the component storing tape 100 freely falls downward in the vertical direction. By also taking into account such a state, there is a possibility that the component storing tape 100 is not ejected with certainty. In view of the above, the component supply device 1 according to the present embodiment includes the tape ejection guide structure 8.

[Configuration of Tape Ejection Guide Structure]

First Embodiment

Figure 11:
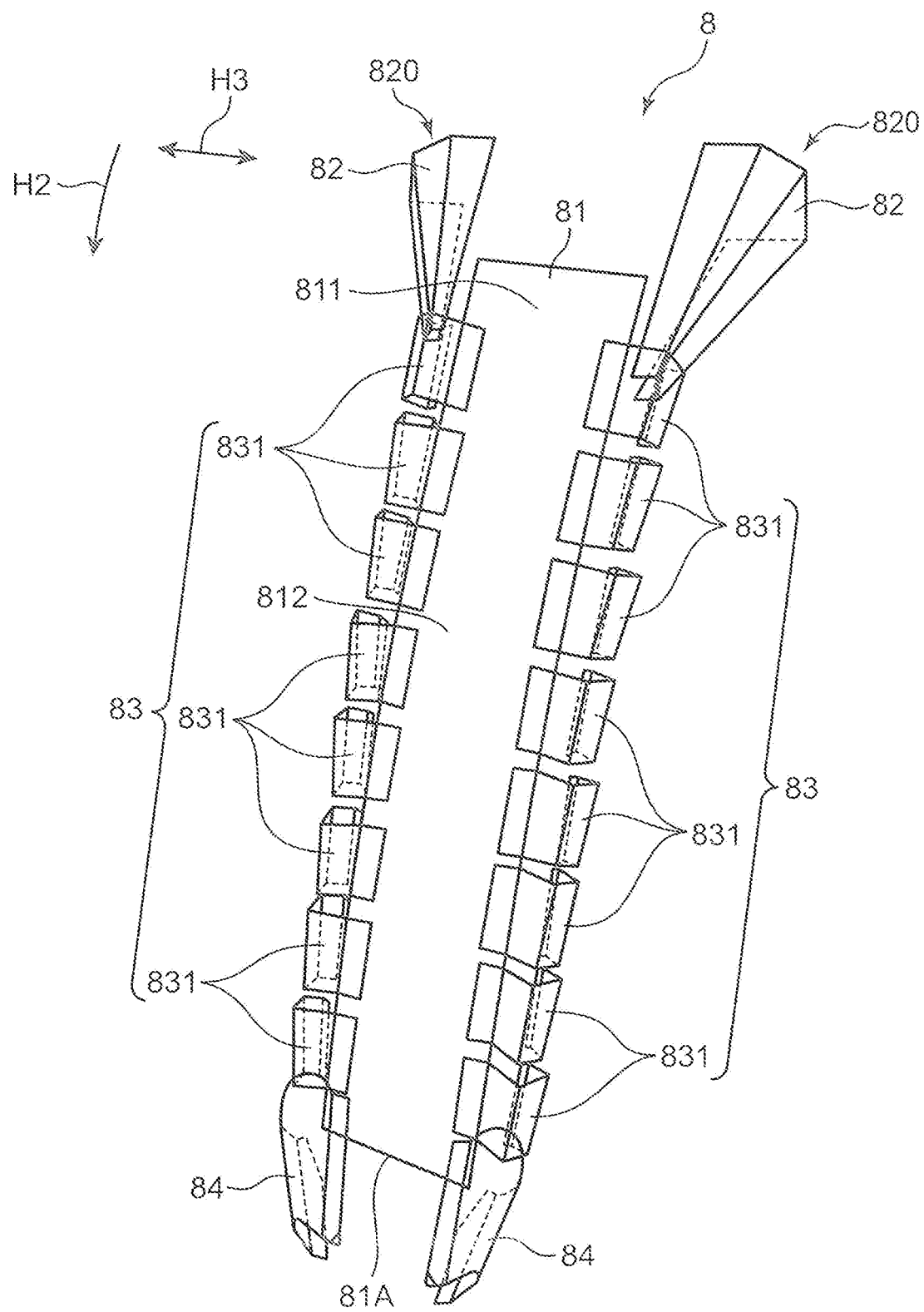
FIG. 11 is a perspective view showing the configuration of a tape ejection guide structure according to a first embodiment of the present disclosure.

FIG. 11 is a perspective view showing the configuration of the tape ejection guide structure 8 according to a first embodiment of the present disclosure. The tape ejection guide structure 8 is a structure which guides the ejection of the component storing tape 100 ejected from the tape ejection port 23 of the component supply unit 1A. The tape ejection guide structure 8 includes a guide body 81 and a pair of restraining portions 83.

In the tape ejection guide structure 8, the guide body 81 is a portion for guiding an upper surface portion or a lower surface portion of the component storing tape 100 ejected from the tape ejection port 23 along the tape ejection direction H2. The upper surface portion of the component storing tape 100 is a surface on a cover tape 102 side which is adhered to the carrier tape 101. The lower surface portion of the component storing tape 100 is a surface of the component storing tape 100 on a side opposite to the upper surface portion, and is also a surface of the carrier tape 101 on a side where the component storing portions 101a are arranged. In the present embodiment, the guide body 81 guides the upper surface portion of the component storing tape 100. Specifically, the guide body 81 guides the upper surface portion of the component storing tape 100 between the fused portions 103 which are respectively formed on both end portions of the carrier tape 101 in the width direction.

As described previously, the plurality of component supply devices are arranged side by side in the component mounting machine 10. In the case where the plurality of the component supply devices 1 each including the tape ejection guide structure 8 are arranged adjacently to each other, when the deformation of the guide body 81 becomes large in a tape width direction H3 orthogonal to the tape ejection direction H2, there is a possibility that the tape ejection guide structures 8 are brought into contact with each other. Accordingly, the guide body 81 is formed in a rectangular plate shape. The deformation of the plate-like guide body 81 in the tape width direction H3 is small and hence, it is possible to prevent the tape ejection guide structures 8 disposed adjacently to each other from being brought into contact with each other.

Further, it is desirable that the guide body 81 be made of metal so as not to generate static electricity. The guide body 81 may be configured such that a layer having conductivity is formed on a surface of a base material made of plastic or the like.

There may be a case where the component storing tape 100 ejected from the tape ejection port 23 of the component supply unit 1A is in a curled state where the component storing tape 100 is curled due to curling tendency or the like brought about by the reel. The guide body 81 has rigidity enough to bring the component storing tape 100 into a stretched state by straightening a curled state of the component storing tape 100.

In the tape ejection guide structure 8, the pair of restraining portions 83 are respectively connected to both end portions of the guide body 81 in the tape width direction H3 orthogonal to the tape ejection direction H2. The pair of restraining portions 83 restrains the displacement in the tape width direction H3 of the component storing tape 100 which is ejected in a state where the upper surface portion of the component storing tape 100 is guided by the guide body 81.

, the preceding component storing tape 100 where the supply of components is performed precedingly in the component supply unit 1A is ejected in a state where an upper surface portion of the preceding component storing tape 100 is guided by the guide body 81. When a rear end of the preceding component storing tape 100 is ejected from the tape ejection port 23 of the component supply unit 1A, a succeeding component storing tape 100 fed by the component supply unit 1A is introduced into the tape ejection guide structure 8. As a result, in the tape ejection guide structure 8, the preceding component storing tape 100 is pushed out by the succeeding component storing tape 100.

In this case, the tape ejection guide structure 8 includes the pair of restraining portions 83 which is respectively connected to the both end portions of the guide body 81 in the tape width direction H3. The pair of restraining portions 83 is configured to restrain the displacement in the tape width direction H3 of the component storing tape 100 which is ejected in a state where the upper surface portion of the component storing tape 100 is guided by the guide body 81. With such a configuration, in the tape ejection guide structure 8, the preceding component storing tape 100 is pushed out by the succeeding component storing tape without causing a change in posture thereof due to inclination or the like. Accordingly, the tape ejection guide structure 8 can eject with certainty the component storing tape 100 ejected from the tape ejection port 23 of the component supply unit 1A. Accordingly, the component storing tape 100 led out from the tape ejection guide structure 8 falls down toward the tape cutting device 18 with certainty without causing a change in posture thereof.

In the tape ejection guide structure 8 of the present embodiment, the guide body 81 has flexibility. As shown in FIG. 11, each of the pair of restraining portions 83 is formed of a plurality of restraining members 831 which are arranged at a predetermined interval in the tape ejection direction H2. With such a configuration, the tape ejection guide structure 8 which guides the ejection of the component storing tape 100 can be formed in a shape capable of acquiring favorable ejection performance of the component storing tape 100. Specifically, as shown in FIG. 2, the tape ejection guide structure 8 is inserted into the cylindrical body 17 from the upper opening 17A of the cylindrical body 17. The tape ejection guide structure 8 is brought into contact with the inner surface of the first wall portion 171 of the cylindrical body 17. The guide body 81 has flexibility, and each of the pair of restraining portions 83 is formed of the plurality of restraining members 831. Accordingly, the tape ejection guide structure 8 can be formed in a shape which conforms to the first wall portion 171 of the cylindrical body 17.

With such a configuration, in the tape ejection guide structure 8 which is brought into contact with the inner surface of the first wall portion 171 of the cylindrical body 17, as shown in FIG. 11, the guide body 81 having flexibility is configured to include a bent portion 811 and an extension portion 812. In the guide body 81, the bent portion 811 is a portion which extends vertically downward from the tape ejection port 23 and is bent in an upwardly protruding manner. In the guide body 81, the extension portion 812 is a portion which extends vertically downward from a downstream end of the bent portion 811 in the tape ejection direction H2. In the configuration where the guide body 81 is configured to include the bent portion 811 and the extension portion 812, a length of the guide body 81 necessary for guiding ejection of the component storing tape 100 can be ensured by the extension portion 812, and a protrusion length of the guide body 81 from the tape ejection port 23 along the tape feeding direction H1 in the component supply unit 1A can be also shortened as much as possible by the bent portion 811. With such a configuration, in the component supply unit 1A, it is possible to prevent the increase in a moving distance of the head unit 14 when the head unit 14 moves toward the component take-out position 21 disposed on an upstream side in the tape feeding direction H1 with respect to the tape ejection port 23.

The guide body 81 may be preliminarily formed such that the guide body 81 does not have flexibility and includes the bent portion 811 and the extension portion 812.

Further, in the tape ejection guide structure 8, the extension portion 812 of the guide body 81 extends such that a lower end 81A of the extension portion 812 of the guide body 81 reaches the extension region portion 171B which linearly extends vertically downward in the first wall portion 171 of the cylindrical body 17. With such a configuration, in the tape ejection guide structure 8, when a rear end of the preceding component storing tape 100 which is ejected by being pushed out by the succeeding component storing tape 100 reaches the lower end 81A of the extension portion 812 of the guide body 81, the preceding component storing tape 100 freely falls down along the extension region portion 171B linearly extending vertically downward in the first wall portion 171. The component storing tape 100 led out from the tape ejection guide structure 8 in this manner freely falls down along the extension region portion 171B of the first wall portion 171 in the cylindrical body 17 toward the tape cutting device 18. The component storing tape 100 which is introduced into the tape cutting device 18 through the lower opening 17B of the cylindrical body 17 in a state where the component storing tape 100 is guided by the tape ejection guide structure 8 is cut into strips by the tape cutting device 18.

Figure 12:
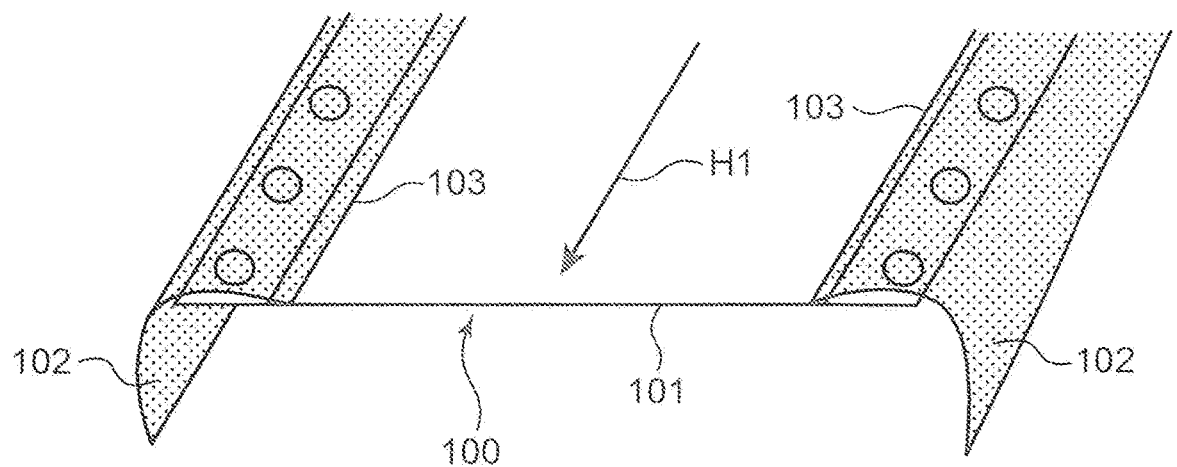
FIG. 12 is a view for describing a state of the component storing tape ejected from the tape ejection port of the component supply unit.
Figure 12:
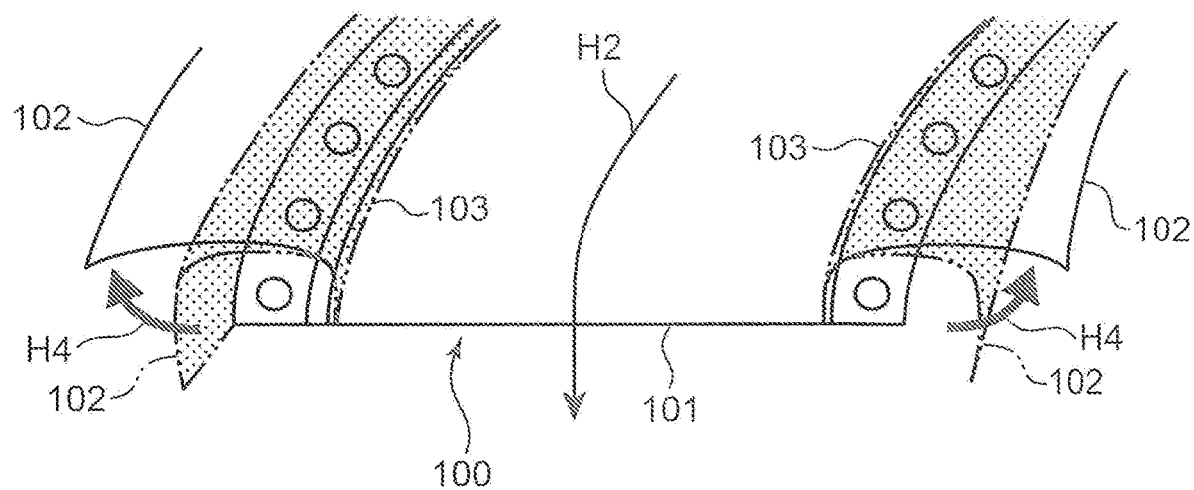

FIG. 12 is a view for describing a state of the component storing tape 100 ejected from the tape ejection port 23 of the component supply unit 1A. With respect to the component storing tape 100 ejected from the tape ejection port 23 of the component supply unit 1A, the cover tape 102 is developed outward in the tape width direction H3 with respect to the carrier tape 101 so as to expose the component storing portion 101a and, further, the cover tape 102 developed outward is bent downward on both sides of the carrier tape 101 (see FIG. 12(1)). In the component storing tape 100, when the cover tape 102 which is developed outward in the tape width direction H3 and is bent downward is ejected from the tape ejection port 23 of the component supply unit 1A, the cover tape 102 is released from a force which pushes and develops the cover tape 102, and intends to rise up in directions indicated by an arrow H4 (see FIG. 12(2)).

When the cover tape 102 is in a raised state at the time of ejecting the component storing tape 100 by the tape ejection guide structure 8, the raised cover tape 102 generates an ejection resistance at the time of ejecting the component storing tape 100 thus deteriorating ejection performance of the component storing tape 100. Further, as shown in FIG. 12(2), in the case where the tape ejection direction H2 is bent downward, a force that the cover tape 102 intends to rise up is further increased. Accordingly, to maintain a state where the cover tape 102 is bent downward, the cover tape 102 becomes wavy. In a case where the cover tape 102 becomes wavy in this manner, the wavy cover tape 102 generates the larger ejection resistance at the time of ejecting the component storing tape 100 thus more apparently deteriorating the ejection performance of the component storing tape 100.

In view of the above, as shown in FIG. 11, the tape ejection guide structure 8 includes a pair of tape introduction guide portions 82. The pair of tape introduction guide portions 82 is each disposed outside in the tape width direction H3 with respect to an upstream end of the guide body 81 in the tape ejection direction H2. The pair of tape introduction guide portions 82 guides the introduction of both end portions in the tape width direction H3 of the component storing tape 100 ejected from the tape ejection port 23 of the component supply unit 1A to the restraining members 831 on the most upstream side in the tape ejection direction H2 in the pair of restraining portions 83. The pair of tape introduction guide portions 82 each defines an introduction guide path 820 for introducing the both end portions of the component storing tape 100 in the tape width direction H3 to the restraining members 831.

When the component storing tape 100 passes the introduction guide paths 820 defined by the pair of tape introduction guide portions 82, a force that the cover tape 102 intends to rise up acts on the pair of tape introduction guide portions 82. In the case where the tape ejection direction H2 is bent downward, a force which acts on the pair of tape introduction guide portions 82 is further increased. When the pair of tape introduction guide portions 82 intends to excessively push down rising of the cover tape 102, such excessive pushing generates an ejection resistance at the time of ejecting the component storing tape 100 thus giving rise to a possibility that the ejection performance of the component storing tape 100 is deteriorated. In view of the above, the pair of tape introduction guide portions 82 guides the component storing tape 100 in such a manner that the tape introduction guide portions 82 allow the rising of the cover tape 102 to some extent by not restraining the cover tape 102, and wrap around the both end portions of the carrier tape 101 in the tape width direction H3.

Each of the pair of tape introduction guide portions 82 is formed in a tapered shape where the introduction guide path 820 is tapered from an upstream end toward a downstream end thereof in the tape ejection direction H2. Specifically, each of the pair of tape introduction guide portions 82 is formed in a tapered shape such that a cross-sectional area of the introduction guide path 820 in cross section perpendicular to the tape ejection direction H2 is gradually decreased from an upstream end toward a downstream end thereof in the tape ejection direction H2. The downstream end of each of the pair of tape introduction guide portions 82 in the tape ejection direction H2 enters an upstream end of the restraining member 831 disposed at a most upstream side in the tape ejection direction H2 among the plurality of restraining members 831 which form the pair of restraining portions 83.

The tape ejection guide structure 8 includes the pair of tape introduction guide portions 82 which is each formed in a tapered shape. With such a configuration, immediately before both end portions of the component storing tape 100 in the tape width direction H3 are introduced into the restraining members 831 disposed on the most upstream side in the tape ejection direction H2, it is possible to bring the cover tape 102 into an outwardly folded state such that the cover tape 102 wraps around both end portions of the carrier tape 101 in the tape width direction H3 against a force that the cover tape 102 intends to rise up. As a result, with respect to the component storing tape 100 which is introduced into the restraining members 831 of the pair of restraining portions 83 through the pair of tape introduction guide portions 82, the cover tape 102 is brought into an outwardly folded state such that the cover tape 102 wraps around both end portions of the carrier tape 101 in the tape width direction H3. With such a configuration, both end portions in the tape width direction H3 of the component storing tape 100 which is ejected from the tape ejection port 23 of the component supply unit 1A can be smoothly introduced into the restraining members 831 which form the pair of restraining portions 83.

Further, it is desirable that the pair of tape introduction guide portions 82 be made of metal so as not to generate static electricity. The pair of tape introduction guide portions 82 may be configured such that a layer having conductivity is formed on a surface of a base material made of plastic or the like.

Figure 13:
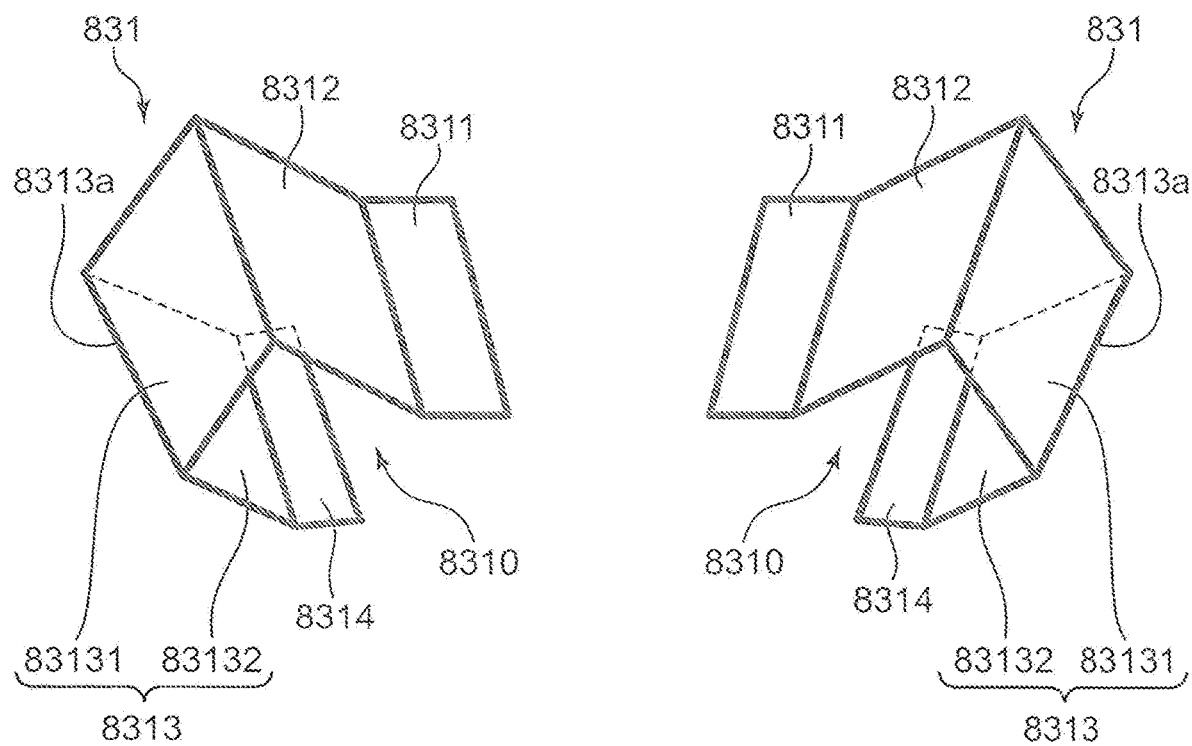
FIG. 13 is a perspective view showing a restraining member which forms a pair of restraining portions of the tape ejection guide structure.
Figure 14:
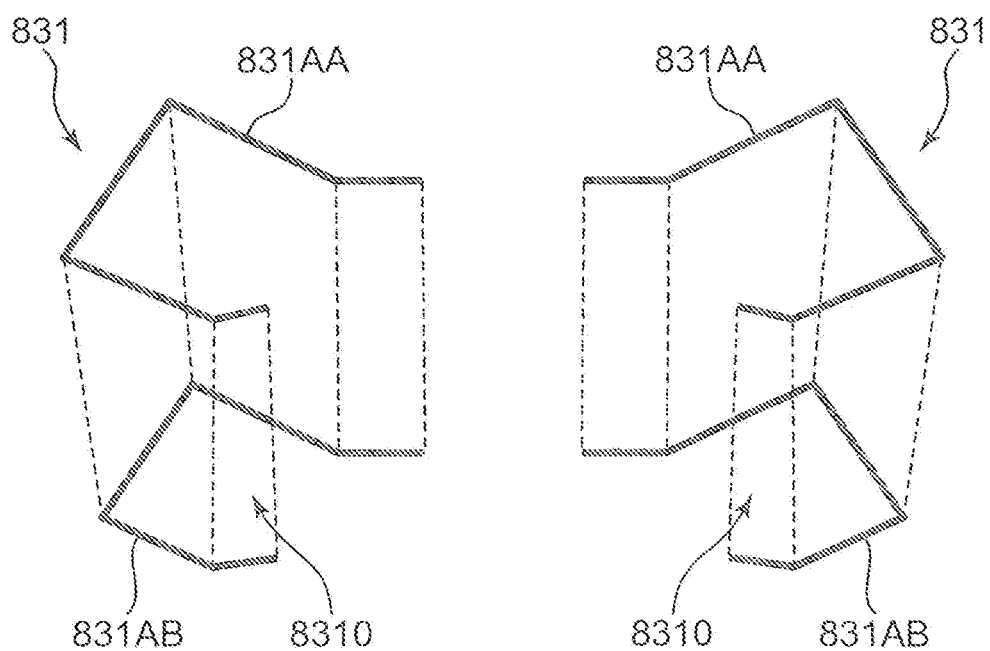
FIG. 14 is a view for describing the shape of the restraining member.
Figure 15:
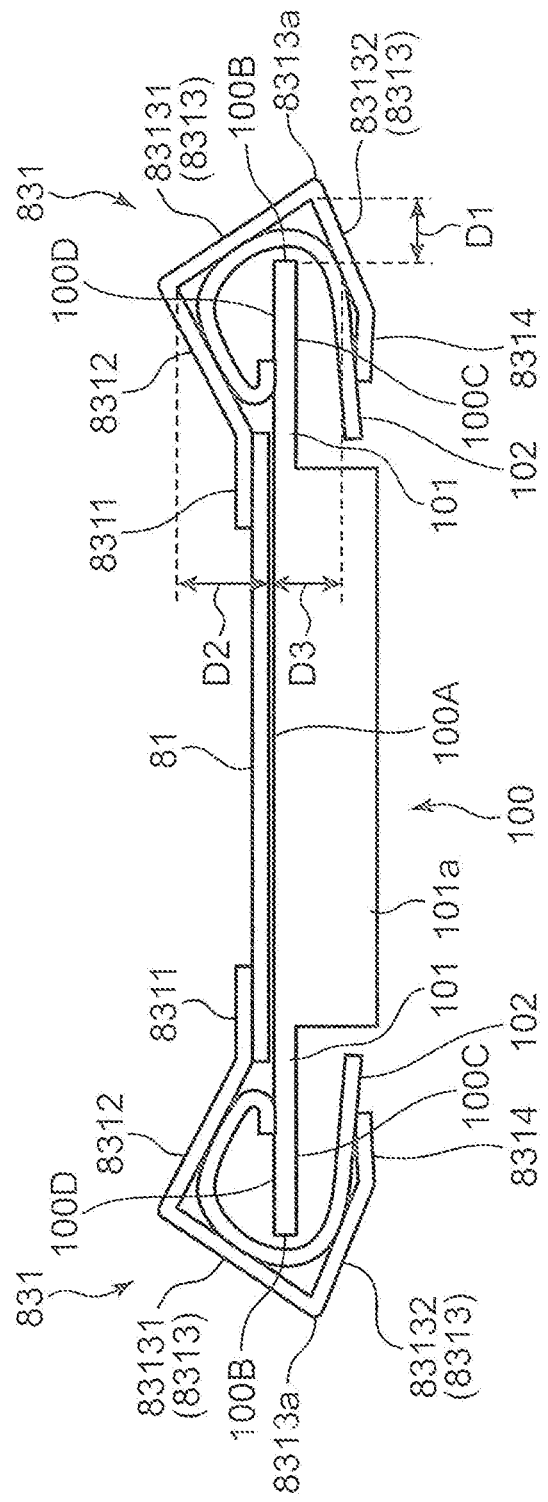
FIG. 15 is a view for describing a restraining state of a component storing tape by the restraining member as viewed in a tape ejection direction.

Next, the restraining members 831 which form the pair of restraining portions 83 are described in detail with reference to FIG. 13 to FIG. 15. FIG. 13 is a perspective view showing restraining members 831 which form a pair of restraining portions 83 of the tape ejection guide structure 8. FIG. 14 is a view for describing the shape of the restraining members 831. FIG. 15 is a view for describing a restraining state of the component storing tape 100 by the restraining members 831 as viewed in the tape ejection direction H2.

Each of the restraining members 831 which form the pair of restraining portions 83 includes a connection portion 8311, an upper surface end facing portion 8312, a side surface facing portion 8313, and a lower surface end facing portion 8314.

In the restraining member 831, the connection portion 8311 is formed in a flat plate shape, and is a portion connected to an end portion of the guide body 81 in the tape width direction H3. The side surface facing portion 8313 is formed in a flat plate shape, and faces a side end surface portion 100B on an end portion in the tape width direction H3 of the component storing tape 100 which is ejected in the tape ejection direction H2 in a state where the upper surface portion 100A of the component storing tape 100 is guided by the guide body 81. In the example shown in FIG. 13, the side surface facing portion 8313 has the structure where two plate-like members 83131, 83132 are connected to each other. In the side surface facing portion 8313, a corner portion 8313a where two plate-like members 83131, 83132 are connected to each other protrudes outward in the tape width direction H3 (see FIG. 15). The restraining member 831 includes the side surface facing portion 8313 and hence, the displacement in the tape width direction H3 of the component storing tape 100 which is ejected in a state where the upper surface portion 100A of the component storing tape 100 is guided by the guide body 81 can be restrained with more certainty.

An inter distance D1 between the corner portion 8313a of the side surface facing portion 8313 of the restraining member 831 and the side end surface portion 100B of the component storing tape 100 is set to a value capable of reducing as much as possible an ejection resistance caused by a contact of the component storing tape 100 with the side surface facing portion 8313 while restricting the displacement of the component storing tape 100 in the tape width direction H3.

In the restraining member 831, the lower surface end facing portion 8314 is formed in a flat plate shape. As shown in FIG. 15, the lower surface end facing portion 8314 faces an end portion region portion 100C in the tape width direction H3 of the lower surface portion of the component storing tape 100 which is ejected in the tape ejection direction H2 in a state where the upper surface portion 100A of the component storing tape 100 is guided by the guide body 81.

With respect to the component storing tape 100 which is introduced into the restraining members 831 by the tape introduction guide portions 82, the cover tape 102 is brought into a state where the cover tape 102 is developed outward in the tape width direction H3 with respect to the carrier tape 101, and are folded so as to wrap around both end portions of the carrier tape 101. The lower surface end facing portion 8314 which forms a part of the restraining member 831 restricts the displacement of the cover tape 102 in a folded state when the cover tape 102 intends to rise up.

As described previously, the guide body 81 has rigidity enough to bring the component storing tape 100 into a stretched state by straightening a curled state of the component storing tape 100. In the case where the curled component storing tape 100 is introduced into the tape ejection guide structure 8, the lower surface end facing portions 8314 of the restraining members 831 straighten the curled state of the component storing tape 100 in cooperation with the guide body 81 having the rigidity. With such straightening, in the tape ejection guide structure 8, the preceding component storing tape 100 is pushed out by the succeeding component storing tape 100 with certainty. Accordingly, the tape ejection guide structure 8 can eject with certainty the component storing tape 100 ejected from the tape ejection port 23 of the component supply unit 1A.

In the restraining member 831, the upper surface end facing portion 8312 is formed in a flat plate shape. As shown in FIG. 15, the upper surface end facing portion 8312 faces, from above the cover tape 102 which is developed by pushing, an end portion region portion 100D in the tape width direction H3 of the upper surface portion of the component storing tape 100 which is ejected in the tape ejection direction H2 in a state where the upper surface portion 100A of the component storing tape 100 is guided by the guide body 81. The end portion region portions 100D of the component storing tape 100 that the upper surface end facing portions 8312 face are region portions disposed outside the fused portions 103 respectively formed on both end portions in the width direction of the carrier tape 101 on the upper surface portion of the component storing tape 100.

With respect to the component storing tape 100 which is introduced into the restraining members 831 by the tape introduction guide portions 82, the cover tape 102 is brought into a state where the cover tape 102 is developed outward in the tape width direction H3 with respect to the carrier tape 101, and are folded so as to wrap around both end portions of the carrier tape 101. The upper surface end facing portion 8312 which forms a part of the restraining member 831 is connected to the guide body 81 by way of the connection portion 8311, and faces the end portion region portion 100D on the upper surface portion of the component storing tape 100 from above the cover tape 102 which is developed by pushing. Such an upper surface end facing portion 8312 restricts the displacement of the cover tape 102 in a developed state toward the inside in the tape width direction H3 (toward a side where the guide body 81 is disposed with respect to the upper surface end facing portion 8312) and the displacement of the cover tape 102 in the upward direction.

When the component storing tape 100 in a state where the cover tape 102 is developed passes the restraining members 831, a force which is generated when the cover tape 102 intends to rise up acts on the upper surface end facing portions 8312. In the case where the tape ejection direction H2 is bent downward, a force which acts on the upper surface end facing portions 8312 is further increased (see FIG. 12(2)). When the upper surface end facing portions 8312 intend to excessively push down rising of the cover tape 102, such excessive pushing generates an ejection resistance at the time of ejecting the component storing tape 100 thus giving rise to a possibility that the ejection performance of the component storing tape 100 is deteriorated. In view of the above, the upper surface end facing portions 8312 restrict the upward displacement of the cover tape 102 in a developed state so as to allow a certain degree of rising of the cover tape 102 while restricting the displacement of the cover tape 102 toward the inside in the tape width direction H3. With such straightening, in the tape ejection guide structure 8, the preceding component storing tape 100 is pushed out by the succeeding component storing tape 100 with certainty. Accordingly, the tape ejection guide structure 8 can eject with certainty the component storing tape 100 ejected from the tape ejection port 23 of the component supply unit 1A.

In the restraining members 831, the upper surface end facing portion 8312 is disposed away from the developed cover tape 102 outward from the inside in the tape width direction H3 as viewed in the tape ejection direction H2. In an example shown in FIG. 13, the upper surface end facing portion 8312 is inclined frontward and upward so as to be away from the developed cover tape 102 outward from the inside in the tape width direction H3.

As described previously, a force which is generated when the cover tape 102 intends to rise up acts on the upper surface end facing portions 8312, and this force generates an ejection resistance at the time of ejecting the component storing tape 100 thus giving rise to a possibility that the ejection performance of the component storing tape 100 is deteriorated. In view of the above, the upper surface end facing portions 8312 of the restraining members 831 are disposed away from the developed cover tape 102 outward from the inside in the tape width direction H3. With such a configuration, a force which acts on the upper surface end facing portions 8312 is reduced and hence, the favorable ejection performance of the component storing tape 100 can be maintained.

An inter distance D2 between an uppermost end of the upper surface end facing portion 8312 of the restraining member 831 and the guide body 81 (see FIG. 15) is set so as to allow a certain degree of rising of the cover tape 102 in a developed state while restricting the displacement toward the inside in the tape width direction H3 of the cover tape 102.

An inter distance D3 between a position of the restraining member 831 perpendicularly below the side end surface portion 100B of the component storing tape 100 (an approximately center position of the plate-like member 83132 in the example shown in FIG. 15) and the guide body 81 is set to a value capable of ejecting plural kinds of component storing tapes 100 having different thicknesses while restricting the displacement of the component storing tapes 100 in a direction perpendicular to the tape ejection direction H2 and the tape width direction H3. By restricting the displacement of the component storing tape 100 in a direction perpendicular to the tape ejection direction H2 and the tape width direction H3, a displacement amount of a distal end of a succeeding component storing tape 100 in a direction perpendicular to the tape ejection direction H2 and the tape width direction H3 with respect to a rear end of the preceding component storing tape 100 can be made small thus preventing overlapping of the preceding and succeeding component storing tapes 100. With such a configuration, the preceding component storing tape 100 is pushed out by the succeeding component storing tape 100 with certainty.

In the tape ejection guide structure 8 of the present embodiment, in the restraining member 831, the flat-plate-shaped upper surface end facing portion 8312, the flat-plate-shaped side surface facing portion 8313, and the flat-plate-shaped lower surface end facing portion 8314 are integrally connected to each other so as to wrap around an end portion of the component storing tape 100 in the tape width direction H3. By each of the pair of restraining portions 83 constituted of the restraining members 831 each formed by integrally connecting the upper surface end facing portion 8312, the side surface facing portion 8313, and the lower surface end facing portion 8314 to each other, it is possible to define guide paths 8310 (see FIG. 13) which guide the component storing tape 100 so as to wrap around both end portions in the tape width direction H3 at the time of ejecting the component storing tape 100.

In the tape ejection guide structure 8, the restraining member 831 is formed in a tapered shape where the guide path 8310 is tapered from an upstream end toward a downstream end thereof in the tape ejection direction H2. Specifically, the restraining member 831 is formed in a tapered shape such that a cross-sectional area of the guide path 8310 in cross section perpendicular to the tape ejection direction H2 is gradually decreased from an upstream-side end edge 831AA toward a downstream-side end edge 831AB in the tape ejection direction H2 (see FIG. 14). More specifically, in the restraining member 831, the restraining member 831 is formed in a tapered shape such that a length of the flat-plate-shaped upper surface end facing portion 8312, lengths of the plate-like members 83131, 83132 which form the flat-plate-shaped side surface facing portion 8313, and a length of the flat-plate-shaped lower surface end facing portion 8314 in a direction perpendicular to the tape ejection direction H2 and the tape width direction H3 are gradually decreased from an upstream side toward a downstream side in the tape ejection direction H2. However, provided that the restraining member 831 is configured such that a cross-sectional area of the guide path 8310 is gradually decreased, all of the lengths of the upper surface end facing portion 8312, the side surface facing portion 8313, and the lower surface end facing portion 8314 may not be gradually decreased.

The component storing tape 100 ejected from the tape ejection port 23 of the component supply unit 1A is ejected in the tape ejection direction H2 while the upper surface portion 100A of the component storing tape 100 is guided by the guide body 81 and both end portions of the component storing tape 100 in the tape width direction H3 are guided by the pair of restraining portions 83. The respective restraining members 831 which constitute each of the pair of restraining portions 83 are formed in a tapered shape. With such a configuration, it is possible to prevent both end portions of the component storing tape 100 in the tape width direction H3 from entering gap portions between the respective restraining members 831 of the pair of restraining portions 83. The respective restraining members 831 are formed in a tapered shape and hence, it is possible to prevent the occurrence of a situation where, between the restraining members 831 which are disposed adjacently to each other in the tape ejection direction H2, the cover tape 102 which is ejected from the upstream-side restraining member 831 and intends to rise up cannot enter the downstream-side restraining member 831. Accordingly, the tape ejection guide structure 8 can eject with certainty the component storing tape 100 ejected from the tape ejection port 23 of the component supply unit 1A.

Further, it is desirable that the restraining member 831 be made of metal so as not to generate static electricity. The restraining member 831 may be configured such that a layer having conductivity is formed on a surface of a base material made of plastic or the like.

Figure 16:
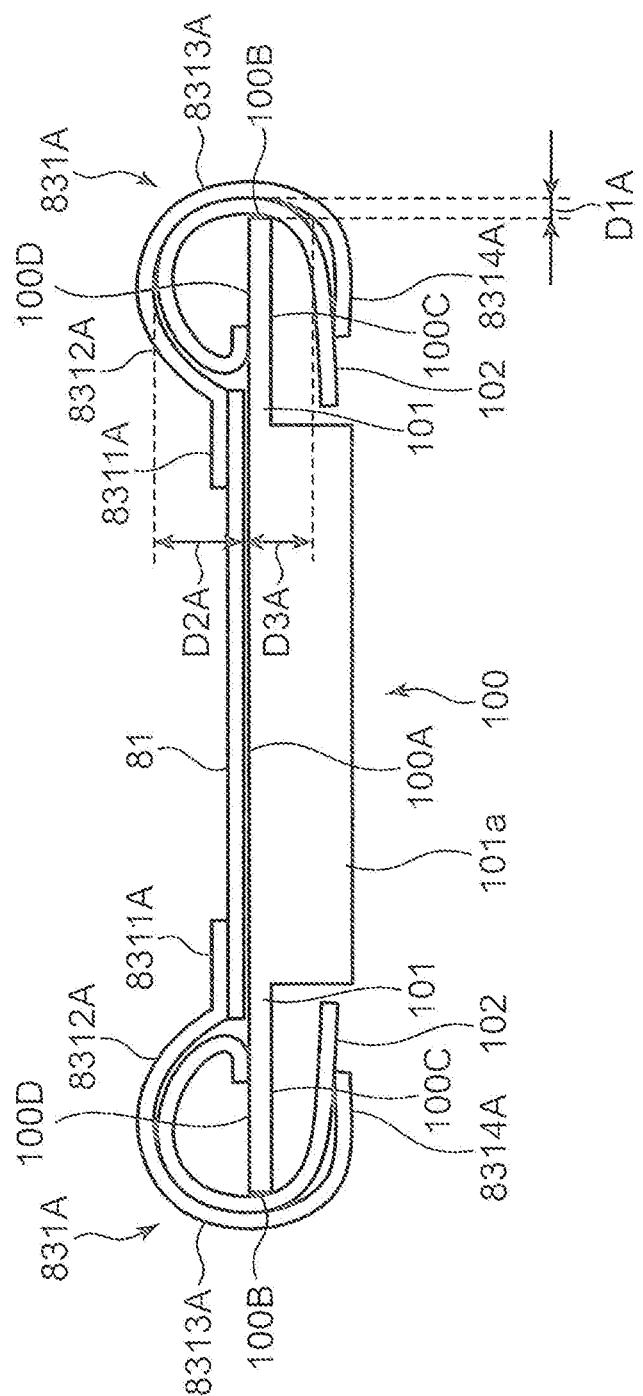
FIG. 16 is a view for describing a restraining state of a component storing tape by a restraining member according to a first modification as viewed in a tape ejection direction.
Figure 17:
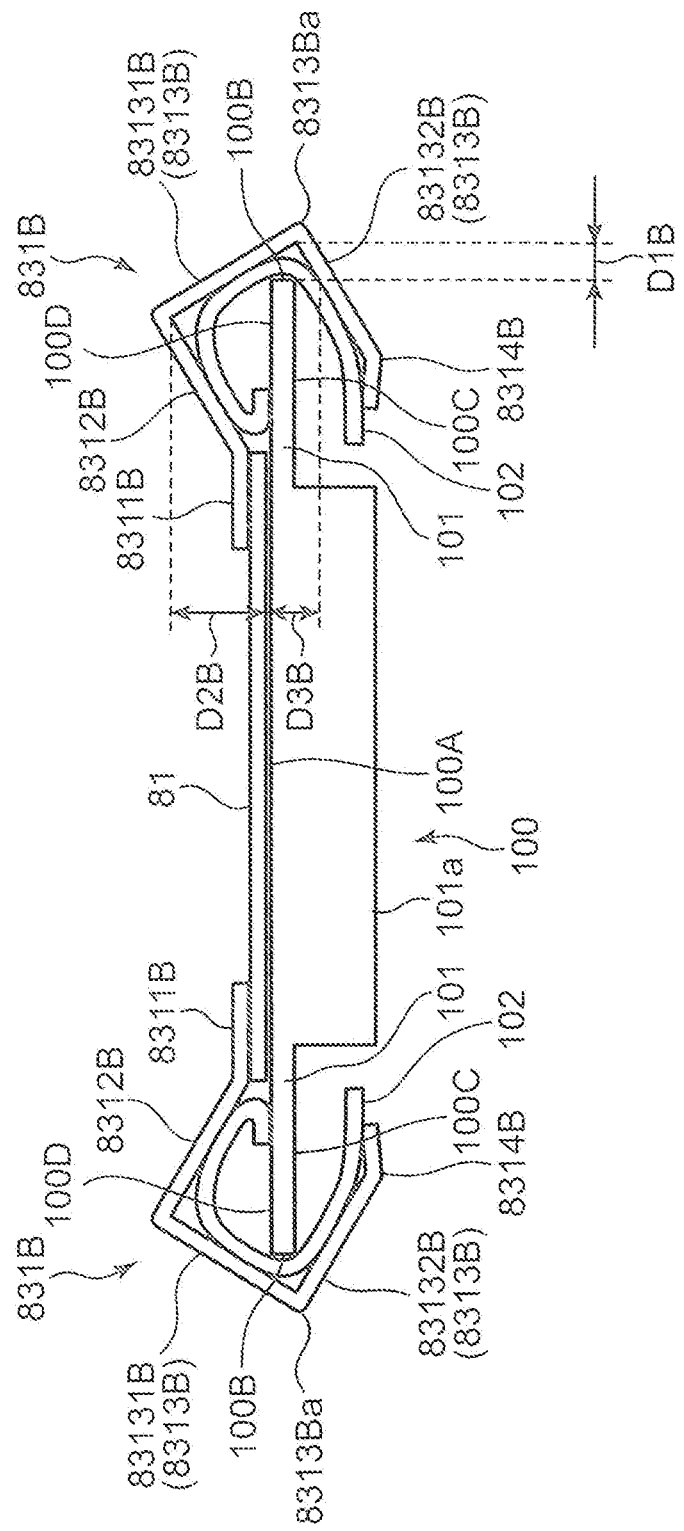
FIG. 17 is a view for describing a restraining state of a component storing tape by a restraining member according to a second modification as viewed in a tape ejection direction.
Figure 18:
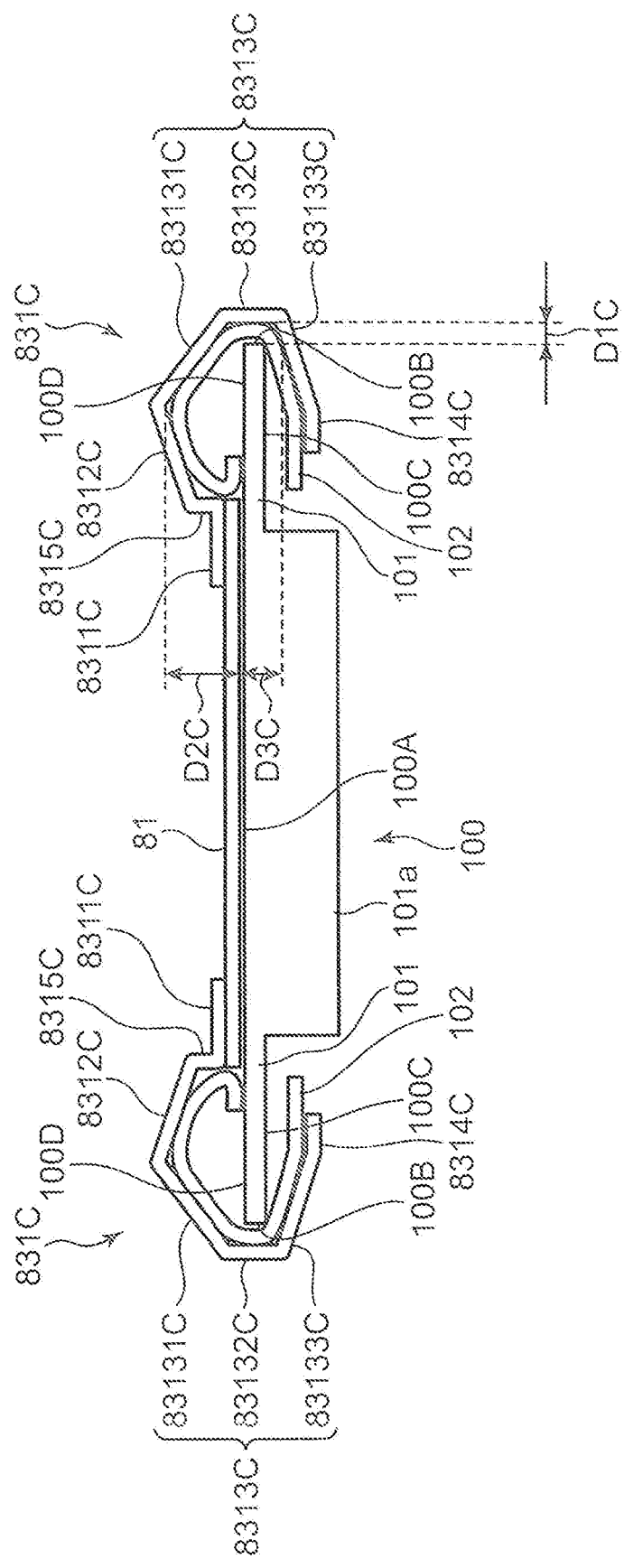
FIG. 18 is a view for describing a restraining state of a component storing tape by a restraining member according to a third modification as viewed in a tape ejection direction.

The configuration of the restraining member 831 which forms a part of the pair of restraining portions 83 is not limited to the configuration exemplified in FIG. 13 to FIG. 15, and the restraining member 831 may be formed of restraining members according to modifications shown in FIG. 16 to FIG. 18. FIG. 16 is a view for describing a restraining state of the component storing tape 100 by restraining members 831A according to a first modification as viewed in the tape ejection direction H2. FIG. 17 is a view for describing a restraining state of the component storing tape 100 by restraining members 831B according to a second modification as viewed in the tape ejection direction H2. FIG. 18 is a view for describing a restraining state of the component storing tape 100 by restraining members 831C according to a third modification as viewed in the tape ejection direction H2.

First, the restraining member 831A shown in FIG. 16 is formed in a bent shape as a whole. Such a bent shape is similar to a shape of the cover tape 102 in a state where the cover tape 102 is folded so as to wrap around both end portions of the carrier tape 101 in the component storing tape 100 introduced by the tape introduction guide portion 82. Each restraining member 831A includes a connection portion 8311A, an upper surface end facing portion 8312A, a side surface facing portion 8313A, and a lower surface end facing portion 8314A in the same manner as the above-mentioned restraining member 831.

In the restraining member 831A, the connection portion 8311A is formed in a flat plate shape, and is a portion connected to an end portion of the guide body 81 in the tape width direction H3. The upper surface end facing portion 8312A is formed in a curved shape, and faces, from above of the cover tape 102 which is developed by pushing, an end portion region portion 100D in the tape width direction H3 of the upper surface portion of the component storing tape 100 which is ejected in the tape ejection direction H2 in a state where the upper surface portion 100A is guided by the guide body 81. The upper surface end facing portions 8312A are away from the developed cover tape 102 outward from the inside in the tape width direction H3 as viewed in the tape ejection direction H2. In an example shown in FIG. 16, the upper surface end facing portion 8312A is bent so as to be away from the developed cover tape 102 outward from the inside in tape width direction H3.

In the restraining member 831A, the side surface facing portion 8313A is formed in a curved shape, and faces a side end surface portion 100B on an end portion in the tape width direction H3 of the component storing tape 100 which is ejected in the tape ejection direction H2 in a state where the upper surface portion 100A of the component storing tape 100 is guided by the guide body 81. In the example shown in FIG. 16, the side surface facing portion 8313A has a curved shape protruding outward in the tape width direction H3.

In the restraining member 831A, the lower surface end facing portion 8314A is formed in a curved shape, and faces an end portion region portion 100C in the tape width direction H3 of the lower surface portion of the component storing tape 100 which is ejected in the tape ejection direction H2 in a state where the upper surface portion 100A of the component storing tape 100 is guided by the guide body 81.

In the restraining member 831A exemplified in FIG. 16, the side surface facing portion 8313A restrains the displacement in the tape width direction H3 of the component storing tape 100 which is ejected in a state where the upper surface portion 100A is guided by the guide body 81. The lower surface end facing portion 8314A restricts the displacement that the cover tape 102 in a folded state intends to rise up and also straightens a curled state of the component storing tape 100. Further, the upper surface end facing portions 8312A restrict the upward displacement of the cover tape 102 in a developed state so as to allow a certain degree of rising of the cover tape 102 while restricting the displacement of the cover tape 102 toward the inside in the tape width direction H3.

Here, an inter distance D1A between a most side end of the side surface facing portion 8313A of the restraining member 831A and the side end surface portion 100B of the component storing tape 100 is set shorter than the inter distance D1 (see FIG. 15) in the above-mentioned restraining member 831. Accordingly, the displacement in the tape width direction H3 of the component storing tape 100 which is ejected in a state where the upper surface portion 100A of the component storing tape 100 is guided by the guide body 81 can be restrained with more certainty.

An inter distance D2A between an uppermost end of the upper surface end facing portion 8312A of the restraining member 831A and the guide body 81 is set substantially equal to the inter distance D2 (see FIG. 15) in the above-mentioned restraining member 831. Further, an inter distance D3A between a position of the restraining member 831A perpendicularly below the side end surface portion 100B of the component storing tape 100 and the guide body 81 is set larger than the inter distance D3 (see FIG. 15) in the above-mentioned restraining member 831. Here, the inter distance D3A of the restraining member 831A is set to a value capable of restricting the displacement of the component storing tape 100 in a direction perpendicular to the tape ejection direction H2 and the tape width direction H3.

Next, each restraining member 831B shown in FIG. 17 includes a connection portion 8311B, an upper surface end facing portion 8312B, a side surface facing portion 8313B, and a lower surface end facing portion 8314B in the same manner as the above-mentioned restraining member 831.

In the restraining member 831B, the connection portion 8311B is formed in a flat plate shape, and is a portion connected to an end portion of the guide body 81 in the tape width direction H3. The upper surface end facing portion 8312B is formed in a flat plate shape, and faces, from above of the cover tape 102 which is developed by pushing, an end portion region portion 100D in the tape width direction H3 of the upper surface portion of the component storing tape 100 which is ejected in the tape ejection direction H2 in a state where the upper surface portion 100A of the component storing tape 100 is guided by the guide body 81. The upper surface end facing portions 8312B are away from the developed cover tape 102 outward from the inside in the tape width direction H3 as viewed in the tape ejection direction H2. In an example shown in FIG. 17, the upper surface end facing portion 8312B is inclined frontward and upward so as to be away from the developed cover tape 102 outward from the inside in the tape width direction H3.

In the restraining member 831B, the side surface facing portion 8313B is formed in a flat plate shape, and faces a side end surface portion 100B on an end portion in the tape width direction H3 of the component storing tape 100 which is ejected in the tape ejection direction H2 in a state where the upper surface portion 100A of the component storing tape 100 is guided by the guide body 81. In an example shown in FIG. 17, the side surface facing portion 8313B has a structure where two plate-like members 83131B, 83132B are connected to each other. In the side surface facing portion 8313B, a corner portion 8313Ba where two plate-like members 83131B, 83132B are connected to each other protrudes outward in the tape width direction H3.

In the restraining member 831B, the lower surface end facing portion 8314B is formed in a flat plate shape, and faces an end portion region portion 100C in the tape width direction H3 of the lower surface portion of the component storing tape 100 which is ejected in the tape ejection direction H2 in a state where the upper surface portion 100A of the component storing tape 100 is guided by the guide body 81.

In the restraining member 831B exemplified in FIG. 17, the side surface facing portion 8313B restrains the displacement in the tape width direction H3 of the component storing tape 100 which is ejected in a state where the upper surface portion 100A of the component storing tape 100 is guided by the guide body 81. Here, an inter distance D1B between a corner portion 8313Ba of the side surface facing portion 8313B of the restraining member 831B and the side end surface portion 100B of the component storing tape 100 is set shorter than the inter distance D1 (see FIG. 15) in the above-mentioned restraining member 831. Accordingly, the displacement in the tape width direction H3 of the component storing tape 100 which is ejected in a state where the upper surface portion 100A is guided by the guide body 81 can be restrained with more certainty.

In the restraining member 831B, the lower surface end facing portion 8314B restricts the displacement that the cover tape 102 in a folded state intends to rise up and also straightens a curled state of the component storing tape 100. Further, in the restraining members 831B, the upper surface end facing portions 8312B restrict the upward displacement of the cover tape 102 in a developed state so as to allow a certain degree of rising of the cover tape 102 while restricting the displacement of the cover tape 102 toward the inside in the tape width direction H3.

Here, an inter distance D2B between an uppermost end of the upper surface end facing portion 8312B of the restraining member 831B and the guide body 81 is set shorter than the inter distance D2 (see FIG. 15) in the above-mentioned restraining member 831 and the inter distance D2A (see FIG. 16) in the above-mentioned restraining member 831A. Further, an inter distance D3B between a position of the restraining member 831B perpendicularly below the side end surface portion 100B of the component storing tape 100 (an approximately center position of the plate-like member 83132B in the example shown in FIG. 17) and the guide body 81 is set shorter than the inter distance D3 (see FIG. 15) in the above-mentioned restraining member 831 and the inter distance D3A (see FIG. 16) in the above-mentioned restraining member 831A. With such a configuration, the displacement of the component storing tape 100 in a direction perpendicular to the tape ejection direction H2 and the tape width direction H3 can be restricted with more certainty. Accordingly, a displacement amount of a distal end of the succeeding component storing tape 100 with respect to the rear end of the preceding component storing tape 100 in a direction perpendicular to the tape ejection direction H2 and the tape width direction H3 becomes small thus preventing overlapping of the preceding and succeeding component storing tapes 100.

However, when the displacement of the component storing tape 100 in a direction perpendicular to the tape ejection direction H2 and the tape width direction H3 is restricted excessively, due to a force that the cover tape 102 intends to rise up, an ejection resistance at the time of ejecting the component storing tape 100 is increased. Accordingly, it is desirable that the restraining member 831B exemplified in FIG. 17 be used at the time of ejecting the component storing tape 100 having the cover tape 102 which has a low rigidity so that a force that the cover tape 102 intends to rise up is small.

Next, each restraining member 831C shown in FIG. 18 includes a connection portion 8311C, an upper surface end facing portion 8312C, a side surface facing portion 8313C, and a lower surface end facing portion 8314C in the same manner as the above-mentioned restraining member 831. The restraining member 831C further includes a raised portion 8315C which is disposed between the connection portion 8311C and the upper surface end facing portion 8312C.

In the restraining member 831C, the connection portion 8311C is formed in a flat plate shape, and is a portion connected to an end portion of the guide body 81 in the tape width direction H3. The upper surface end facing portion 8312C is formed in a flat plate shape, and faces, from above of the cover tape 102 which is developed by pushing, an end portion region portion 100D in the tape width direction H3 of the upper surface portion of the component storing tape 100 which is ejected in the tape ejection direction H2 in a state where the upper surface portion 100A of the component storing tape 100 is guided by the guide body 81. The upper surface end facing portions 8312C are away from the developed cover tape 102 outward from the inside in the tape width direction H3 as viewed in the tape ejection direction H2. In an example shown in FIG. 18, the upper surface end facing portion 8312C is inclined frontward and upward so as to be away from the developed cover tape 102 outward from the inside in the tape width direction H3.

In the restraining member 831C, the raised portion 8315C is a portion which connects the connection portion 8311C and the upper surface end facing portion 8312C to each other, and is configured to rise substantially perpendicular to the guide body 81.

In the restraining member 831C, the side surface facing portion 8313C is formed in a flat plate shape, and faces a side end surface portion 100B on an end portion in the tape width direction H3 of the component storing tape 100 which is ejected in the tape ejection direction H2 in a state where the upper surface portion 100A of the component storing tape 100 is guided by the guide body 81. In an example shown in FIG. 18, the side surface facing portion 8313C has a structure where three plate-like members 83131C, 83132C, and 83133C are connected to each other. The plate-like member 83131C is connected to the upper surface end facing portion 8312C, and the plate-like member 83133C is connected to the lower surface end facing portion 8314C. The plate-like member 83132C connects the plate-like member 83131C and the plate-like member 83133C to each other. In the side surface facing portion 8313C, the plate-like member 83132C is disposed outside in the tape width direction H3.

In the restraining member 831C, the lower surface end facing portion 8314C is formed in a flat plate shape, and faces an end portion region portion 100C in the tape width direction H3 of the lower surface portion of the component storing tape 100 which is ejected in the tape ejection direction H2 in a state where the upper surface portion 100A is guided by the guide body 81.

In the restraining member 831C exemplified in FIG. 18, the side surface facing portion 8313C restrains the displacement in the tape width direction H3 of the component storing tape 100 which is ejected in a state where the upper surface portion 100A of the component storing tape 100 is guided by the guide body 81. Here, an inter distance D1C between the plate-like member 83132C of the side surface facing portion 8313C of the restraining member 831C and the side end surface portion 100B of the component storing tape 100 is set shorter than the inter distance D1 (see FIG. 15) in the above-mentioned restraining member 831 and the inter distance D1B (see FIG. 17) in the above-mentioned restraining member 831B. Accordingly, the displacement in the tape width direction H3 of the component storing tape 100 which is ejected in a state where the upper surface portion 100A of the component storing tape 100 is guided by the guide body 81 can be restrained with more certainty.

In the restraining member 831C, the lower surface end facing portion 8314C restricts the displacement that the cover tape 102 in a folded state intends to rise up and also straightens a curled state of the component storing tape 100. Further, in the restraining members 831C, the upper surface end facing portion 8312C and the raised portion 8315C restrict the upward displacement of the cover tape 102 in a developed state so as to allow a certain degree of rising of the cover tape 102 while restricting the displacement of the cover tape 102 toward the inside in the tape width direction H3.

Here, an inter distance D2C between an uppermost end of the upper surface end facing portion 8312C of the restraining member 831C and the guide body 81 is set shorter than the inter distance D2 (see FIG. 15) in the above-mentioned restraining member 831, the inter distance D2A (see FIG. 16) in the above-mentioned restraining member 831A, and the inter distance D2B (see FIG. 17) in the above-mentioned restraining member 831B. Further, an inter distance D3C between a position of the restraining member 831C perpendicularly below the side end surface portion 100B of the component storing tape 100 (an approximately center position of the plate-like member 83133C in the example shown in FIG. 18) and the guide body 81 is set smaller than the inter distance D3 (see FIG. 15) in the above-mentioned restraining member 831, the inter distance D3A (see FIG. 16) in the above-mentioned restraining member 831A, and the inter distance D3B (see FIG. 17) in the above-mentioned restraining member 831B. With such a configuration, the displacement of the component storing tape 100 in a direction perpendicular to the tape ejection direction H2 and the tape width direction H3 can be restricted with more certainty. Accordingly, a displacement amount of a distal end of the succeeding component storing tape 100 with respect to the rear end of the preceding component storing tape 100 in a direction perpendicular to the tape ejection direction H2 and the tape width direction H3 becomes small thus preventing overlapping of the preceding and succeeding component storing tapes 100.

However, when the displacement of the component storing tape 100 in a direction perpendicular to the tape ejection direction H2 and the tape width direction H3 is restricted excessively, due to a force that the cover tape 102 intends to rise up, an ejection resistance at the time of ejecting the component storing tape 100 is increased. Accordingly, in the same manner as the above-mentioned restraining member 831B, it is desirable that the restraining member 831C exemplified in FIG. 18 be used at the time of ejecting the component storing tape 100 having the cover tape 102 which has a low rigidity so that a force that the cover tape 102 intends to rise up is small.

Figure 19:
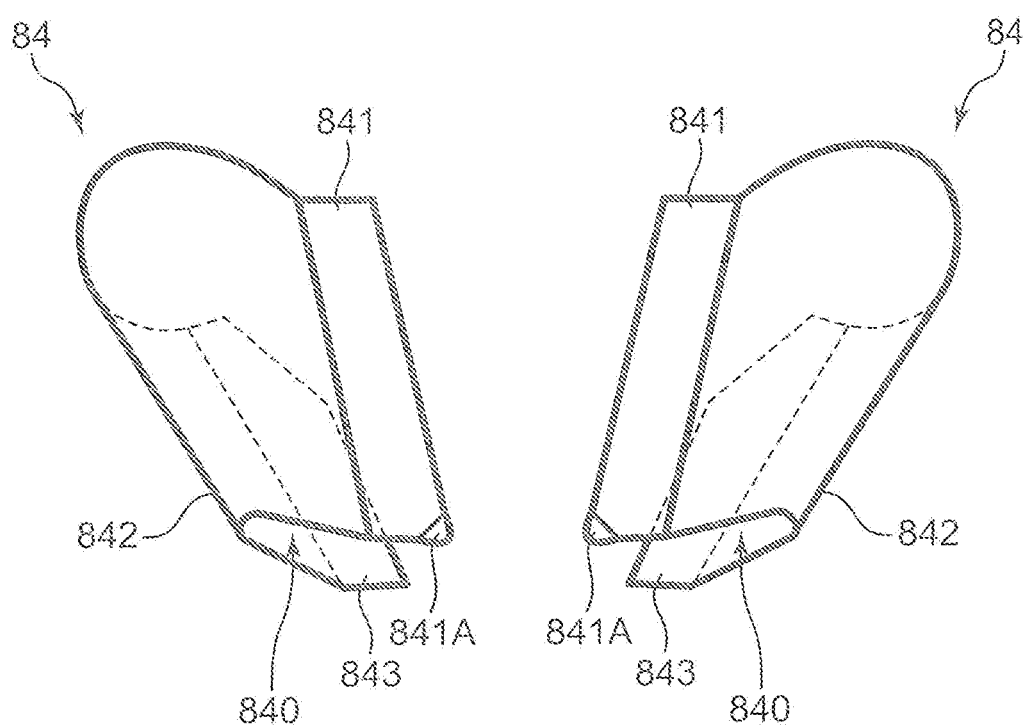
FIG. 19 is a perspective view showing the configuration of a pair of terminal tape guide portions of the tape ejection guide structure.
Figure 20:
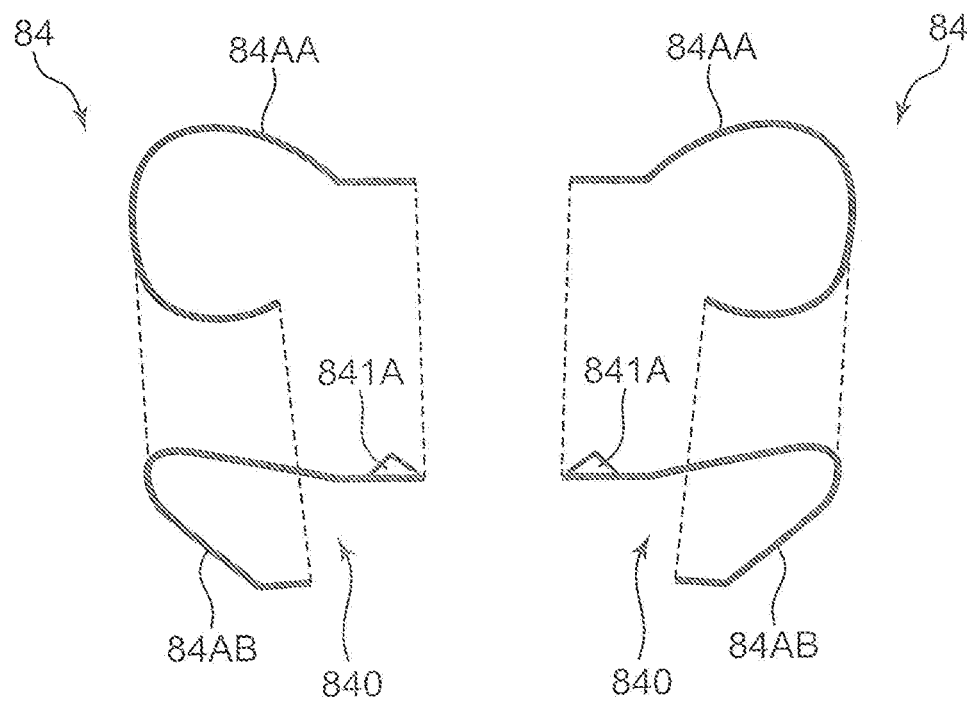
FIG. 20 is a view for describing a shape of the pair of terminal tape guide portions.
Figure 21:
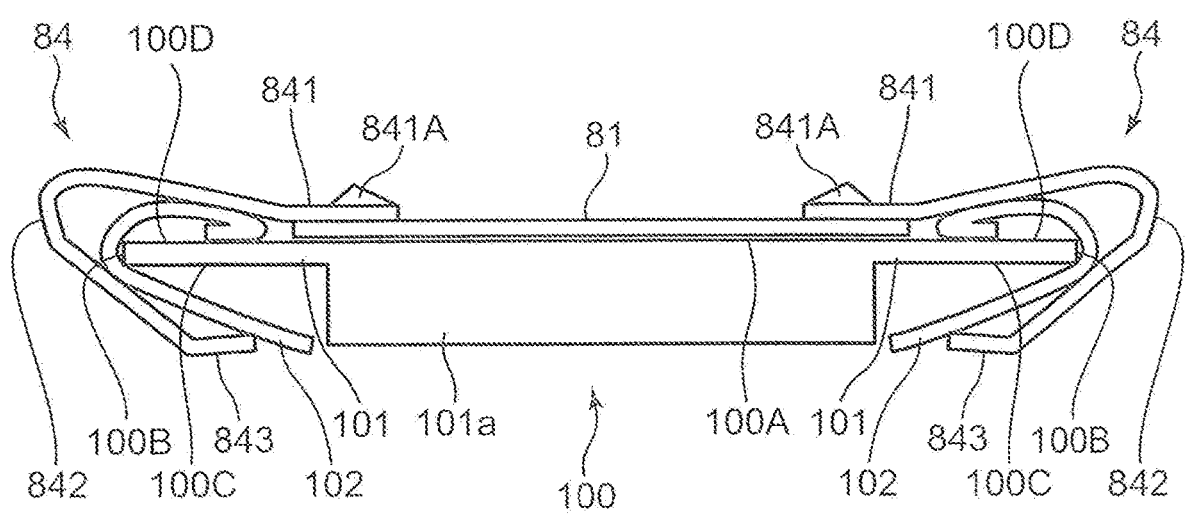
FIG. 21 is a view for describing a restraining state of a component storing tape by the pair of terminal tape guide portions as viewed in a tape ejection direction.

Therefore, as shown in FIG. 11, the tape ejection guide structure 8 of the present embodiment includes a pair of terminal tape guide portions 84. The pair of terminal tape guide portions 84 is described also with reference to FIG. 19 to FIG. 21 in addition to FIG. 11. FIG. 19 is a perspective view showing the configuration of the pair of terminal tape guide portions 84 of the tape ejection guide structure 8. FIG. 20 is a view for describing a shape of the pair of terminal tape guide portions 84. FIG. 21 is a view for describing a restraining state of the component storing tape 100 by the pair of terminal tape guide portions 84 as viewed in the tape ejection direction H2.

The pair of terminal tape guide portions 84 is connected to both end portions in the tape width direction H3 of a downstream end of the guide body 81 in the tape ejection direction H2 respectively. The pair of terminal tape guide portions 84 respectively guides both end portions in the tape width direction H3 of the component storing tape 100 which is ejected in a state where the upper surface portion 100A is guided by the guide body 81. Each of the pair of terminal tape guide portions 84 includes a connection portion 841, an upper surface restraining portion 842, and a lower surface restraining portion 843.

In each of the pair of terminal tape guide portions 84, the connection portion 841 is formed in a flat plate shape, and is a portion connected to an end portion of the guide body 81 in the tape width direction H3. A region portion of the connection portion 841 on an upstream side in the tape ejection direction H2 is connected to an end portion of the guide body 81 in the tape width direction H3. The upper surface restraining portion 842 faces an end portion region portion 100D of an upper surface portion and, at the same time, the side end surface portion 100B, on an end portion in the tape width direction H3 of the component storing tape 100 which is ejected in the tape ejection direction H2 in a state where the upper surface portion 100A is guided by the guide body 81. Further, the lower surface restraining portion 843 faces an end portion region portion 100C in the tape width direction H3 of the lower surface portion of the component storing tape 100 which is ejected in the tape ejection direction H2 in a state where the upper surface portion 100A is guided by the guide body 81.

In each of the pair of terminal tape guide portions 84, the upper surface restraining portion 842 and the lower surface restraining portion 843 are integrally connected to each other so as to wrap around an end portion of the component storing tape 100 in the tape width direction H3. The pair of terminal tape guide portions 84 respectively defines terminal guide paths 840 (see FIG. 19) which guide the component storing tape 100 so as to wrap around both end portions of the component storing tape 100 in the tape width direction H3 at the time of ejecting the component storing tape 100. Each of the pair of terminal tape guide portions 84 is formed in a tapered shape where the terminal guide path 840 is tapered from an upstream end toward a downstream end thereof in the tape ejection direction H2. Specifically, each of the pair of terminal tape guide portions 84 is formed in a tapered shape such that a cross-sectional area of the terminal guide path 840 in cross section perpendicular to the tape ejection direction H2 is gradually decreased from an upstream-side end edge 84AA toward a downstream-side end edge 84AB in the tape ejection direction H2 (see FIG. 20).

The component storing tape 100 ejected in a state where the upper surface portion 100A is guided by the guide body 81 is led out from the tape ejection guide structure 8 while both end portions of the component storing tape 100 in the tape width direction H3 are guided by the pair of terminal tape guide portions 84. The component storing tape 100 led out from the tape ejection guide structure 8 falls down in the cylindrical body 17 toward the tape cutting device 18. In this specification, it is difficult for the tape cutting device 18 to cut a thin cover tape 102. Accordingly, when the cover tape 102 is developed outward with respect to the carrier tape 101 and a portion exists where only the cover tape 102 is to be cut, cutting performance of the component storing tape 100 by the tape cutting device 18 is lowered.

In view of the above, the pair of terminal tape guide portions 84 is each formed in a tapered shape. With such a configuration, immediately before the component storing tape 100 is led out from the tape ejection guide structure 8, it is possible to bring the cover tape 102 into an outwardly folded state such that the cover tape 102 wraps around both end portions of the carrier tape 101 in the tape width direction H3 against a force that the cover tape 102 intends to rise up. As a result, in the component storing tape 100 which is led out from the tape ejection guide structure 8 through the pair of terminal tape guide portions 84, the cover tape 102 is brought into an outwardly folded state such that the cover tape 102 wraps around the both end portions of the carrier tape 101 in the tape width direction H3. With such a configuration, when the component storing tape 100 led out from the tape ejection guide structure 8 is cut into a strip shape using the tape cutting device 18 or the like, the cover tape 102 can be cut together with the carrier tape 101 and hence, the cutting performance of the component storing tape 100 can be enhanced.

Further, it is desirable that the pair of terminal tape guide portions 84 be made of metal so as not to generate static electricity. The pair of terminal tape guide portions 84 may be configured such that a layer having conductivity is formed on a surface of a base material made of plastic or the like.

In a state where the tape ejection guide structure 8 is disposed in the cylindrical body 17, the pair of terminal tape guide portions 84 is brought into contact with the extension region portion 171B which linearly extends a vertically downward in the first wall portion 171 of the cylindrical body 17. In the terminal guide paths 840 defined by the pair of terminal tape guide portions 84, a cross-sectional area of the downstream-side end edge 84AB disposed on an ejection side of the component storing tape 100 in cross section perpendicular to the tape ejection direction H2 is smaller than a cross-sectional area of the downstream-side end edge 831AB of the guide path 8310 defined by the restraining member 831. The tape ejection direction H2 of the component storing tape 100 when the component storing tape 100 passes the pair of terminal tape guide portions 84 extends linearly along the extension region portion 171B of the cylindrical body 17 and hence, deformation and an ejection resistance of the cover tape 102 attributed to bending of the component storing tape 100 are small. Accordingly, in the terminal guide paths 840 defined by the pair of terminal tape guide portions 84, although the cross-sectional area of the downstream-side end edge 84AB is set small, lead-out performance of the component storing tape 100 through the pair of terminal tape guide portions 84 can be maintained favorably.

Even in a case where a distance between the downstream-side end edges 84AB of the pair of terminal tape guide portions 84 and a tape cutting position of the tape cutting device 18 is large at some extent, the cutting performance of the component storing tape 100 led out through the pair of terminal tape guide portions 84 by the tape cutting device 18 is favorable. A distance between the downstream-side end edges 84AB of the pair of terminal tape guide portions 84 and the tape cutting device 18 is set to a value capable of preventing the pair of terminal tape guide portions 84 from interfering with the tape cutting device 18 while maintaining a folded state of the cover tape 102 and maintaining a state where curling of the component storing tape 100 is straightened. In setting the distance, swinging of the tape ejection guide structure 8 in the cylindrical body 17, a sagging amount of the tape ejection guide structure 8 in a vertically downward direction attributed to a weight of the component storing tape 100, and the like are taken into account.

A distance between the downstream-side end edges 84AB of the pair of terminal tape guide portions 84 and the tape cutting device 18 may be set such that a curling displacement amount in a tape thickness direction of the component storing tape 100 at a point of time that the component storing tape 100 is curled at maximum between the downstream-side end edges 84AB and the tape cutting device 18 becomes smaller than an inter distance between the first wall portion 171 and the second wall portion 172 of the cylindrical body 17.

Further, a distance between the downstream-side end edges 84AB of the pair of terminal tape guide portions 84 and the tape cutting device 18 may be set smaller than a distance between the centers of the component storing portions 101a disposed adjacently to each other in the component storing tape 100 in a state where the tape ejection guide structure 8 is sagged in a vertically downward direction at a maximum due to a weight of the component storing tape 100. In this case, there is no possibility that the component storing tape 100 is curled between the downstream-side end edges 84AB of the pair of terminal tape guide portions 84 and the tape cutting device 18.

As shown in FIG. 19 to FIG. 21, a connection portion 841 of each of the pair of terminal tape guide portions 84 has a distal end bent portion 841A. The distal end bent portion 841A is formed by bending a distal end portion of the connection portion 841 on a side opposite to a region portion connected to the guide body 81 and on a downstream side in the tape ejection direction H2 outward. In each of the pair of terminal tape guide portions 84, the connection portion 841 is formed to have the distal end bent portion 841A and hence, when the component storing tape 100 is led out from the tape ejection guide structure 8, it is possible to suppress as much as possible the occurrence of a phenomenon that the component storing tape 100 is caught by the pair of terminal tape guide portions 84.

Further, the component supply device 1 includes the previously-mentioned tape ejection guide structure 8 which can eject with certainty the component storing tape 100 ejected from the tape ejection port 23 of the component supply unit 1A. Accordingly, it is possible to suppress as much as possible the occurrence of an interruption during an operation of supplying the components P by the component supply unit 1A attributed to an ejection failure of the component storing tape 100. As a result, it is possible to obtain the component supply device 1 which exhibits excellent efficiency in supplying components P.

Second Embodiment

Figure 22A:
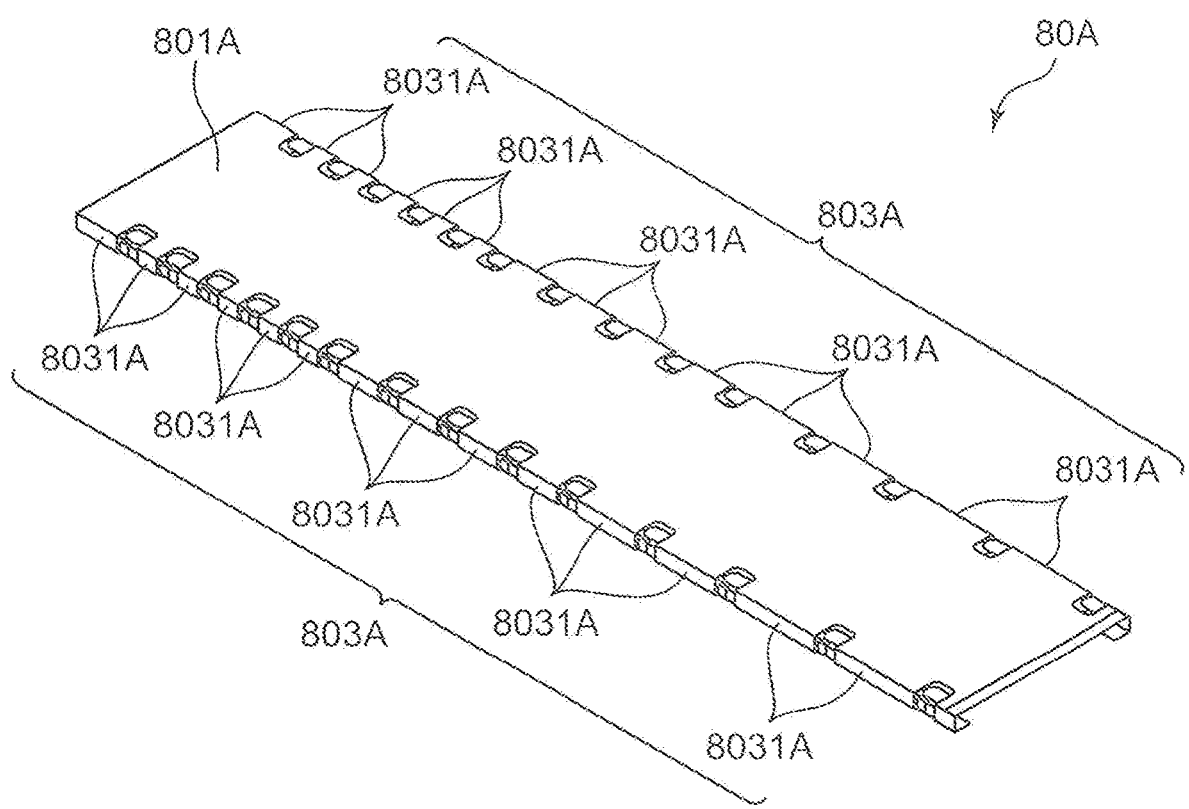
FIG. 22A is a perspective view showing the configuration of a tape ejection guide structure according to a second embodiment of the present disclosure.
Figure 22B:
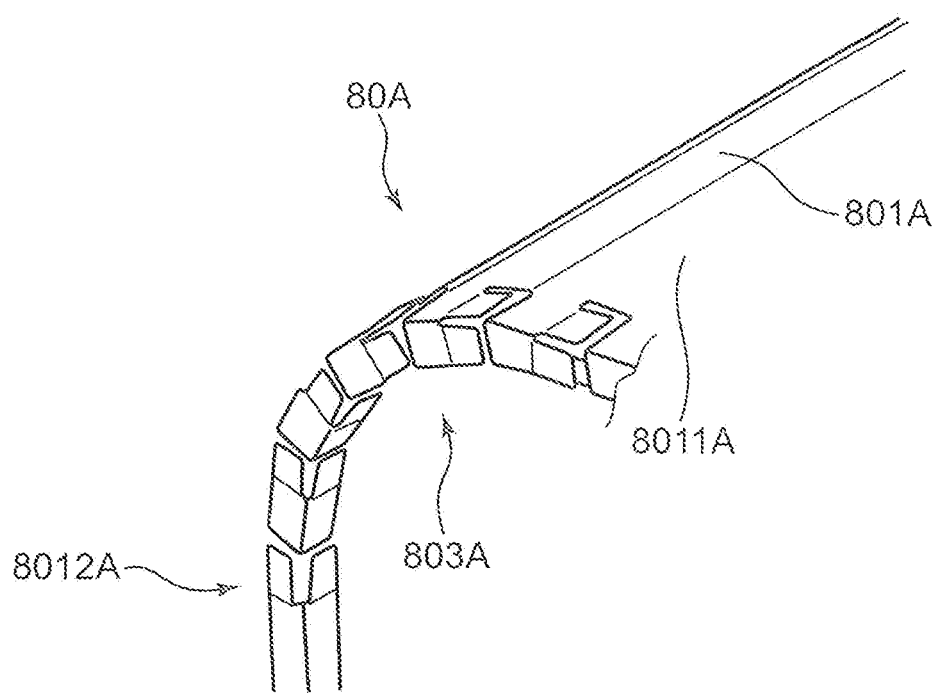
FIG. 22B is a perspective view showing the configuration of the tape ejection guide structure according to the second embodiment.

FIG. 22A to FIG. 22C are perspective views showing the configuration of a tape ejection guide structure 80A according to a second embodiment of the present disclosure. The tape ejection guide structure 80A is a structure which guides the ejection of the component storing tape 100 ejected from the tape ejection port 23 of the component supply unit 1A. The tape ejection guide structure 80A includes a guide body 801A and a pair of restraining portions 803A in the same manner as the above-mentioned tape ejection guide structure 8.

In the tape ejection guide structure 80A, the guide body 801A is a portion for guiding an upper surface portion of the component storing tape 100 ejected from the tape ejection port 23. The guide body 801A is formed in a rectangular plate shape.

In the tape ejection guide structure 80A, the pair of restraining portions 803A is respectively connected to both end portions of the guide body 801A in the tape width direction H3. The pair of restraining portions 803A restrains displacement in the tape width direction H3 of the component storing tape 100 which is ejected in a state where the upper surface portion of the component storing tape 100 is guided by the guide body 801A.

In the tape ejection guide structure 80A of the present embodiment, the guide body 801A has flexibility. Each of the pair of restraining portions 803A is formed of a plurality of restraining members 8031A which are arranged at a predetermined interval in the tape ejection direction H2. With such a configuration, the tape ejection guide structure 80A can be formed in a shape which conforms to the first wall portion 171 of the cylindrical body 17.

In such a configuration, in the tape ejection guide structure 80A which is brought into contact with an inner surface of the first wall portion 171 of the cylindrical body 17, as shown in FIG. 22B, the guide body 801A having flexibility is configured to include a bent portion 8011A and an extension portion 8012A. In the guide body 801A, the bent portion 8011A is a portion which extends vertically downward from the tape ejection port 23 and is bent in an upwardly protruding manner. In the guide body 801A, the extension portion 8012A is a portion which extends vertically downward from a downstream end of the bent portion 8011A in the tape ejection direction H2.

Lengths of restraining members 8031A which form each of the pair of restraining portions 803A along the tape ejection direction H2 are set to be gradually decreased in a direction from a downstream side toward an upstream side in the tape ejection direction H2. That is, with respect to lengths of the restraining members 8031A in the tape ejection direction H2, lengths of the restraining members 8031A corresponding to the bent portion 8011A of the guide body 801A are set shorter than lengths of the restraining member 8031A corresponding to the extension portion 8012A. With such a configuration, the tape ejection guide structure 80A having a bent shape along the first wall portion 171 of the cylindrical body 17 can be realized.

Each of the restraining members 8031A which form the pair of restraining portions 803A includes an upper surface end facing portion 80311A, a side surface facing portion 80312A, and a lower surface end facing portion 80313A.

The upper surface end facing portion 80311A is formed so as to extend outward continuously from an end edge of the guide body 801A in the tape width direction H3. The upper surface end facing portion 80311A faces, from above of the cover tape 102 which is developed by pushing, an end portion region portion 100D in the tape width direction H3 of the upper surface portion of the component storing tape 100 which is ejected in the tape ejection direction H2 in a state where the upper surface portion 100A of the component storing tape 100 is guided by the guide body 801A. In the restraining member 8031A, the upper surface end facing portion 80311A restricts the upward displacement of the cover tape 102 in a developed state while restricting the inward displacement of the cover tape 102 in the tape width direction H3.

The side surface facing portion 80312A is formed so as to extend downward continuously from an end edge of the upper surface end facing portion 80311A in the tape width direction H3. The side surface facing portion 80312A faces the side end surface portion 100B on an end portion in the tape width direction H3 of the component storing tape 100 which is ejected in the tape ejection direction H2 in a state where the upper surface portion 100A of the component storing tape 100 is guided by the guide body 801A. In the restraining member 8031A, the side surface facing portion 80312A restrains the displacement in the tape width direction H3 of the component storing tape 100 which is ejected in a state where the upper surface portion 100A is guided by the guide body 801A.

The lower surface end facing portion 80313A is formed so as to extend inward continuously from a lower end edge of the side surface facing portion 80312A. The lower surface end facing portion 80313A faces an end portion region portion 100C in the tape width direction H3 of the lower surface portion of the component storing tape 100 which is ejected in the tape ejection direction H2 in a state where the upper surface portion 100A is guided by the guide body 801A. In the restraining member 8031A, the lower surface end facing portion 80313A restricts the displacement that the cover tape 102 in a folded state intends to rise up and also straightens a curled state of the component storing tape 100.

As shown in FIG. 22C, the tape ejection guide structure 80A includes an upper surface protruding member 80311AA, a side surface protruding member 80312AA, and a lower surface protruding member 80313AA.

The upper surface protruding member 80311AA is a protruding member which is formed in a gap portion between the restraining members 8031A disposed adjacently to each other in a state where the upper surface protruding member 80311AA protrudes in an outwardly inclined manner from the upper surface end facing portion 80311A toward the gap portion. The side surface protruding member 80312AA is a protruding member which is formed in the gap portion between the restraining members 8031A disposed adjacently to each other in a state where the side surface protruding member 80312AA protrudes in an outwardly inclined manner from the side surface facing portion 80312A toward the gap portion. The lower surface protruding member 80313AA is a protruding member which is formed in the gap portion between the restraining members 8031A disposed adjacently to each other in a state where the lower surface protruding member 80313AA protrudes in an outwardly inclined manner from the lower surface end facing portion 80313A toward the gap portion.

The component storing tape 100 ejected from the tape ejection port 23 of the component supply unit 1A is ejected in the tape ejection direction H2 while the upper surface portion 100A of the component storing tape 100 is guided by the guide body 801A, and both end portions of the component storing tape 100 in the tape width direction H3 are guided by the pair of restraining portions 803A. In the above-mentioned configuration, the tape ejection guide structure 80A is configured to include the upper surface protruding member 80311AA, the side surface protruding member 80312AA, and the lower surface protruding member 80313AA. With such a configuration, it is possible to prevent both end portions of the component storing tape 100 in the tape width direction H3 from entering the gap portions between the respective restraining members 8031A of the pair of restraining portions 803A. Accordingly, the tape ejection guide structure 80A can eject with certainty the component storing tape 100 ejected from the tape ejection port 23 of the component supply unit 1A.

Third Embodiment

Figure 23A:
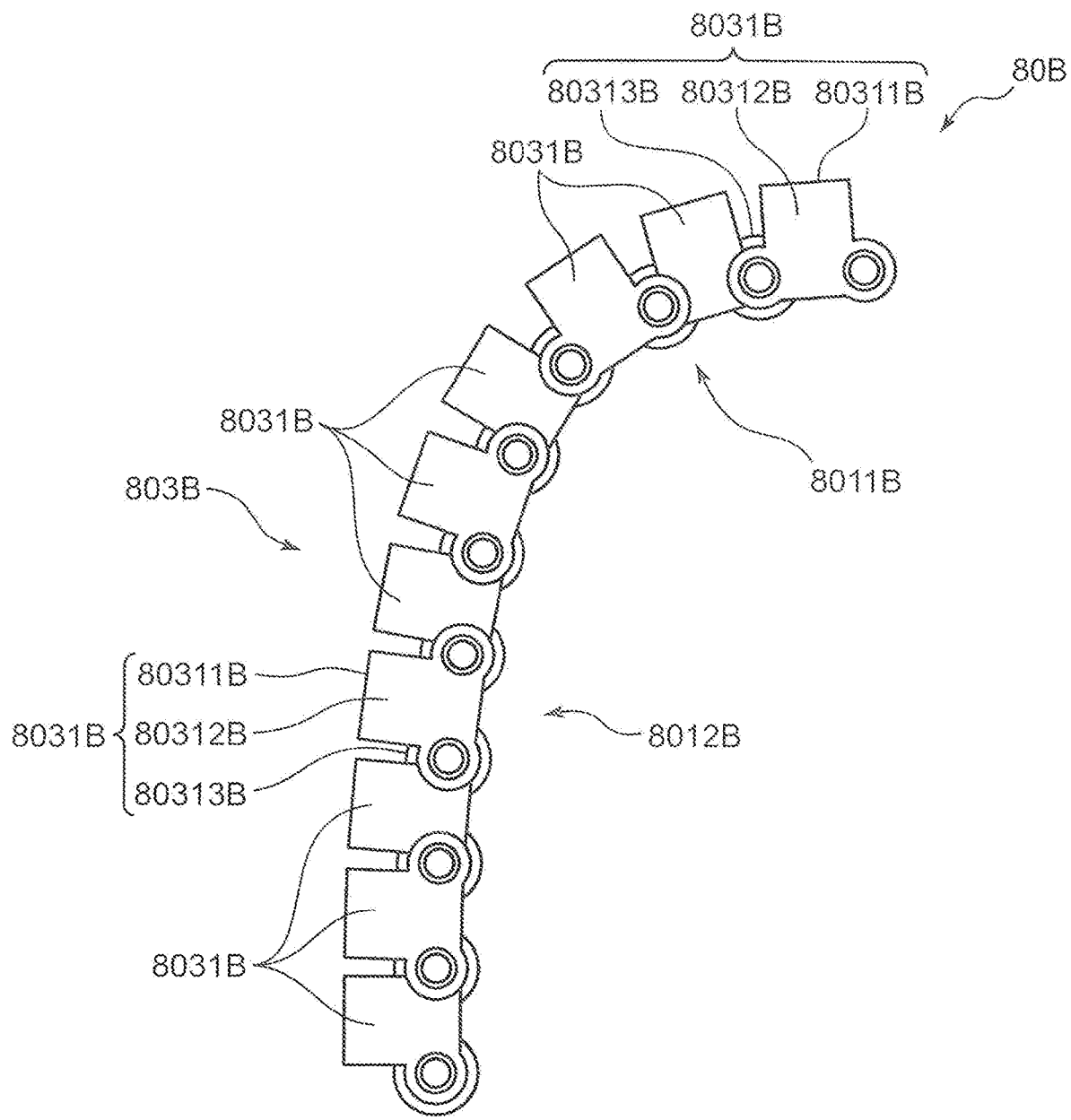
FIG. 23A is a view showing the configuration of a tape ejection guide structure according to a third embodiment of the present disclosure as viewed in a side view.
Figure 23B:
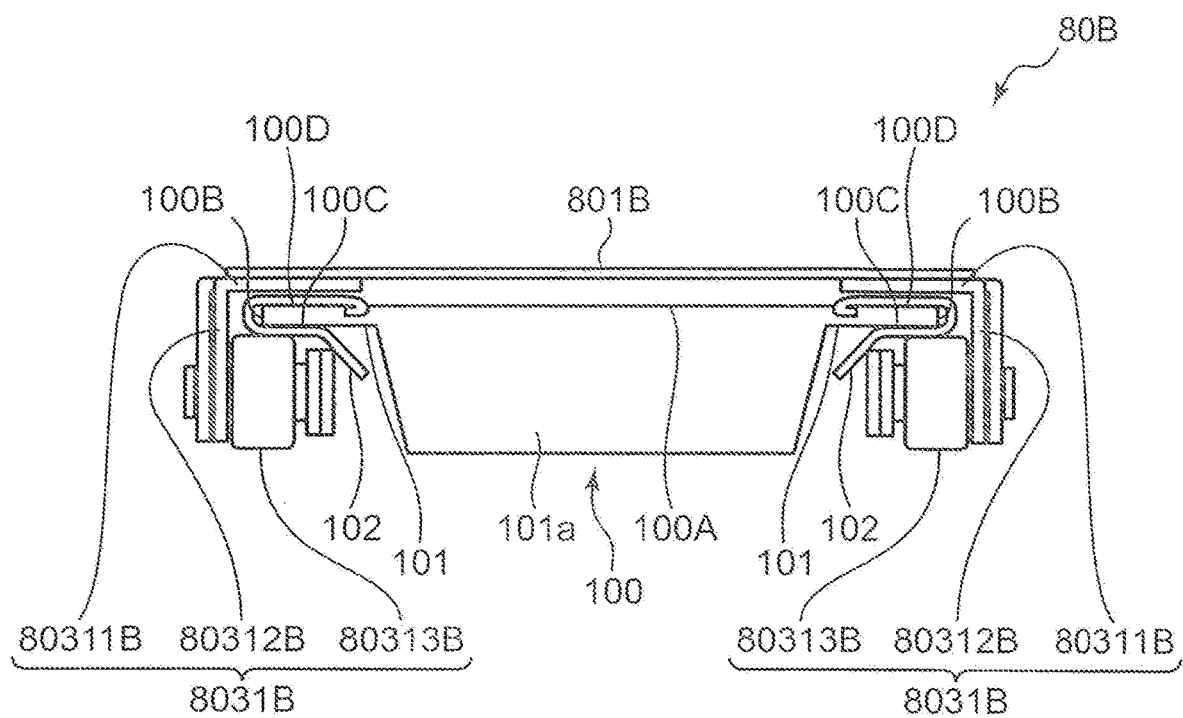
FIG. 23B is a view showing the configuration of the tape ejection guide structure according to the third embodiment as viewed in a tape ejection direction.

FIG. 23A and FIG. 23B are views showing the configuration of a tape ejection guide structure 80B according to a third embodiment of the present disclosure. FIG. 23A is a view showing the tape ejection guide structure 80B as viewed in a side view. FIG. 23B is a view showing the tape ejection guide structure 80B as viewed in the tape ejection direction H2. The tape ejection guide structure 80B is a structure which guides the ejection of the component storing tape 100 ejected from the tape ejection port 23 of the component supply unit 1A. The tape ejection guide structure 80B includes a guide body 801B and a pair of restraining portions 803B in the same manner as the above-mentioned tape ejection guide structure 8.

In the tape ejection guide structure 80B, the guide body 801B is a portion for guiding an upper surface portion of the component storing tape 100 ejected from the tape ejection port 23.

In the tape ejection guide structure 80B, the pair of restraining portions 803B are respectively connected to both end portions of the guide body 801B in the tape width direction H3. The pair of restraining portions 803B restrains the displacement in the tape width direction H3 of the component storing tape 100 which is ejected in a state where the upper surface portion of the component storing tape 100 is guided by the guide body 801B.

Each of the pair of restraining portions 803B is formed of a plurality of restraining members 8031B which are arranged at a predetermined interval in the tape ejection direction H2. The guide body 801B is configured such that a plurality of plate-like members each of which connects the restraining members 8031B which faces each other in the tape width direction H3 in the pair of restraining portions 803B are disposed along the tape ejection direction H2. With such a configuration, the tape ejection guide structure 80B can be formed in a shape conform the first wall portion 171 of the cylindrical body 17.

In such a configuration, in the tape ejection guide structure 80B which is brought into contact with the inner surface of the first wall portion 171 of the cylindrical body 17, as shown in FIG. 23A, the guide body 801B is configured to include a bent portion 8011B and an extension portion 8012B. In the guide body 801B, the bent portion 8011B is a portion which extends vertically downward from the tape ejection port 23 and is bent in an upwardly protruding manner. In the guide body 801B, the extension portion 8012B is a portion which extends vertically downward from a downstream end of the bent portion 8011B in the tape ejection direction H2.

Each of the restraining members 8031B which form the pair of restraining portions 803B includes an upper surface end facing portion 80311B, a side surface facing portion 80312B, and a lower surface end facing portion 80313B.

The upper surface end facing portion 80311B is formed so as to extend outward continuously from an end edge of the guide body 801B in the tape width direction H3. The upper surface end facing portion 80311B faces, from above of the cover tape 102 which is developed by pushing, an end portion region portion 100D in the tape width direction H3 of the upper surface portion of the component storing tape 100 which is ejected in the tape ejection direction H2 in a state where the upper surface portion 100A of the component storing tape 100 is guided by the guide body 801B. In the restraining member 8031B, the upper surface end facing portion 80311B restricts the upward displacement of the cover tape 102 in a developed state while restricting the inward displacement of the cover tape 102 in the tape width direction H3.

The side surface facing portion 80312B is formed so as to extend downward continuously from an end edge of the upper surface end facing portion 80311B in the tape width direction H3. The side surface facing portion 80312B faces the side end surface portion 100B on an end portion in the tape width direction H3 of the component storing tape 100 which is ejected in the tape ejection direction H2 in a state where the upper surface portion 100A of the component storing tape 100 is guided by the guide body 801B. In the restraining member 8031B, the side surface facing portion 80312B restrains the displacement in the tape width direction H3 of the component storing tape 100 which is ejected in a state where the upper surface portion 100A of the component storing tape 100 is guided by the guide body 801B.

The lower surface end facing portion 80313B is a roller member which is mounted on an inner side of the side surface facing portion 80312B in a rotatable manner about an axis extending parallel to the tape width direction H3. The lower surface end facing portion 80313B faces an end portion region portion 100C in the tape width direction H3 of the lower surface portion of the component storing tape 100 which is ejected in the tape ejection direction H2 in a state where the upper surface portion 100A of the component storing tape 100 is guided by the guide body 801B. In the restraining member 8031B, the lower surface end facing portion 80313B restricts the displacement that the cover tape 102 in a folded state that intends to rise up and also straightens a curled state of the component storing tape 100. The lower surface end facing portion 80313B is formed of the rotatable roller member and hence, the component storing tape 100 can be smoothly ejected.

Figure 24:
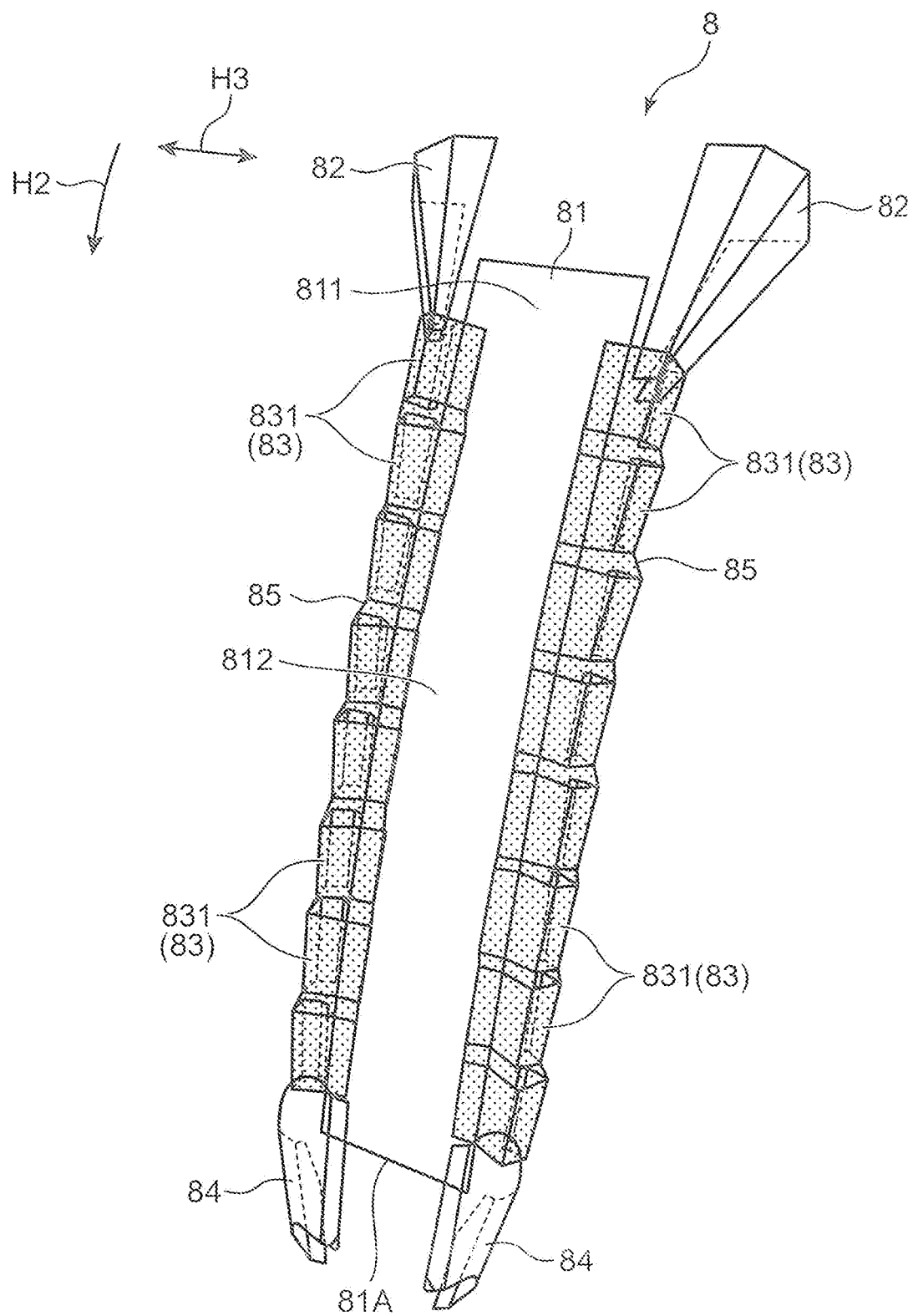
FIG. 24 is a perspective view showing a cover member included in the tape ejection guide structure.

As shown in FIG. 24, the above-mentioned tape ejection guide structure 8 may be configured to include a pair of cover members 85. FIG. 24 is a perspective view showing the cover members 85 included in the tape ejection guide structure 8. In the same manner as the tape ejection guide structure 8, the above-mentioned tape ejection guide structures 80A, 80B may be also configured to include the pair of cover members 85. Hereinafter, the pair of cover members 85 included in the tape ejection guide structure 8 is described.

The pair of cover members 85 is formed of covers which respectively cover the pair of restraining portions 83 of the tape ejection guide structure 8. Each of the pair of cover members 85 is formed in a strip shape which extends along an arrangement direction (tape ejection direction H2) of the plurality of the restraining members 831 which form the restraining portion 83. Each of the pair of cover members 85 is configured to cover the respective restraining members 831 and also to cover the gap portions between the restraining members 831 disposed adjacently to each other.

Each of the pair of cover members 85 may be made of a stretchable film material such as a polyurethane film or may be made of a film material having no stretching property. In the case where the cover member 85 is made of a stretchable film material, each of the pair of cover members 85 is brought into close contact with the respective restraining members 831. On the other hand, in the case where the cover member 85 is made of a film material having no stretching property, each of the pair of cover members 85 is brought into a state where an air layer is interposed between the cover member 85 and the respective restraining members 831.

As described above, in the component mounting machine 10, as a component supply device for supplying components using a component storing tape, another component supply device which includes no tape ejection guide structure 8 is disposed besides the component supply device 1 which includes the tape ejection guide structure 8. In a case where another component supply device is disposed adjacently to the component supply device 1 which includes the tape ejection guide structure 8, there is a possibility that a component storing tape ejected from another component supply device enters the gap portion between the respective restraining members 831 of the pair of restraining portions 83 of the tape ejection guide structure 8. In this case, there is a possibility that in the cylindrical body 17, the component storing tape ejected from another component supply device is not ejected with certainty.

In view of the above, the pair of cover members 85 is provided so as to cover the pair of restraining portions 83 in the tape ejection guide structure 8. With such a configuration, it is possible to prevent the component storing tape ejected from the other component supply device from entering the gap portions between the respective restraining members 831 of the pair of restraining portions 83 in the tape ejection guide structure 8. Accordingly, in the cylindrical body 17, the component storing tape ejected from another component supply device is ejected with certainty.

Although the tape ejection guide structure, the component supply device, and the component mounting machine according to the embodiments of the present disclosure have been described heretofore, the present disclosure is not limited to the above-mentioned tape ejection guide structure, component supply device, and component mounting machine, and the following modifications of the embodiments are also conceivable, for example.

(1) In the above-mentioned embodiment, the description has been made with respect to the configuration where the tape ejection guide structure 8 is provided to the component supply device 1. However, the present disclosure is not limited to such a configuration. The tape ejection guide structure 8 may be mounted on the cylindrical body 17 of the component mounting machine 10, for example. In this case, the tape ejection guide structure 8 is mounted in the cylindrical body 17 in a state where an upstream end of the pair of tape introduction guide portions 82 in the tape ejection direction H2 is exposed to the outside from the upper opening 17A of the cylindrical body 17 and where the upstream end of the tape introduction guide portions 82 is brought into contact with the inner surface of the first wall portion 171. When the component supply unit 1A is set to the component supply portion of the component mounting machine 10, the tape ejection port 23 of the component supply unit 1A is connected to the upstream end of the pair of tape introduction guide portions 82 of the tape ejection guide structure 8. With such a configuration, the ejection of the component storing tape 100 from the tape ejection port 23 of the component supply unit 1A can be guided by the tape ejection guide structure 8.

(2) In the above-mentioned embodiment, the description has been made with respect to the configuration where the guide body 81 of the tape ejection guide structure 8 guides the upper surface portion of the component storing tape 100. However, the present disclosure is not limited to such a configuration. The guide body 81 of the tape ejection guide structure 8 may be configured to guide a lower surface portion of the component storing tape 100. In this case, the pair of restraining portions 83 having a structure of wrapping around both end portions of the component storing tape 100 in the tape width direction respectively is connected to both end portions in the tape width direction of the guide body 81 by way of connection portions respectively, for example. In this case, a length between the guide body 81 and the restraining portion 83 of the connection portion is set corresponding to a depth of the component storing portion 101a of the component storing tape 100.

In such a configuration, a depth of the component storing portion 101a is set corresponding to a size of a component to be stored. Accordingly, in the case where the guide body 81 is configured to guide the lower surface portion of the component storing tape 100, it is necessary to manufacture plural kinds of tape ejection guide structures 8 which differ from each other in the length of the connection portion corresponding to the depth of the component storing portion 101a. Accordingly, it is preferable that the tape ejection guide structure 8 be configured such that the guide body 81 guides the upper surface portion of the component storing tape 100.

(3) In the above-mentioned embodiment, the description has been made with respect to the configuration where the component supply device 1 which includes the tape ejection guide structure 8 supplies components P using the wide component storing tape 100 where the length K2 in the tape width direction H3 is set to 32 mm or more. However, the present disclosure is not limited to such a configuration. The tape ejection guide structure 8 may be configured to guide the ejection of a narrow component storing tape which is ejected from the component supply device and where a length K2 in a tape width direction H3 is set to approximately 8 mm, for example.

(4) In the above-mentioned embodiment, the description has been made with respect to the configuration where the component exposing portion 6 of the component supply unit 1A exposes a component P in the component storing portion 101*a* by cutting the cover tape 102 of the component storing tape 100 at the center position in the tape width direction. However, the present disclosure is not limited to such a configuration. The component exposing portion 6 of the component supply unit 1A may be configured to peel off an end portion of the cover tape 102 on one side in the tape width direction along the fused portion 103 thus exposing a component P in the component storing portion 101*a*.

The above-mentioned specific embodiments mainly include the disclosures having the following configurations.

According to an aspect of the present disclosure, there is provided a tape ejection guide structure of a component supply unit configured to supply components by feeding a component storing tape including: a carrier tape where a plurality of component storing portions in which components are stored are arranged at a predetermined interval; and a cover tape that is adhered to the carrier tape so as to cover the component storing portions, the feeding being performed in a state where the cover tape is disposed on an upper surface side, the tape ejection guide structure being configured to guide ejection of the component storing tape ejected from a tape ejection port of the component supply unit. The tape ejection guide structure includes: a guide body that guides an upper surface portion or a lower surface portion of the component storing tape ejected from the tape ejection port along a tape ejection direction; and a pair of restraining portions that is connected to both end portions of the guide body respectively in a tape width direction orthogonal to the tape ejection direction and restrains displacement in the tape width direction of the component storing tape that is ejected in a state where the upper surface portion or the lower surface portion of the component storing tape is guided by the guide body.

According to the tape ejection guide structure, the component storing tape (preceding component storing tape) where the supply of components is performed precedingly in the component supply unit is ejected in a state where the upper surface portion or the lower surface portion of the component storing tape is guided by the guide body. When a rear end of the preceding component storing tape is ejected from the tape ejection port of the component supply unit, the succeeding component storing tape fed by the component supply unit is introduced into the tape ejection guide structure. As a result, in the tape ejection guide structure, the preceding component storing tape is pushed out by the succeeding component storing tape.

In this case, the tape ejection guide structure includes a pair of restraining portions which is respectively connected to both end portions of the guide body in the tape width direction orthogonal to the tape ejection direction. The pair of restraining portions is configured to restrain displacement in the tape width direction of the component storing tape which is ejected in a state where an upper surface portion or a lower surface portion of the component storing tape is guided by the guide body. With such a configuration, in the tape ejection guide structure, the preceding component storing tape is pushed out by the succeeding component storing tape without causing a change in posture thereof due to inclination or the like. Accordingly, the tape ejection guide structure can eject with certainty the component storing tape ejected from the tape ejection port of the component supply unit.

In the above-mentioned tape ejection guide structure, the guide body has flexibility, and each of the pair of restraining portions is formed of a plurality of restraining members arranged at a predetermined interval in the tape ejection direction.

In this aspect, the tape ejection guide structure which guides the ejection of the component storing tape can be formed in a shape capable of acquiring favorable ejection performance of the component storing tape.

In the above-mentioned tape ejection guide structure, the guide body is configured to be formed in a shape including a bent portion that is bent vertically downward from the tape ejection port, and an extension portion that extends vertically downward from the downstream end of the bent portion in the tape ejection direction.

In this aspect, the length of the guide body necessary for guiding the ejection of the component storing tape can be ensured by the extension portion, and the protrusion length of the guide body from the tape ejection port along the tape feeding direction in the component supply unit can be also shortened as much as possible by the bent portion.

In the above-mentioned tape ejection guide structure, the restraining member includes the side surface facing portion that faces the side end surface portion on an end portion of the component storing tape in the tape width direction, and the lower surface end facing portion that faces the end portion region portion of the lower surface portion of the component storing tape in the tape width direction.

In this aspect, in the tape ejection guide structure, each of the restraining members which constitute each of the pair of restraining portions includes the side surface facing portion which faces the side end surface portion of the end portion of the component storing tape in the tape width direction. Accordingly, the displacement in the tape width direction of the component storing tape which is ejected in a state where the upper surface portion or the lower surface portion of the component storing tape is guided by the guide body can be restrained with more certainty.

Each of the restraining members which constitute each of the pair of restraining portions further includes the lower surface end facing portion which faces the end portion region portion of the lower surface portion of the component storing tape in the tape width direction. There may be the case where the component storing tape ejected from the tape ejection port of the component supply unit is in a curled state where the component storing tape is curled due to curling tendency or the like brought about by the reel. In the case where such a curled component storing tape is introduced into the tape ejection guide structure, the lower surface end facing portions of the restraining members straighten the curled state of the component storing tape. With such straightening, in the tape ejection guide structure, the preceding component storing tape is pushed out by the succeeding component storing tape with certainty. Accordingly, the tape ejection guide structure can eject with certainty the component storing tape ejected from the tape ejection port of the component supply unit.

In the above-mentioned tape ejection guide structure, in the component storing tape ejected from the tape ejection port, the cover tape is developed outward in the tape width direction with respect to the carrier tape so as to expose the component storing portions. The restraining member further includes an upper surface end facing portion that faces, from above the developed cover tape, an end portion region portion of the upper surface portion of the component storing tape in the tape width direction.

In the component storing tape, when the cover tape which is developed outward in the tape width direction with respect to the carrier tape is ejected from the tape ejection port of the component supply unit, the cover tape is released from a force which pushes and develops the cover tape, and intends to rise up. When the cover tape is in a raised state at the time of ejecting the component storing tape, the raised cover tape generates an ejection resistance at the time of ejecting the component storing tape thus deteriorating the ejection performance of the component storing tape. Accordingly, in the tape ejection guide structure, each of the restraining members which constitute each of the pair of restraining portions includes the upper surface end facing portion. In the restraining member, the upper surface end facing portion is a portion which faces, from above the developed cover tape, the end portion region portion of the upper surface portion of the component storing tape in the tape width direction. The above-mentioned upper surface end facing portion restricts the displacement of the cover tape in a developed state toward the inside in the tape width direction and the displacement of the cover tape 102 in the upward direction. With such straightening, in the tape ejection guide structure, the preceding component storing tape is pushed out by the succeeding component storing tape with certainty. Accordingly, the tape ejection guide structure can eject with certainty the component storing tape ejected from the tape ejection port of the component supply unit.

In the above-mentioned tape ejection guide structure, the upper surface end facing portions are away from the developed cover tape outward from the inside in the tape width direction as viewed in the tape ejection direction.

As described previously, the upper surface end facing portion of the restraining member restricts the displacement of the cover tape in a developed state toward the inside in the tape width direction and the displacement of the cover tape in the upward direction. In this case, a force which is generated when the cover tape 102 intends to rise up acts on the upper surface end facing portions, and this force generates an ejection resistance at the time of ejecting the component storing tape thus giving rise to a possibility that the ejection performance of the component storing tape is deteriorated. In view of the above, the upper surface end facing portions of the restraining members are disposed away from the developed cover tape outward from the inside in the tape width direction. With such a configuration, a force which acts on the upper surface end facing portions is reduced and hence, the favorable ejection performance of the component storing tape can be maintained.

In the above-mentioned tape ejection guide structure, in the restraining member, the upper surface end facing portion, the side surface facing portion, and the lower surface end facing portion are integrally connected to each other so as to wrap around the end portion of the component storing tape in the tape width direction.

In this aspect, by each of the pair of restraining portions constituted of the restraining members each formed by integrally connecting the upper surface end facing portion, the side surface facing portion, and the lower surface end facing portion to each other, it is possible to define the guide paths which guide the component storing tape so as to wrap around both end portions in the tape width direction at the time of ejecting the component storing tape.

In the above-mentioned tape ejection guide structure, the restraining member is formed in a tapered shape where the restraining member is tapered from the upstream end thereof toward the downstream end thereof in the tape ejection direction.

The component storing tape ejected from the tape ejection port of the component supply unit is ejected in the tape ejection direction while the upper surface portion or the lower surface portion of the component storing tape is guided by the guide body and both end portions of the component storing tape in the tape width direction are guided by the pair of restraining portions. The respective restraining members which constitute each of the pair of restraining portions are formed in a tapered shape. With such a configuration, it is possible to prevent both end portions of the component storing tape in the tape width direction from entering gap portions between the respective restraining members of the pair of restraining portions. Accordingly, the tape ejection guide structure can eject with certainty the component storing tape ejected from the tape ejection port of the component supply unit.

The tape ejection guide structure further includes a pair of terminal tape guide portions that is connected to both end portions in the tape width direction of a downstream end of the guide body in the tape ejection direction respectively, and guides both end portions in the tape width direction of the component storing tape that is ejected in a state where the upper surface portion or the lower surface portion of the component storing tape is guided by the guide body. Each of the pair of terminal tape guide portions is formed in a tapered shape where the terminal tape guide portion is tapered from an upstream end thereof toward a downstream end thereof in the tape ejection direction.

In this aspect, the component storing tape ejected in a state where the upper surface portion of the component storing tape is guided by the guide body is led out from the tape ejection guide structure while both end portions of the component storing tape in the tape width direction are guided by the pair of terminal tape guide portions. In this case, the pair of terminal tape guide portions is each formed in a tapered shape. With such a configuration, immediately before the component storing tape is led out from the tape ejection guide structure, it is possible to bring the cover tape into an outwardly folded state such that the cover tape of the component storing tape wraps around both end portions of the carrier tape in the tape width direction against a force that the cover tape intends to rise up. As a result, in the component storing tape which is led out from the tape ejection guide structure through the pair of terminal tape guide portions, the cover tape is brought into an outwardly folded state such that the cover tape wraps around the both end portions of the carrier tape in the tape width direction. With such a configuration, when the component storing tape led out from the tape ejection guide structure is cut into a strip shape using the tape cutting device or the like, the cover tape can be cut together with the carrier tape and hence, the cutting performance of the component storing tape can be enhanced.

The above-mentioned tape ejection guide structure further includes a pair of tape introduction guide portions that is each disposed outside in the tape width direction with respect to the upstream end of the guide body in the tape ejection direction, and guides introduction of both end portions in the tape width direction of the component storing tape ejected from the tape ejection port to the restraining members on the most upstream side in the tape ejection direction in the pair of restraining portions. Further, each of the pair of tape introduction guide portions is formed in a tapered shape where the tape introduction guide portion is tapered from an upstream end thereof toward a downstream end thereof in the tape ejection direction, and the downstream end of the tape introduction guide portion enters an upstream end of the restraining member on the most upstream side in the tape ejection direction.

In this aspect, both end portions in the tape width direction of the component storing tape ejected from the tape ejection port of the component supply unit are introduced into the restraining members disposed on the most upstream side in the tape ejection direction out of the plurality of restraining members which constitute the pair of restraining portions while both end portions are guided by the pair of tape introduction guide portions. In this case, the pair of tape introduction guide portions is each formed in a tapered shape. With such a configuration, immediately before both end portions of the component storing tape in the tape width direction are introduced into the restraining members disposed on the most upstream side in the tape ejection direction in the pair of restraining portions, it is possible to bring the cover tape into an outwardly folded state such that the cover tape wraps around both end portions of the carrier tape in the tape width direction against a force that the cover tape intends to rise up. As a result, with respect to the component storing tape which is introduced into the restraining members of the pair of restraining portions through the pair of tape introduction guide portions, the cover tape is brought into an outwardly folded state such that the cover tape wraps around both end portions of the carrier tape in the tape width direction. With such a configuration, the both end portions in the tape width direction of the component storing tape which is ejected from the tape ejection port of the component supply unit can be smoothly introduced into the restraining members which constitute the pair of restraining portions.

The above-mentioned tape ejection guide structure further includes a pair of cover members which covers the pair of restraining portions respectively. Further, each of the pair of cover members is formed in a strip shape extending along an arrangement direction of the plurality of restraining members that constitute the restraining portion, and is configured to cover the respective restraining members and to cover also gap portions between the restraining members disposed adjacently to each other.

When the component supply unit where the ejection of a component storing tape is not performed by way of the tape ejection guide structure (hereinafter referred to as "another component supply unit") is assumed, there is a possibility that a component storing tape ejected from another component supply unit enters the gap portions between the respective restraining members of the pair of restraining portions in the tape ejection guide structure. In this case, there is a possibility that the component storing tape ejected from another component supply unit is not ejected with certainty.

Accordingly, the pair of cover members is provided so as to respectively cover the pair of restraining portions in the tape ejection guide structure. With such a configuration, it is possible to prevent the component storing tape ejected from other component supply device from entering the gap portions between the respective restraining members of the pair of restraining portions in the tape ejection guide structure. Accordingly, the component storing tape ejected from other component supply unit is ejected with certainty.

According to another aspect of the present disclosure, there is provided a component supply device configured to supply components using a component storing tape including: a carrier tape where a plurality of component storing portions in which the components are stored are arranged at a predetermined interval; and a cover tape that is adhered to the carrier tape so as to cover the component storing portions. The component supply device includes: a component supply unit including a tape feeding portion that feeds the component storing tape toward a tape ejection port and a component exposing portion that exposes the components in the component storing portions of the component storing tape fed by the tape feeding portion; and the tape ejection guide structure that guides ejection of the component storing tape ejected from the tape ejection port.

Such a component supply device includes the tape ejection guide structure which can eject with certainty the component storing tape ejected from the tape ejection port of the component supply unit. Accordingly, it is possible to suppress as much as possible the occurrence of an interruption during an operation of supplying the components by the component supply unit attributed to an ejection failure of the component storing tape. As a result, it is possible to obtain the component supply device which exhibits excellent efficiency in supplying components.

According to another aspect of the present disclosure, there is provided a component mounting machine including: a component supply portion where a plurality of component supply devices for supplying components by feeding a component storing tape in a tape feeding direction are arranged side by side in a first direction intersecting the tape feeding direction and at least one particular component supply device is the above-mentioned component supply device; a head unit that takes out the components supplied by the plurality of component supply devices respectively; a cylindrical body formed in a cylindrical shape having an upper opening and a lower opening, the cylindrical body being configured to allow insertion of the tape ejection guide structure provided to the particular component supply device into the cylindrical body from the upper opening, the cylinder body being configured to receive the component storing tape ejected from another component supply device other than the particular component supply device from the upper opening and to guide ejection of the component storing tape; and a tape cutting device that is disposed so as to face the lower opening of the cylindrical body and is configured to cut the component storing tape ejected from the cylindrical body through the lower opening at a predetermined timing.

According to such a component mounting machine, components supplied by the plurality of component supply devices including the particular component supply device provided with the tape ejection guide structure are taken out by the head unit. Then, the component storing tapes which are ejected from the respective component supply devices after the supply of components are introduced into the tape cutting device through the cylindrical body, and are cut into a strip shape by the tape cutting device. The component storing tape ejected from the particular component supply device provided with the tape ejection guide structure is led out toward the tape cutting device through the lower opening of the cylindrical body in a state where the component storing tape is guided by the tape ejection guide structure inserted into the cylindrical body.

In the above-mentioned component mounting machine, the cylindrical body is a wall portion that defines the upper opening and the lower opening, and the wall portion includes the first wall portion having a length with which the first wall portion can face all of the component supply devices arranged parallel to each other in the first direction, and a second wall portion that faces the first wall portion on an upstream side in the tape feeding direction. The tape ejection guide structure is brought into contact with the first wall portion in the cylindrical body.

In the above-mentioned component mounting machine, the first wall portion of the cylindrical body includes a bent region portion which is bent vertically downward from the upper opening, and an extension region portion which linearly extends vertically downward from the lower end of the bent region portion toward the tape cutting device. In the tape ejection guide structure, the guide body extends such that a lower end of the guide body reaches the extension region portion of the first wall portion in the vertical direction.

In this aspect, the tape ejection guide structure provided to the particular component supply device is brought into contact with the inner surface of the first wall portion of the cylindrical body. Further, in the tape ejection guide structure, the extension portion of the guide body extends such that the lower end of the guide body reaches the extension region portion which linearly extends vertically downward in the first wall portion. With such a configuration, in the tape ejection guide structure, when the preceding component storing tape which is ejected by being pushed out by the succeeding component storing tape reaches the lower end of the guide body, the preceding component storing tape freely falls down along the extension region portion linearly extending vertically downward in the first wall portion. The component storing tape led out from the tape ejection guide structure in this manner freely falls down along the extension region portion of the first wall portion in the cylindrical body toward the tape cutting device.

As has been described heretofore, according to the present disclosure, it is possible to provide a tape ejection guide structure, a component supply device, and a component mounting machine which can eject with certainty a component storing tape ejected from a tape ejection port of a component supply unit.

What is claimed is:

1. A tape ejection guide structure of a component supply unit configured to supply components by feeding a component storing tape, the component storing tape including:
   a carrier tape where a plurality of component storing portions in which components are stored are arranged at a predetermined interval; and
   a cover tape that is adhered to the carrier tape so as to cover the component storing portions,
   the feeding being performed in a state where the cover tape is disposed on an upper surface side, and the tape ejection guide structure being configured to guide ejection of the component storing tape ejected from a tape ejection port of the component supply unit,
   the tape ejection guide structure comprising:
   a guide body that guides an upper surface portion or a lower surface portion of the component storing tape ejected from the tape ejection port along a tape ejection direction in a state where the component is take out from the component storing portion at a component take-out position thereby the component storing portion storing no component; and
   a pair of restraining portions that is connected to both end portions of the guide body respectively in a tape width direction orthogonal to the tape ejection direction and restrains displacement in the tape width direction of the component storing tape that is ejected in a state where the upper surface portion or the lower surface portion of the component storing tape is guided by the guide body.

2. The tape ejection guide structure according to claim 1, wherein
   each of the pair of restraining portions is formed of a plurality of restraining members arranged at a predetermined interval in the tape ejection direction.

3. A tape ejection guide structure of a component supply unit configured to supply components by feeding a component storing tape, the component storing tape including:
   a carrier tape where a plurality of component storing portions in which components are stored are arranged at a predetermined interval; and
   a cover tape that is adhered to the carrier tape so as to cover the component storing portions,
   the feeding being performed in a state where the cover tape is disposed on an upper surface side, and the tape ejection guide structure being configured to guide ejection of the component storing tape ejected from a tape ejection port of the component supply unit,
   the tape ejection guide structure comprising:
   a guide body that guides an upper surface portion or a lower surface portion of the component storing tape ejected from the tape ejection port along a tape ejection direction; and
   a pair of restraining portions that is connected to both end portions of the guide body respectively in a tape width direction orthogonal to the tape ejection direction and restrains displacement in the tape width direction of the component storing tape that is ejected in a state where the upper surface portion or the lower surface portion of the component storing tape is guided by the guide body,
   wherein the guide body is configured to be formed in a shape including a bent portion that is bent vertically downward from the tape ejection port, and an extension portion that extends vertically downward from a downstream end of the bent portion in the tape ejection direction.

4. A tape ejection guide structure of a component supply unit configured to supply components by feeding a component storing tape, the component storing tape including:
   a carrier tape where a plurality of component storing portions in which components are stored are arranged at a predetermined interval; and
   a cover tape that is adhered to the carrier tape so as to cover the component storing portions,
   the feeding being performed in a state where the cover tape is disposed on an upper surface side, and the tape ejection guide structure being configured to guide ejection of the component storing tape ejected from a tape ejection port of the component supply unit,
   the tape ejection guide structure comprising:
   a guide body that guides an upper surface portion or a lower surface portion of the component storing tape ejected from the tape ejection port along a tape ejection direction; and
   a pair of restraining portions that is connected to both end portions of the guide body respectively in a tape width direction orthogonal to the tape ejection direction and restrains displacement in the tape width direction of the component storing tape that is ejected in a state where the upper surface portion or the lower surface portion of the component storing tape is guided by the guide body, wherein the restraining member includes:
- a side surface facing portion that faces a side end surface portion on an end portion of the component storing tape in the tape width direction; and
- a lower surface end facing portion that faces an end portion region portion of the lower surface portion of the component storing tape in the tape width direction.

5. The tape ejection guide structure according to claim 4, wherein
in the component storing tape ejected from the tape ejection port, the cover tape is developed outward in the tape width direction with respect to the carrier tape so as to expose the component storing portions, and
the restraining member further includes an upper surface end facing portion that faces, from above the developed cover tape, an end portion region portion of the upper surface portion of the component storing tape in the tape width direction.

6. The tape ejection guide structure according to claim 5, wherein the upper surface end facing portion is away from the developed cover tape outward from the inside in the tape width direction as viewed in the tape ejection direction.

7. The tape ejection guide structure according to claim 6, wherein in the restraining member, the upper surface end facing portion, the side surface facing portion, and the lower surface end facing portion are integrally connected to each other so as to wrap around the end portion of the component storing tape in the tape width direction.

8. The tape ejection guide structure according to claim 7, wherein the restraining member is formed in a tapered shape where the restraining member is tapered from an upstream end thereof toward a downstream end thereof in the tape ejection direction.

9. The tape ejection guide structure according to claim 8, further comprising:
a pair of terminal tape guide portions that is connected to both end portions in the tape width direction of a downstream end of the guide body in the tape ejection direction respectively, and is configured to guide both end portions in the tape width direction of the component storing tape that is ejected in a state where the upper surface portion or the lower surface portion of the component storing tape is guided by the guide body, wherein
each of the pair of terminal tape guide portions is formed in a tapered shape where the terminal tape guide portion is tapered from an upstream end thereof toward a downstream end thereof in the tape ejection direction.

10. The tape ejection guide structure according to claim 8, wherein
the tape ejection guide structure further includes a pair of tape introduction guide portions that is each disposed outside in the tape width direction with respect to the upstream end of the guide body in the tape ejection direction, and is configured to guide introduction of both end portions in the tape width direction of the component storing tape ejected from the tape ejection port to the restraining members on the most upstream side in the tape ejection direction in the pair of restraining portions, and
each of the pair of tape introduction guide portions is formed in a tapered shape where the tape introduction guide portion is tapered from an upstream end thereof toward a downstream end thereof in the tape ejection direction, and the downstream end of the tape introduction guide portion enters an upstream end of the restraining member on the most upstream side in the tape ejection direction.

11. The tape ejection guide structure according to claim 8, wherein
the tape ejection guide structure further includes a pair of cover members that covers the pair of restraining portions respectively, and
each of the pair of cover members is formed in a strip shape extending along an arrangement direction of the plurality of restraining members that constitute the restraining portion, and is configured to cover the respective restraining members and also gap portions between the restraining members disposed adjacently to each other.

12. A component supply device configured to supply components using a component storing tape including: a carrier tape where a plurality of component storing portions in which components are stored are arranged at a predetermined interval; and a cover tape that is adhered to the carrier tape so as to cover the component storing portions, the component supply device comprising:
a component supply unit including a tape feeding portion configured to feed the component storing tape toward a tape ejection port, and a component exposing portion configured to expose the components in the component storing portions of the component storing tape fed by the tape feeding portion; and
the tape ejection guide structure according to claim 1 that is configured to guide ejection of the component storing tape ejected from the tape ejection port.

13. A component mounting machine comprising:
a component supply portion where a plurality of component supply devices for supplying components by feeding a component storing tape in a tape feeding direction are arranged side by side in a first direction intersecting the tape feeding direction and at least one particular component supply device is the component supply device according to claim 12;
a head unit configured to take out the components supplied by the plurality of component supply devices respectively;
a cylindrical body formed in a cylindrical shape having an upper opening and a lower opening, the cylindrical body being configured to allow insertion of the tape ejection guide structure provided to the particular component supply device into the cylindrical body from the upper opening, the cylinder body being configured to receive the component storing tape ejected from another component supply device other than the particular component supply device from the upper opening and to guide ejection of the component storing tape; and
a tape cutting device that is disposed so as to face the lower opening of the cylindrical body and is configured to cut the component storing tape ejected from the cylindrical body through the lower opening at a predetermined timing.

14. The component mounting machine according to claim 13, wherein
the cylindrical body is a wall portion that defines the upper opening and the lower opening, and the wall portion includes a first wall portion having a length with which the first wall portion can face all of the component supply devices arranged parallel to each other in the first direction, and a second wall portion that faces the first wall portion on an upstream side in the tape feeding direction, and the tape ejection guide structure is brought into contact with the first wall portion in the cylindrical body.

15. The component mounting machine according to claim 14, wherein the first wall portion of the cylindrical body includes a bent region portion that is bent vertically downward from the upper opening, and an extension region portion that linearly extends vertically downward from a lower end of the bent region portion toward the tape cutting device, and in the tape ejection guide structure, the guide body extends such that a lower end of the guide body reaches the extension region portion of the first wall portion in the vertical direction.

* * * * *